(12) United States Patent
Horikoshi et al.

(10) Patent No.: US 11,282,911 B2
(45) Date of Patent: Mar. 22, 2022

(54) DISPLAY DEVICE, DISPLAY MODULE, METHOD OF MANUFACTURING DISPLAY DEVICE, AND METHOD OF MANUFACTURING DISPLAY MODULE

(71) Applicant: Sony Group Corporation, Tokyo (JP)

(72) Inventors: Hiroshi Horikoshi, Tokyo (JP); Masato Kawashima, Kanagawa (JP); Kaori Takimoto, Kanagawa (JP); Masaya Nagata, Kanagawa (JP)

(73) Assignee: Sony Group Corporation, Tokyo (JP)

( * ) Notice: Subject to any disclaimer, the term of this patent is extended or adjusted under 35 U.S.C. 154(b) by 664 days.

(21) Appl. No.: 16/099,819

(22) PCT Filed: Apr. 14, 2017

(86) PCT No.: PCT/JP2017/015285
§ 371 (c)(1),
(2) Date: Nov. 8, 2018

(87) PCT Pub. No.: WO2017/203885
PCT Pub. Date: Nov. 30, 2017

(65) Prior Publication Data
US 2019/0115414 A1  Apr. 18, 2019

(30) Foreign Application Priority Data

May 24, 2016  (JP) .............................. JP2016-103231

(51) Int. Cl.
*H01L 27/32* (2006.01)
*H01L 51/00* (2006.01)
*H01L 51/52* (2006.01)

(52) U.S. Cl.
CPC ...... *H01L 27/3276* (2013.01); *H01L 51/0096* (2013.01); *H01L 51/524* (2013.01);
(Continued)

(58) Field of Classification Search
CPC ............. H01L 27/3276; H01L 51/0096; H01L 51/524; H01L 51/5246; H01L 51/5253;
(Continued)

(56) References Cited

U.S. PATENT DOCUMENTS

| 2005/0140282 A1 | 6/2005 | Park et al. |
| 2014/0104528 A1 | 4/2014 | Jung et al. |
| 2016/0020355 A1* | 1/2016 | Aoyama ............. H01L 51/0097 438/25 |

FOREIGN PATENT DOCUMENTS

| CN | 1638555 A | 7/2005 |
| CN | 1988742 A | 6/2007 |

(Continued)

OTHER PUBLICATIONS

Japanese Office Action dated Sep. 29, 2020 for corresponding Japanese Application No. 2018-519143.

(Continued)

*Primary Examiner* — Kyoung Lee
(74) *Attorney, Agent, or Firm* — Michael Best & Friedrich LLP

(57) ABSTRACT

Display devices, display modules, and methods of manufacture are disclosed. In one example, a display device includes a pixel region in which pixels for displaying an image are arranged, on an upper surface of a substrate. A device-side signal electrode for exchanging a signal related to the pixels with an outside is disposed on a side surface of the substrate. A module casing is configured to store the display device and to have a casing-side signal electrode electrically connected to the device-side signal electrode in a spot facing the device-side signal electrode.

16 Claims, 82 Drawing Sheets

(52) U.S. Cl.
CPC ...... *H01L 51/5246* (2013.01); *H01L 51/5253* (2013.01); *H01L 27/322* (2013.01); *H01L 2227/323* (2013.01); *H01L 2251/5315* (2013.01); *H01L 2251/566* (2013.01)

(58) Field of Classification Search
CPC ............. H01L 27/322; H01L 2251/566; H01L 2227/323; H01L 2251/5315; Y02E 10/549
See application file for complete search history.

(56) References Cited

FOREIGN PATENT DOCUMENTS

| | | | |
|---|---|---|---|
| CN | 101009275 | A | 8/2007 |
| CN | 101140390 | A | 3/2008 |
| CN | 101257015 | A | 9/2008 |
| CN | 101335179 | A | 12/2008 |
| CN | 101625471 | A | 1/2010 |
| CN | 103824965 | A | 5/2014 |
| JP | 2006-146087 | A | 6/2006 |
| JP | 2009-186982 | A | 8/2009 |
| JP | 2016189450 | A | 11/2016 |
| WO | 2014/076912 | A1 | 5/2014 |
| WO | 2014/104528 | A1 | 7/2014 |
| WO | 2016/020355 | A2 | 2/2016 |

OTHER PUBLICATIONS

Chinese Office Action dated Nov. 4, 2020 for corresponding Chinese Application No. 2017800312630.
Chinese Office Action dated May 20, 2021 for corresponding Chinese Application No. 2017800312630.

* cited by examiner

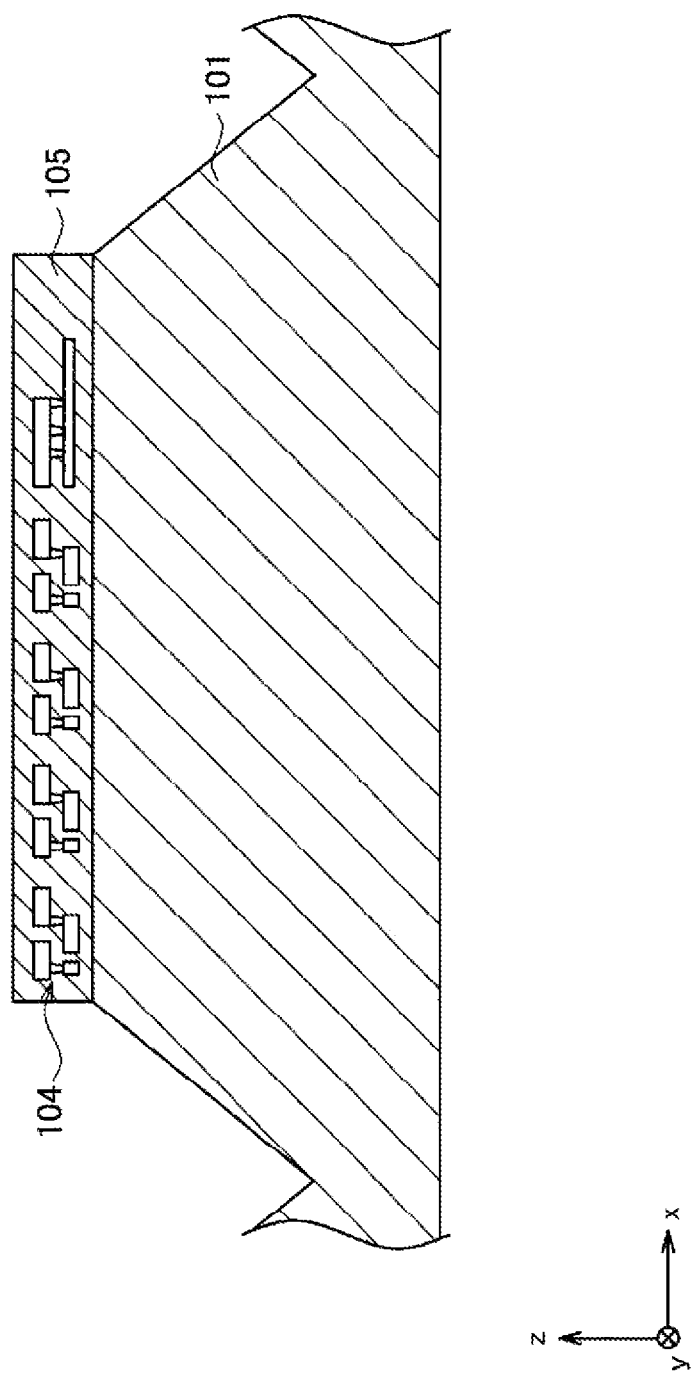

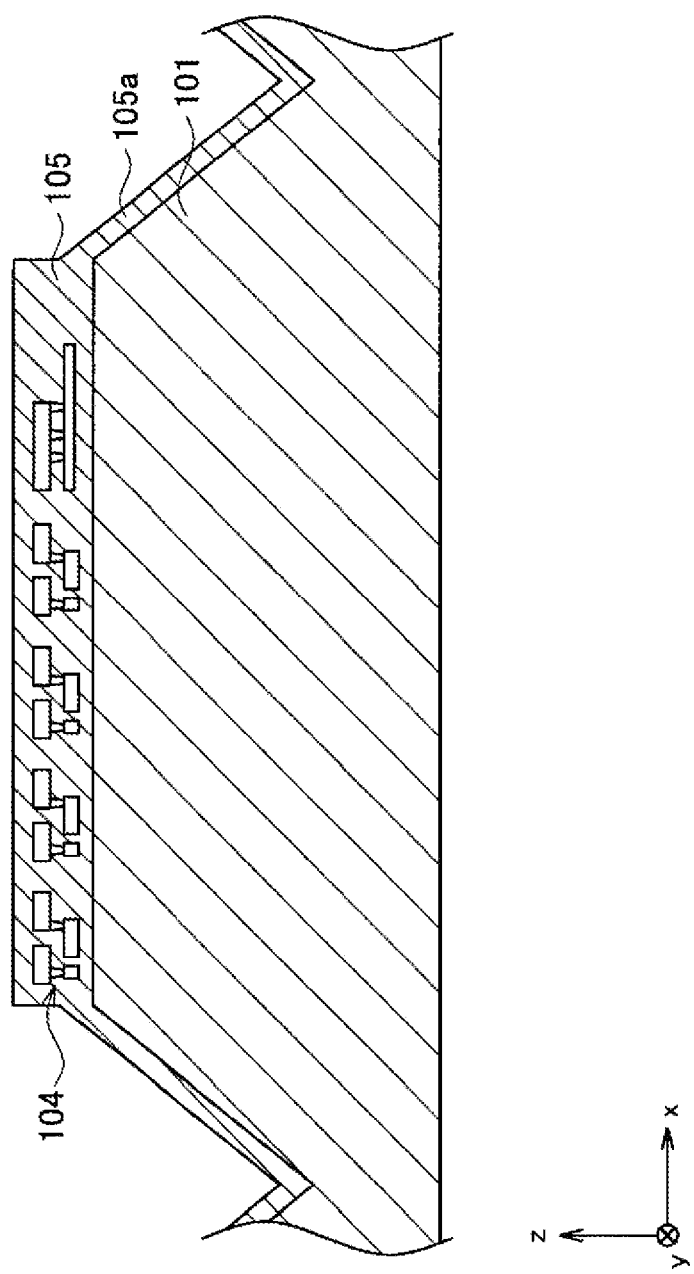

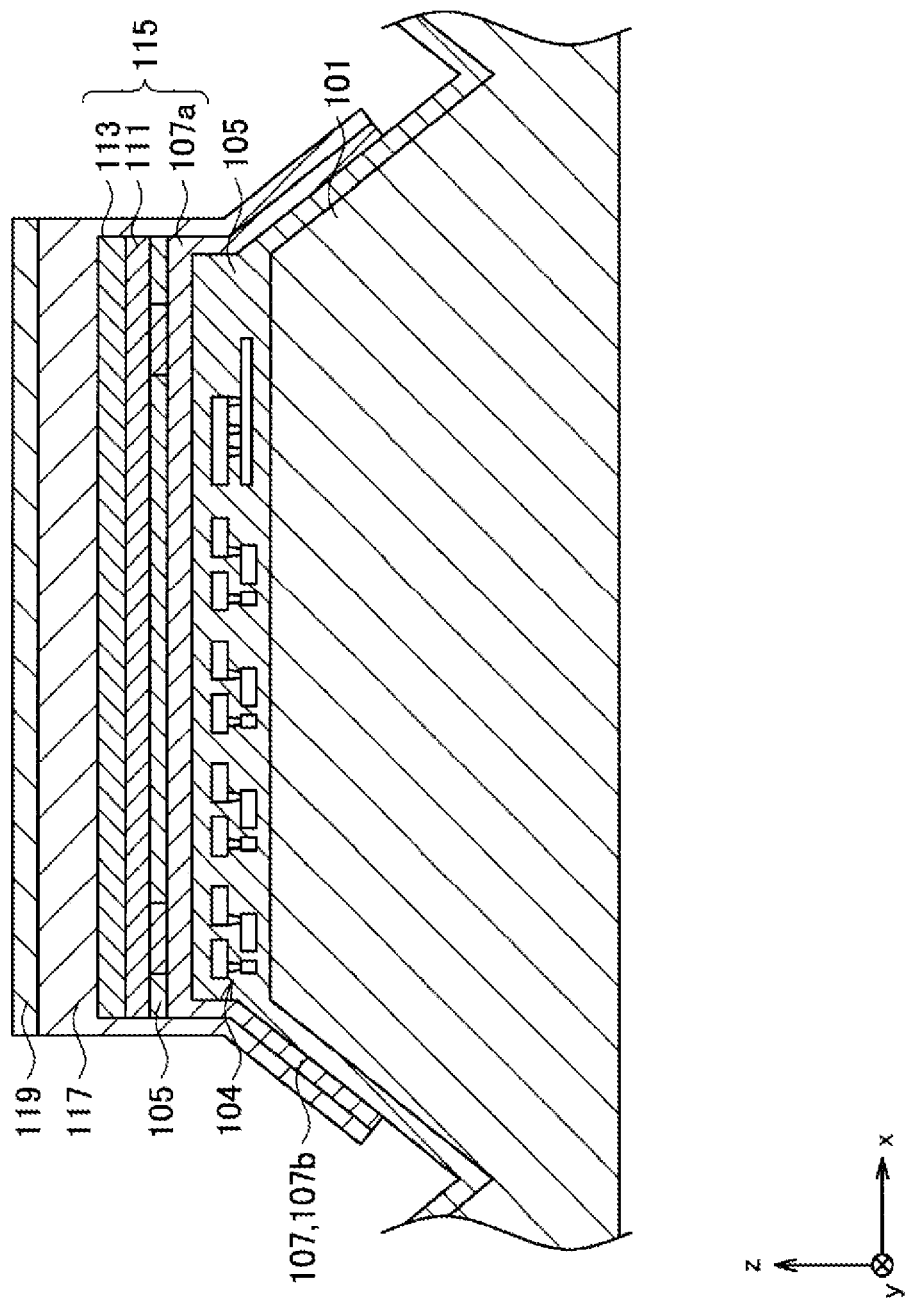

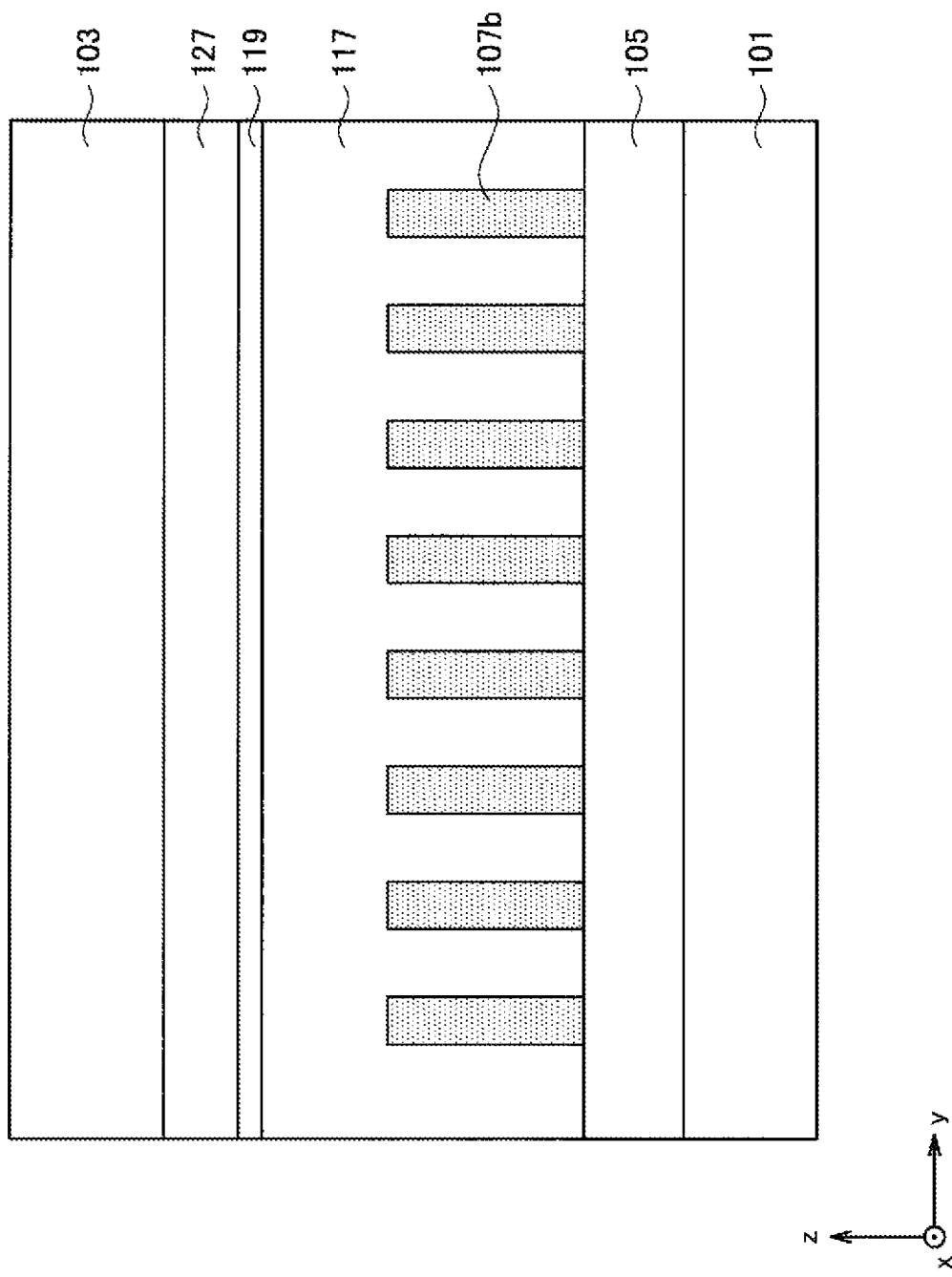

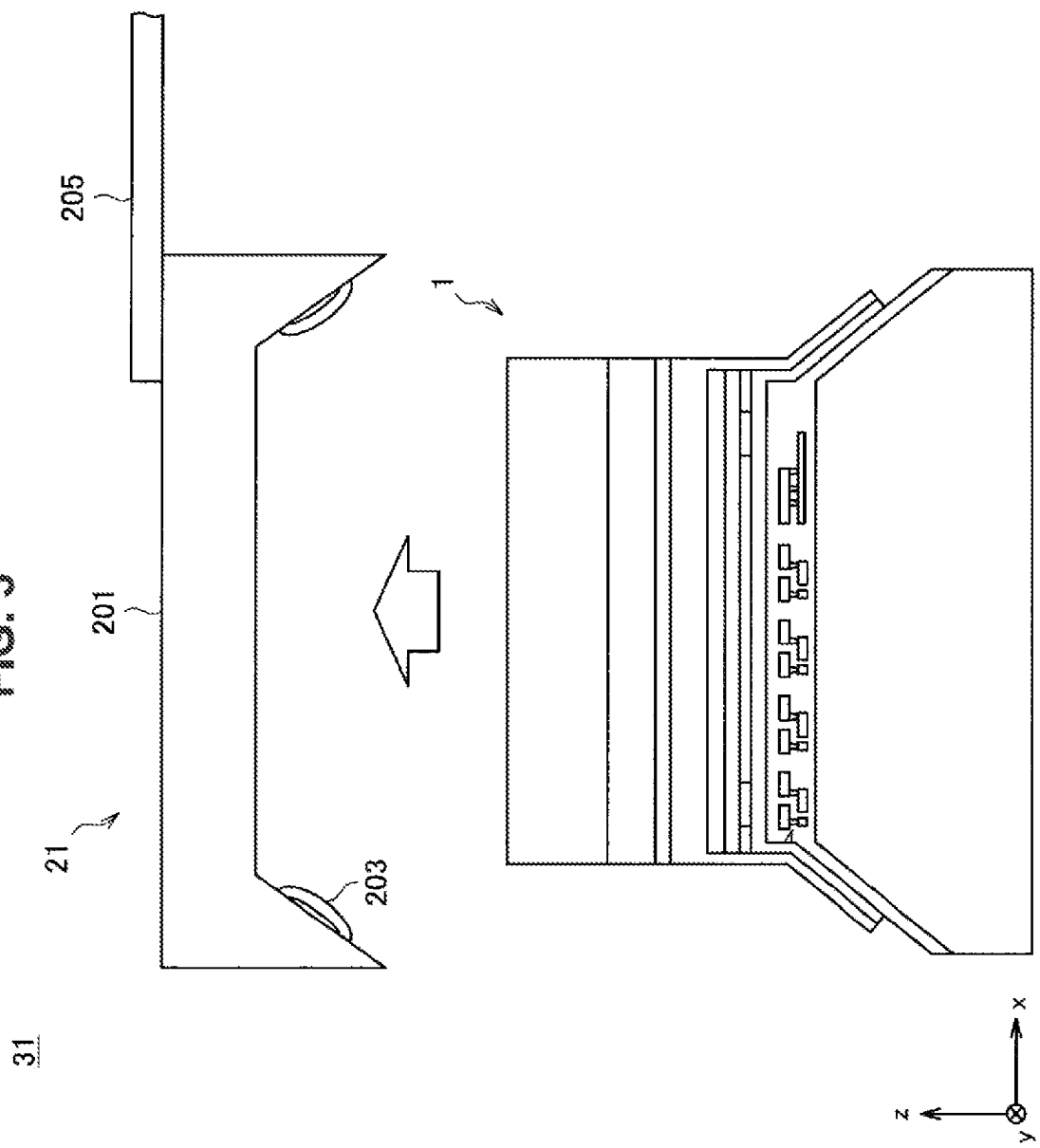

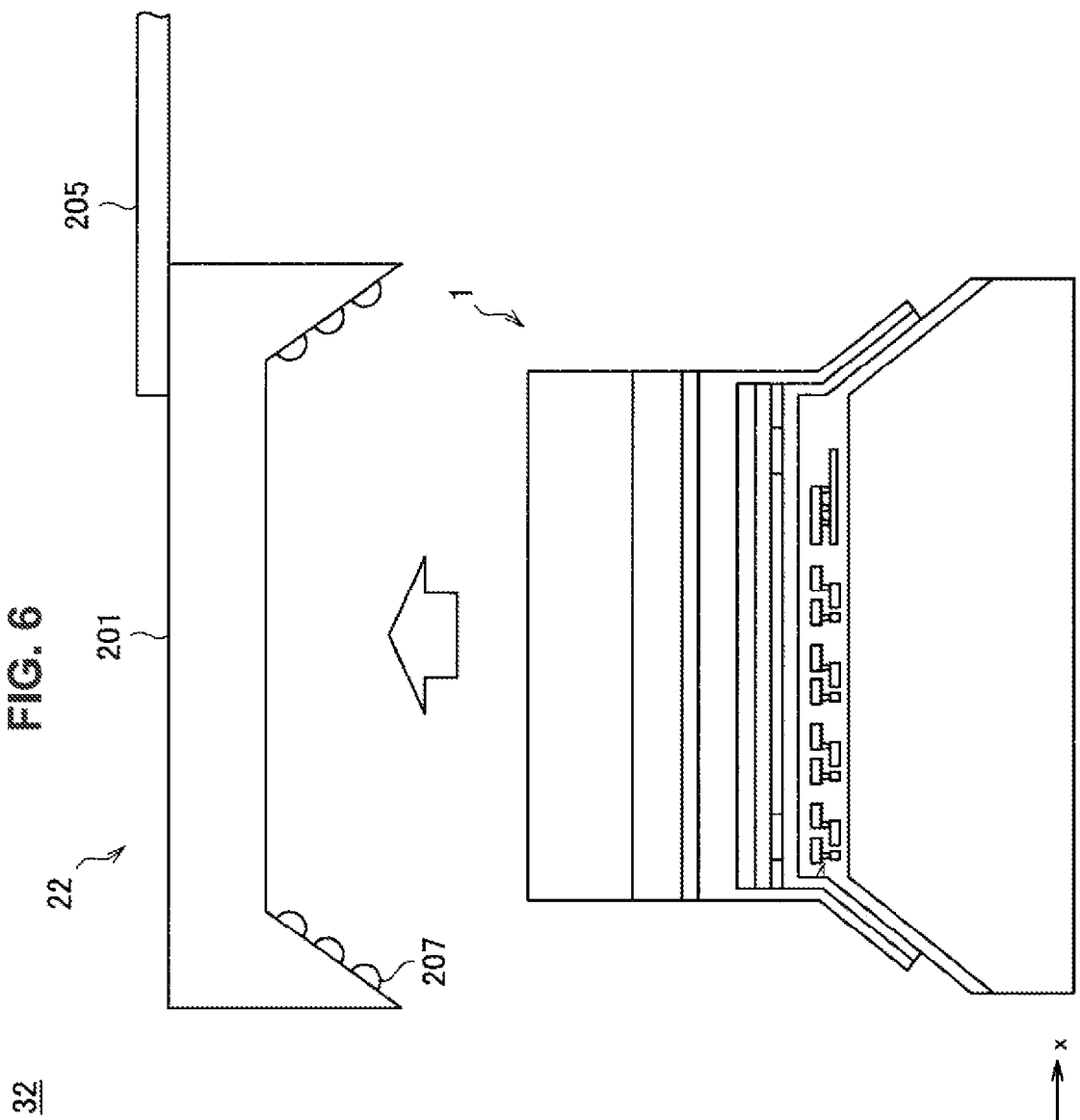

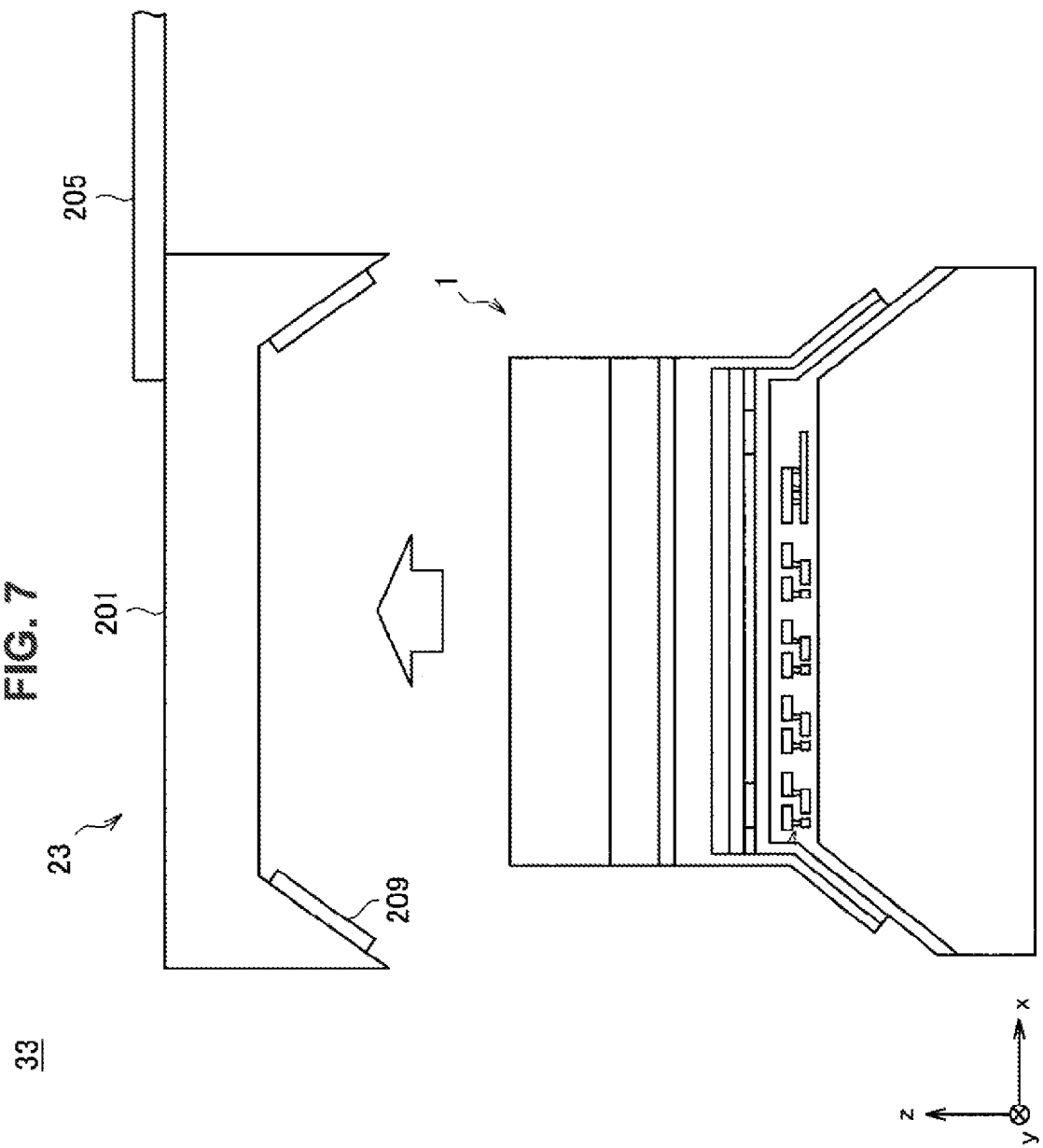

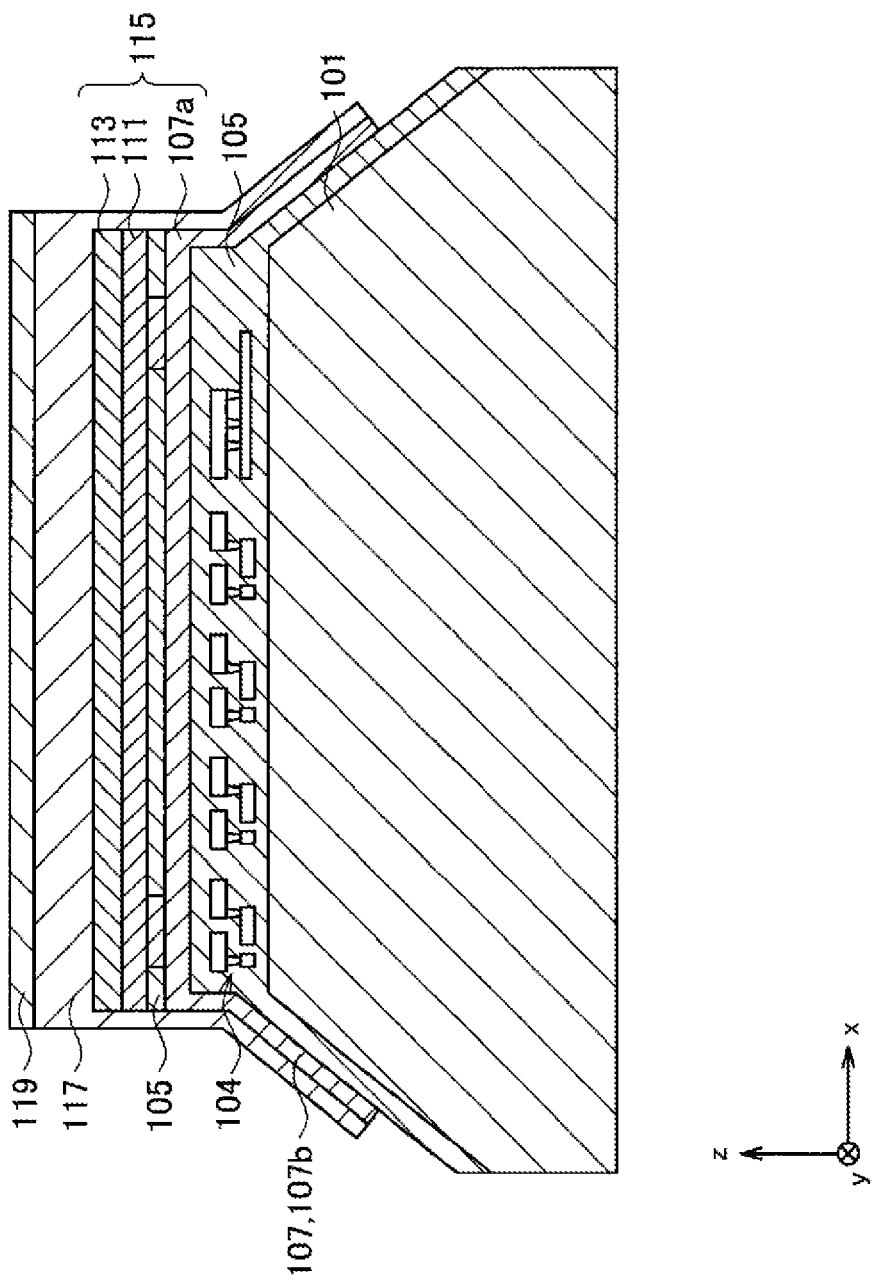

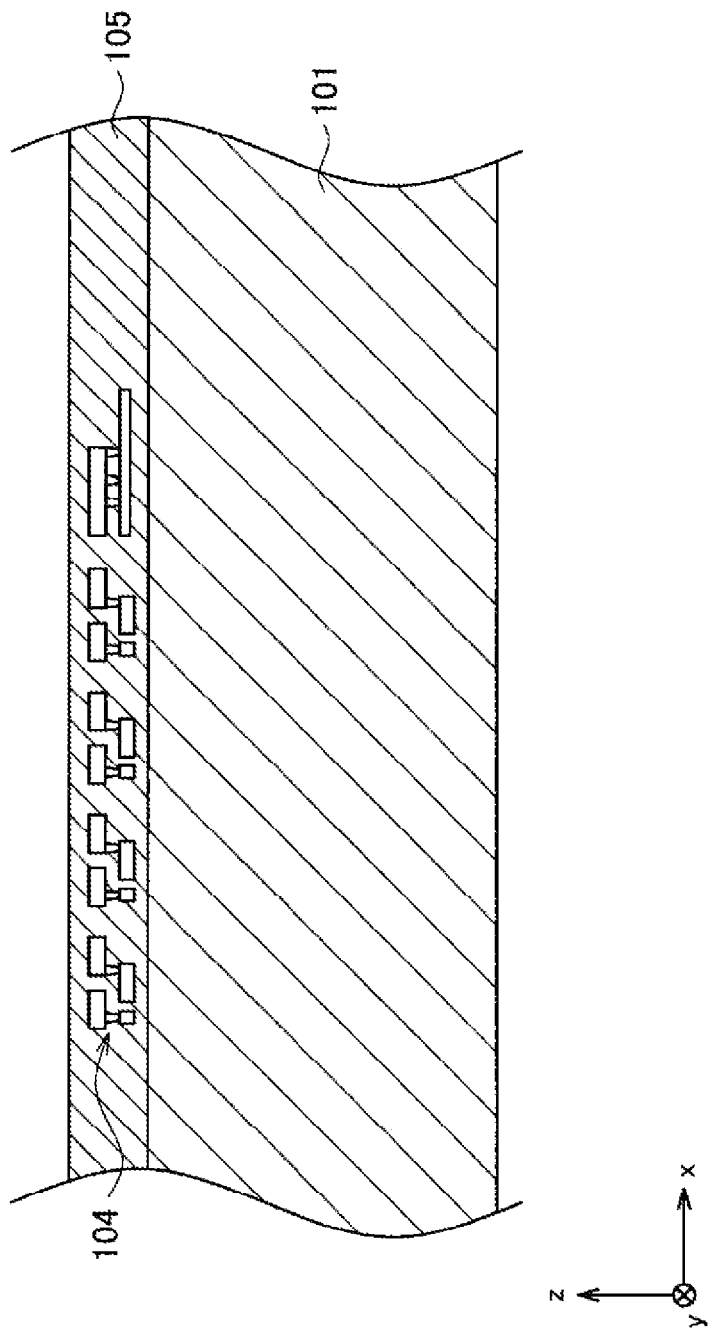

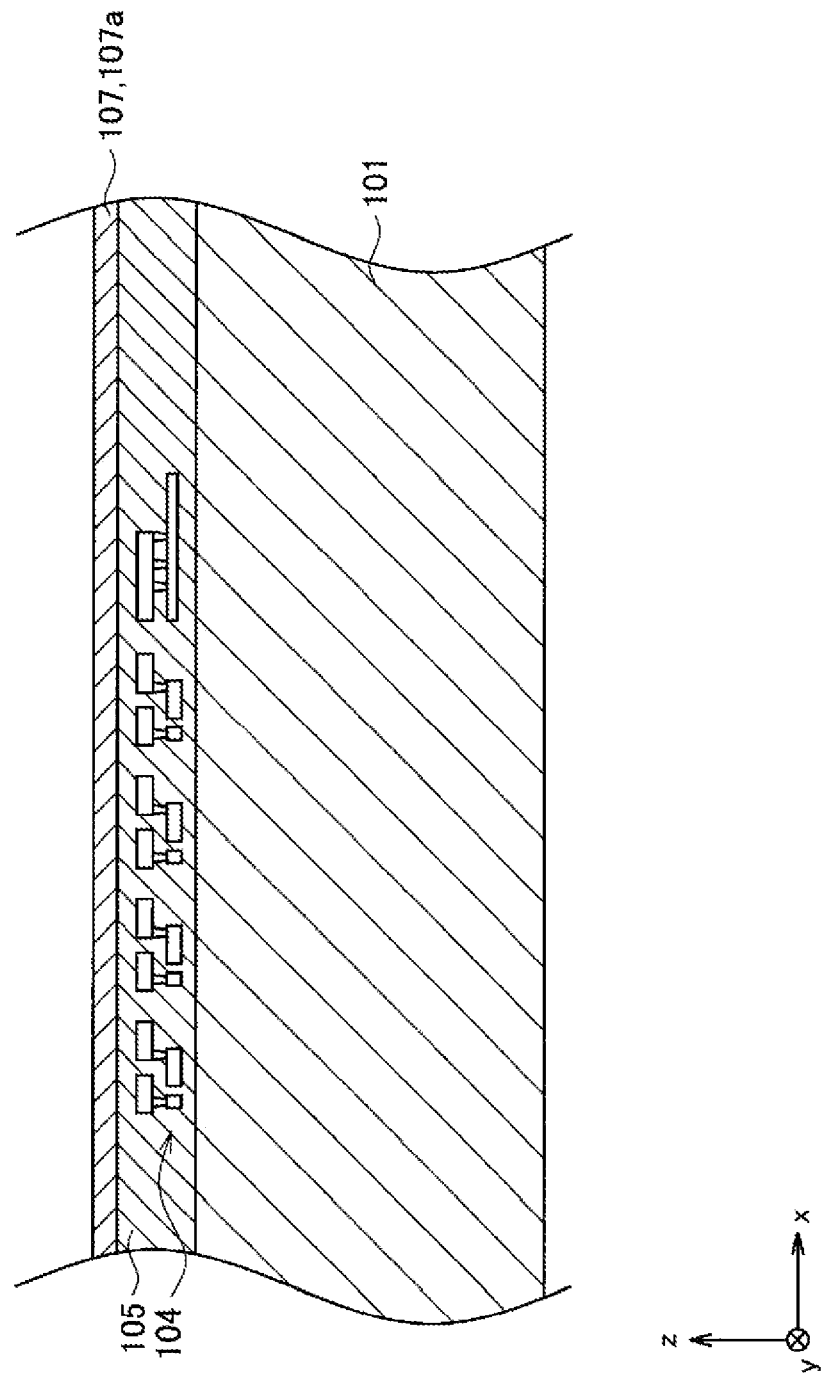

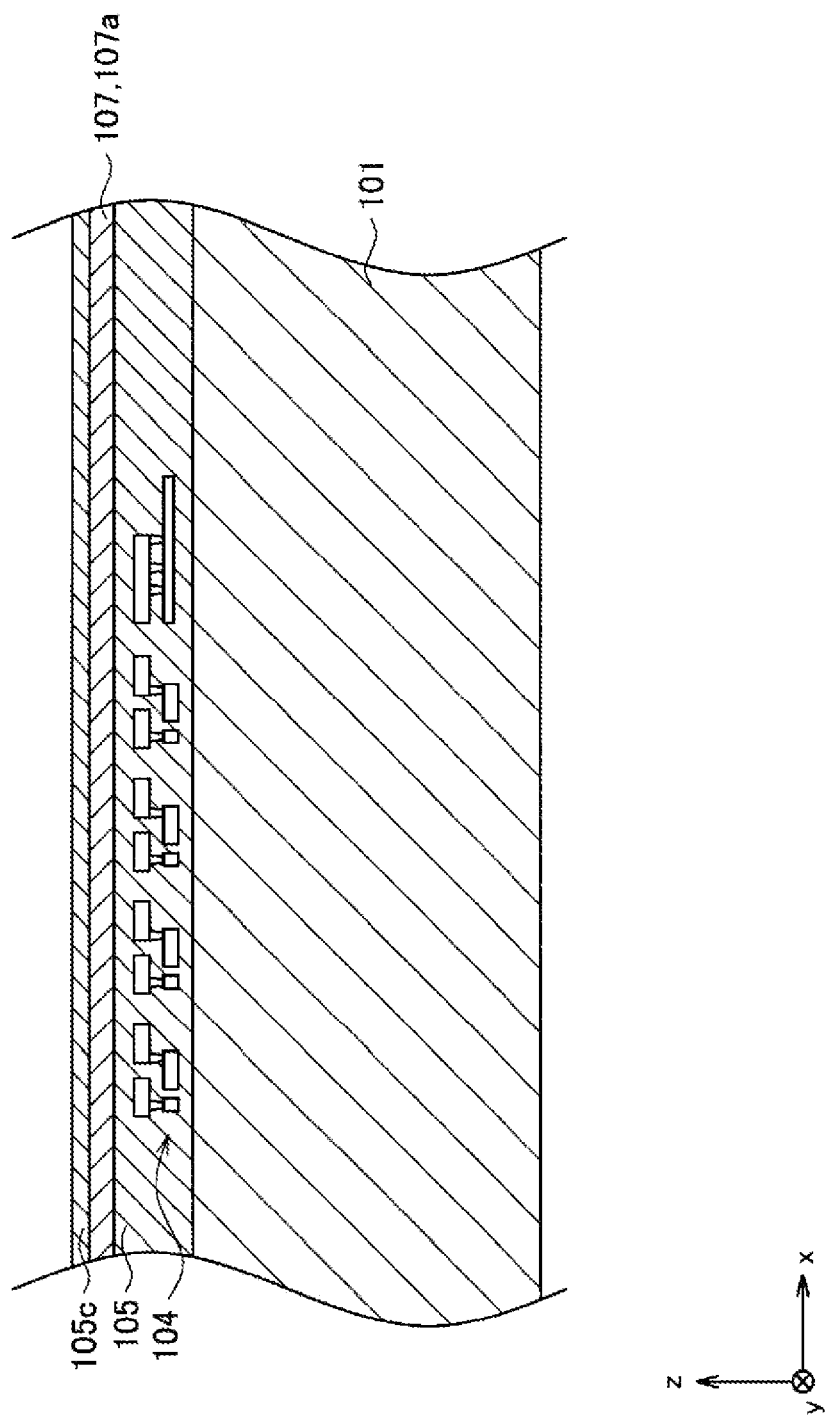

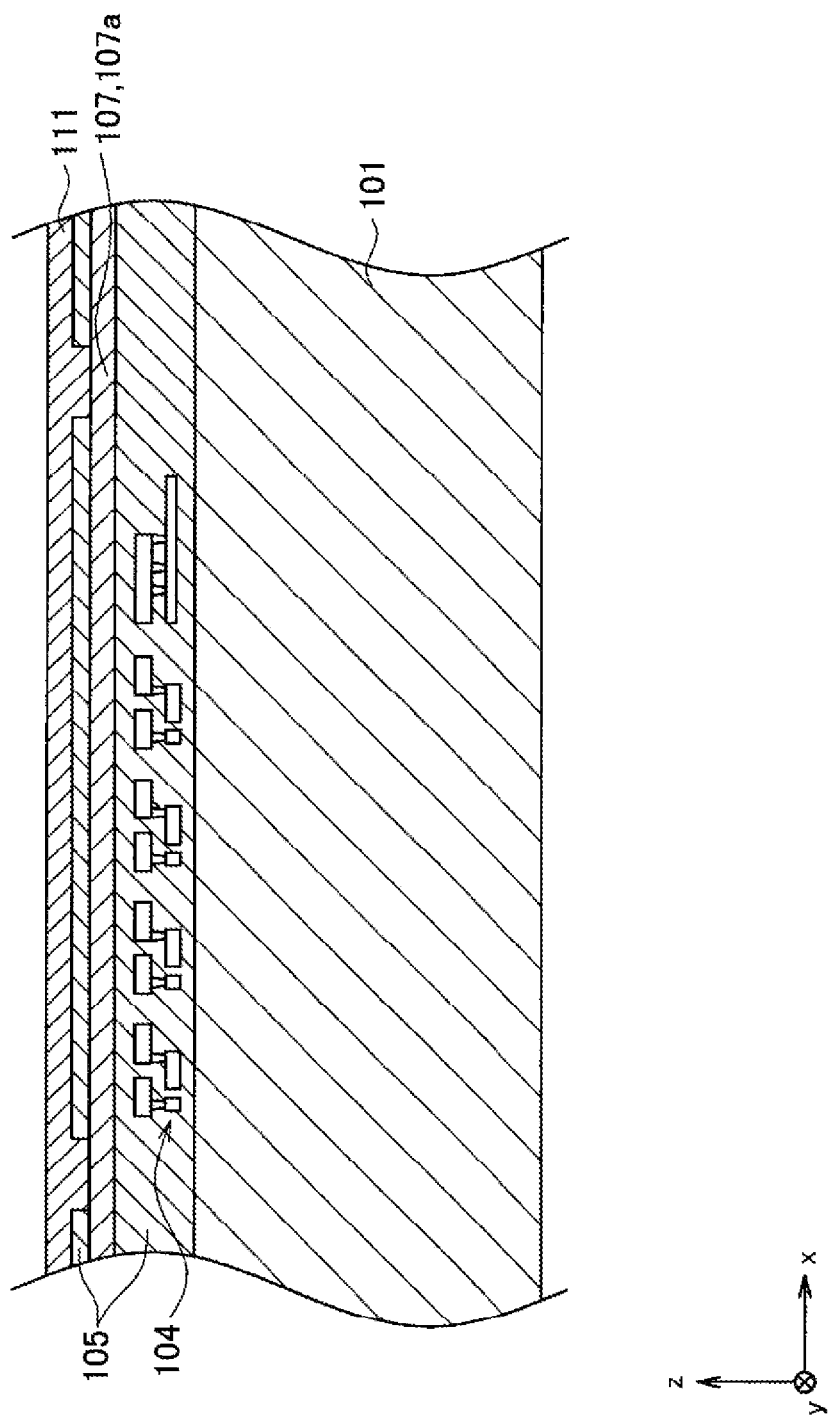

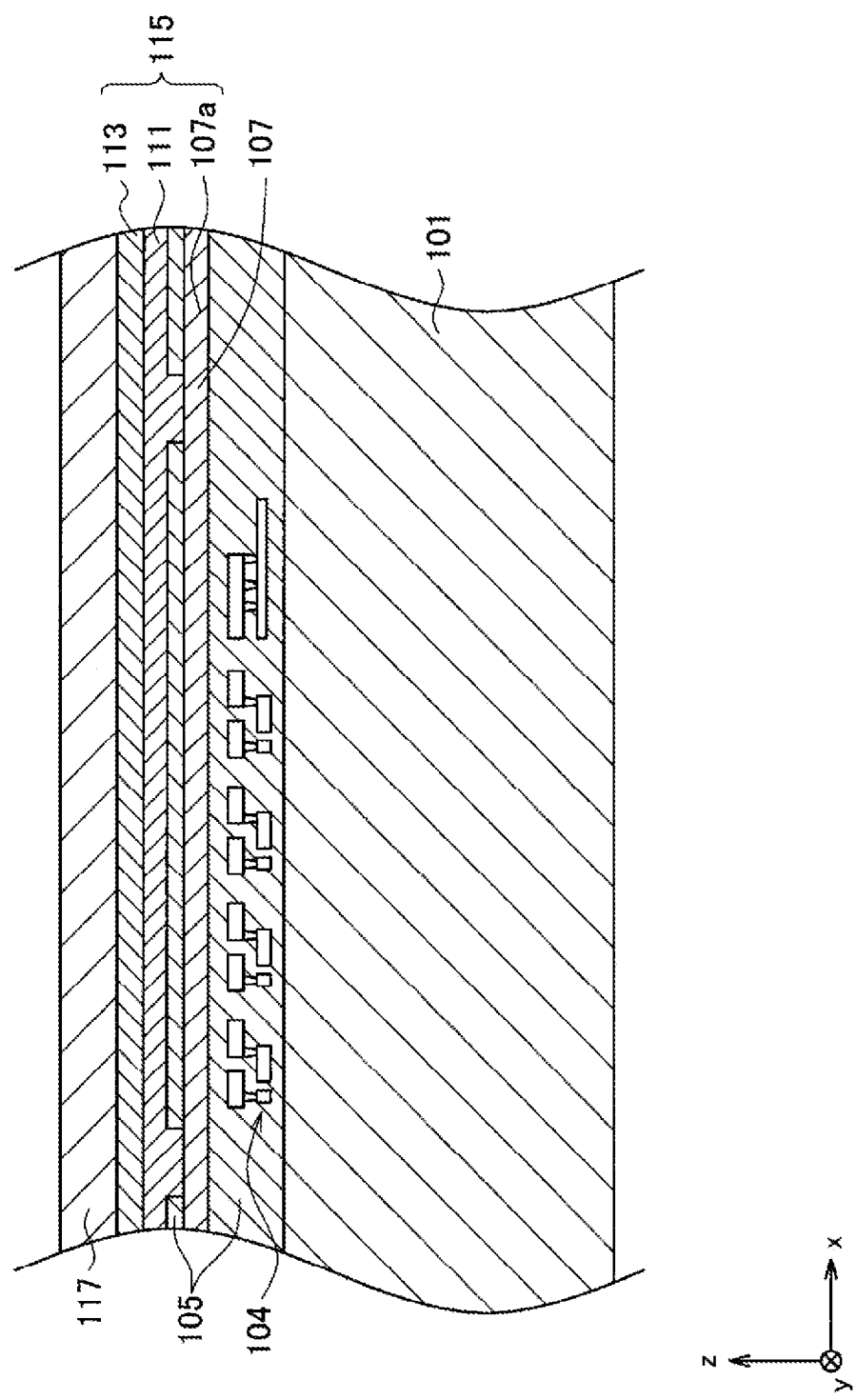

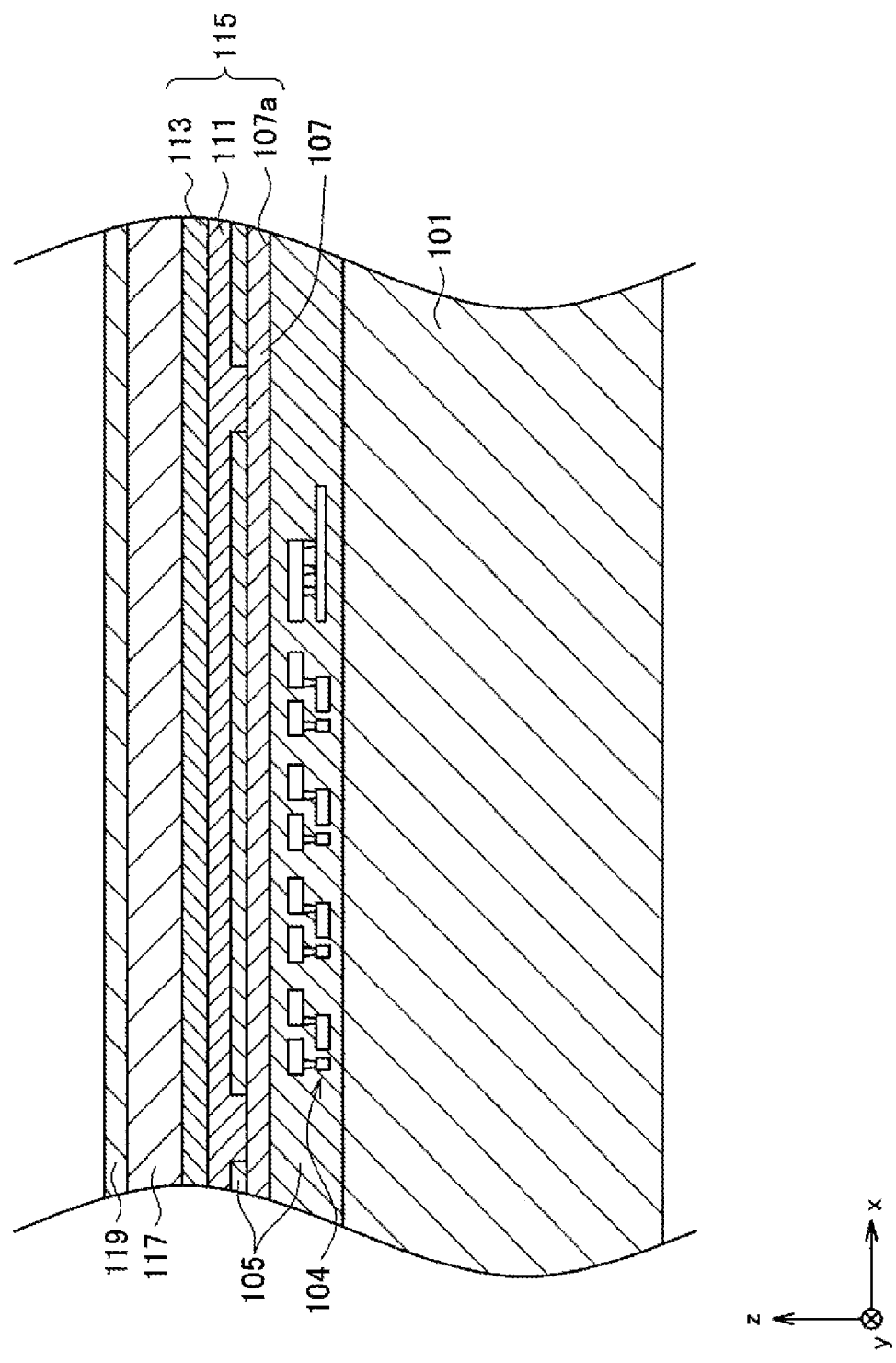

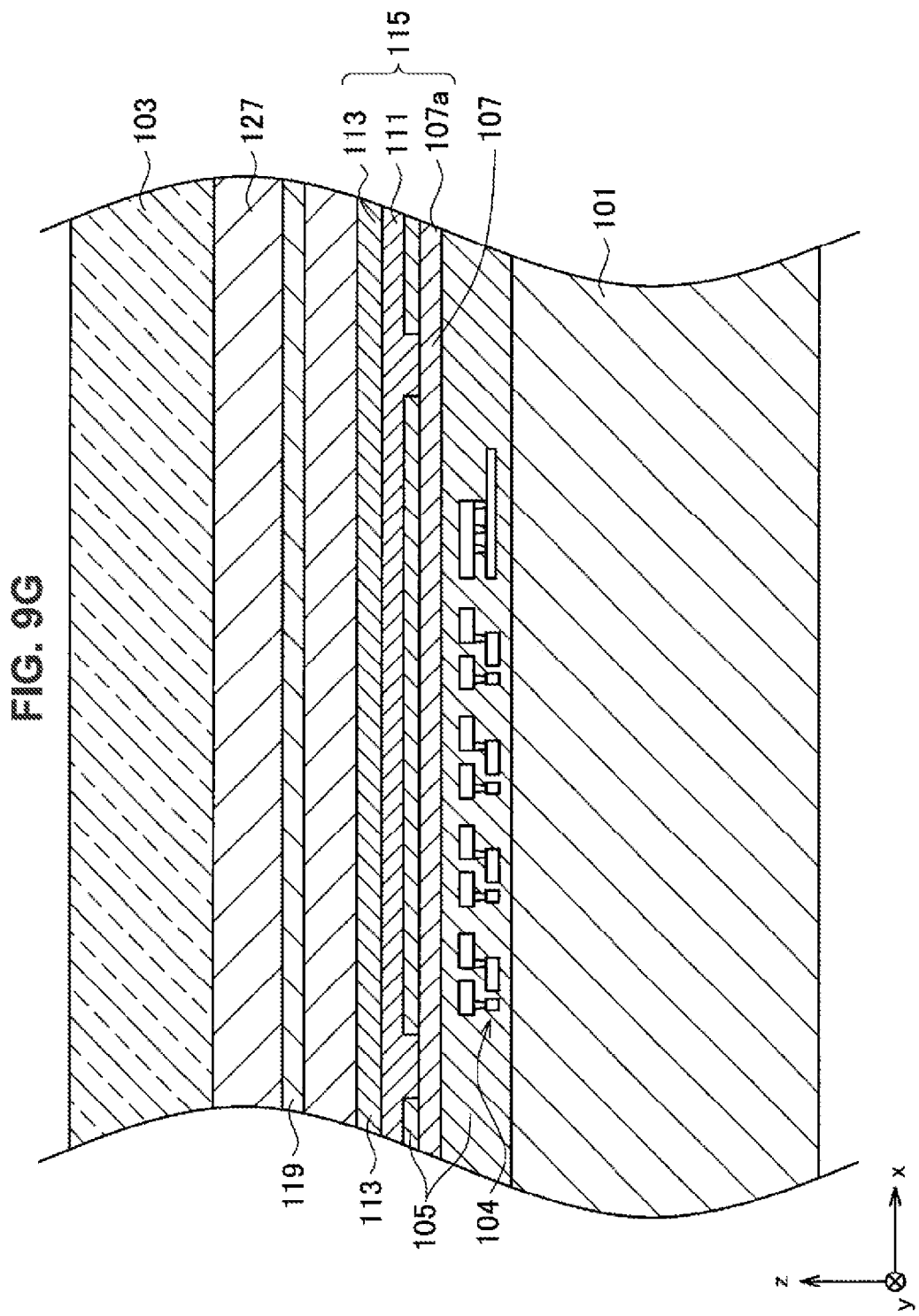

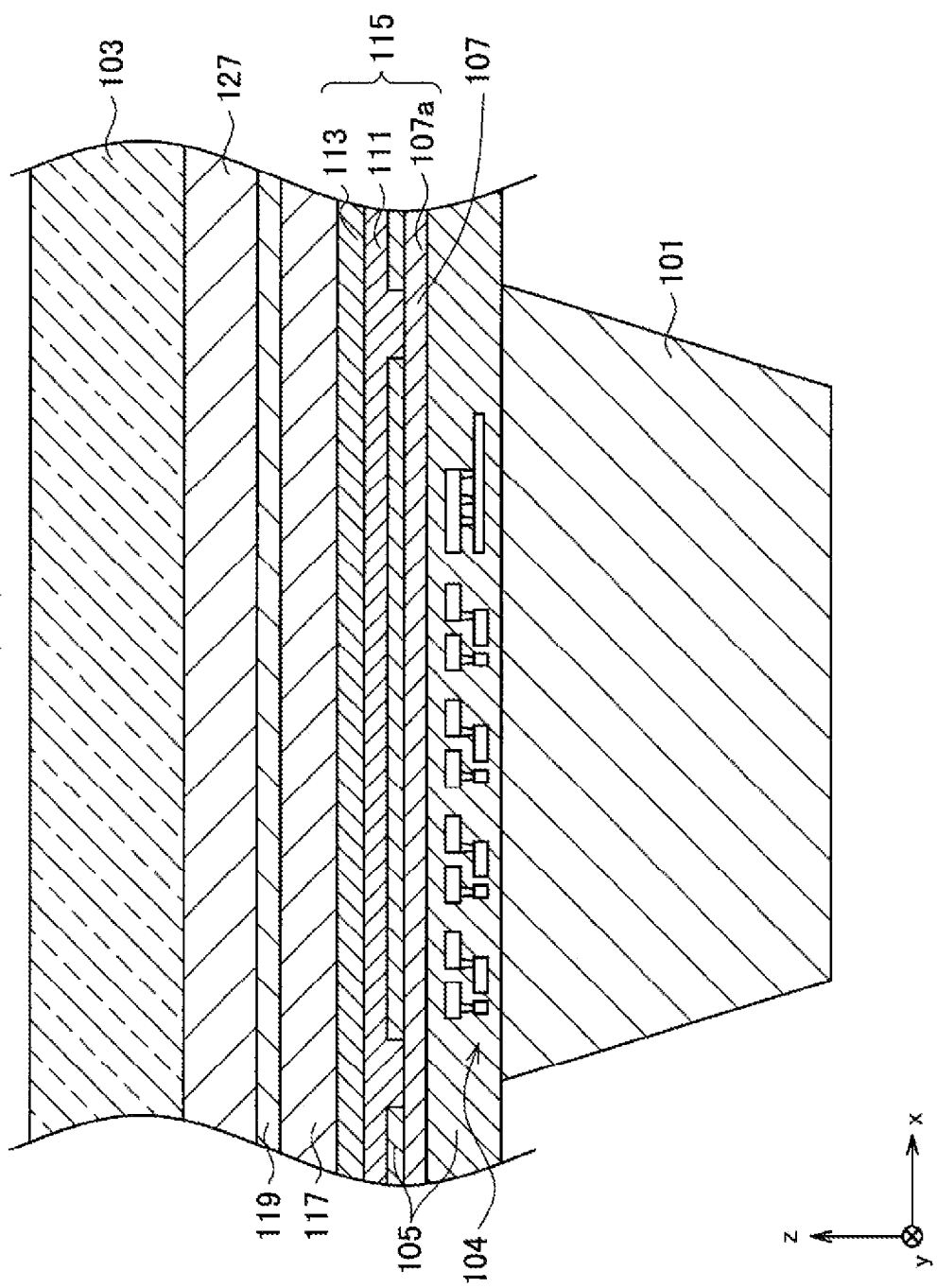

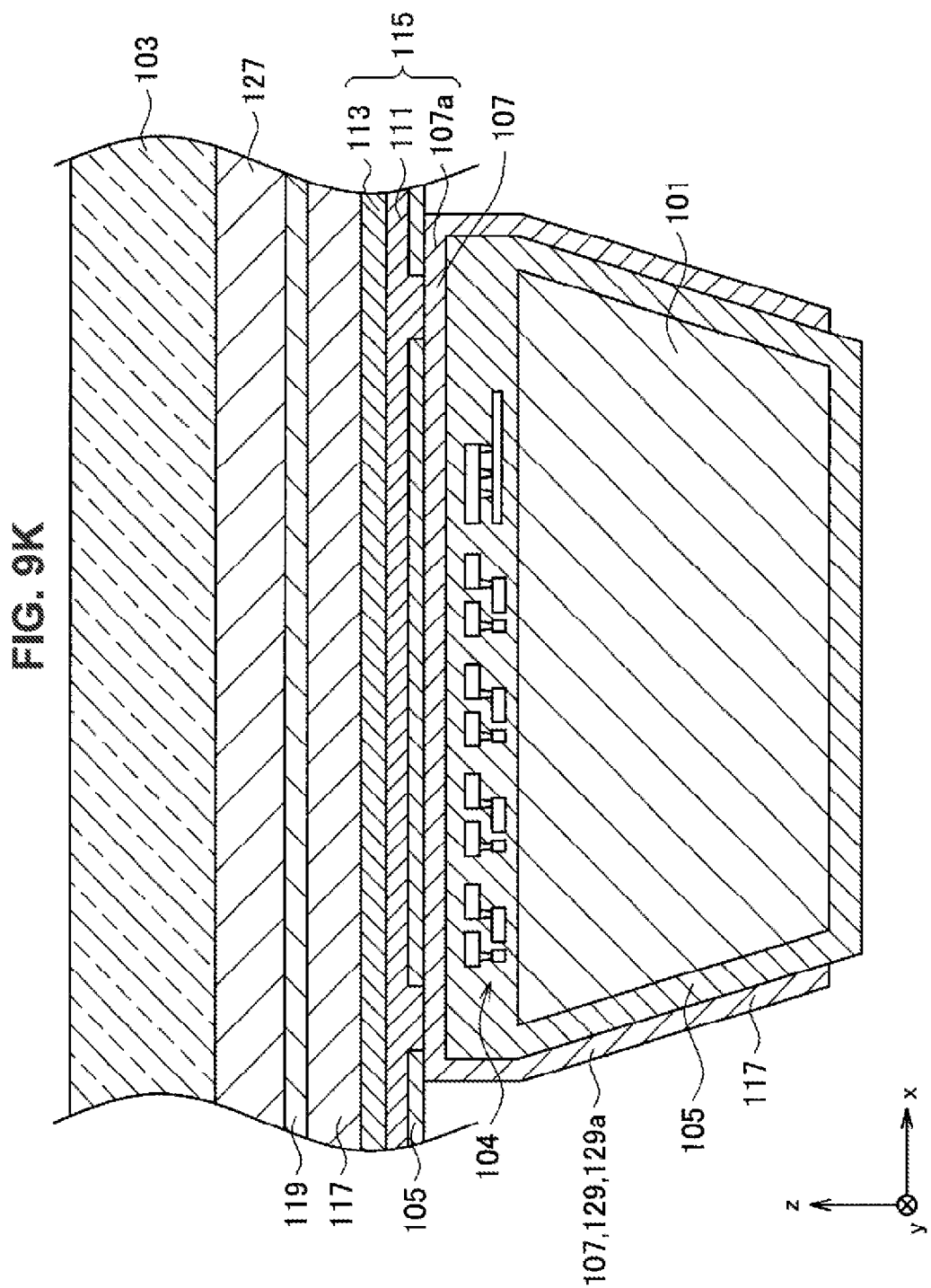

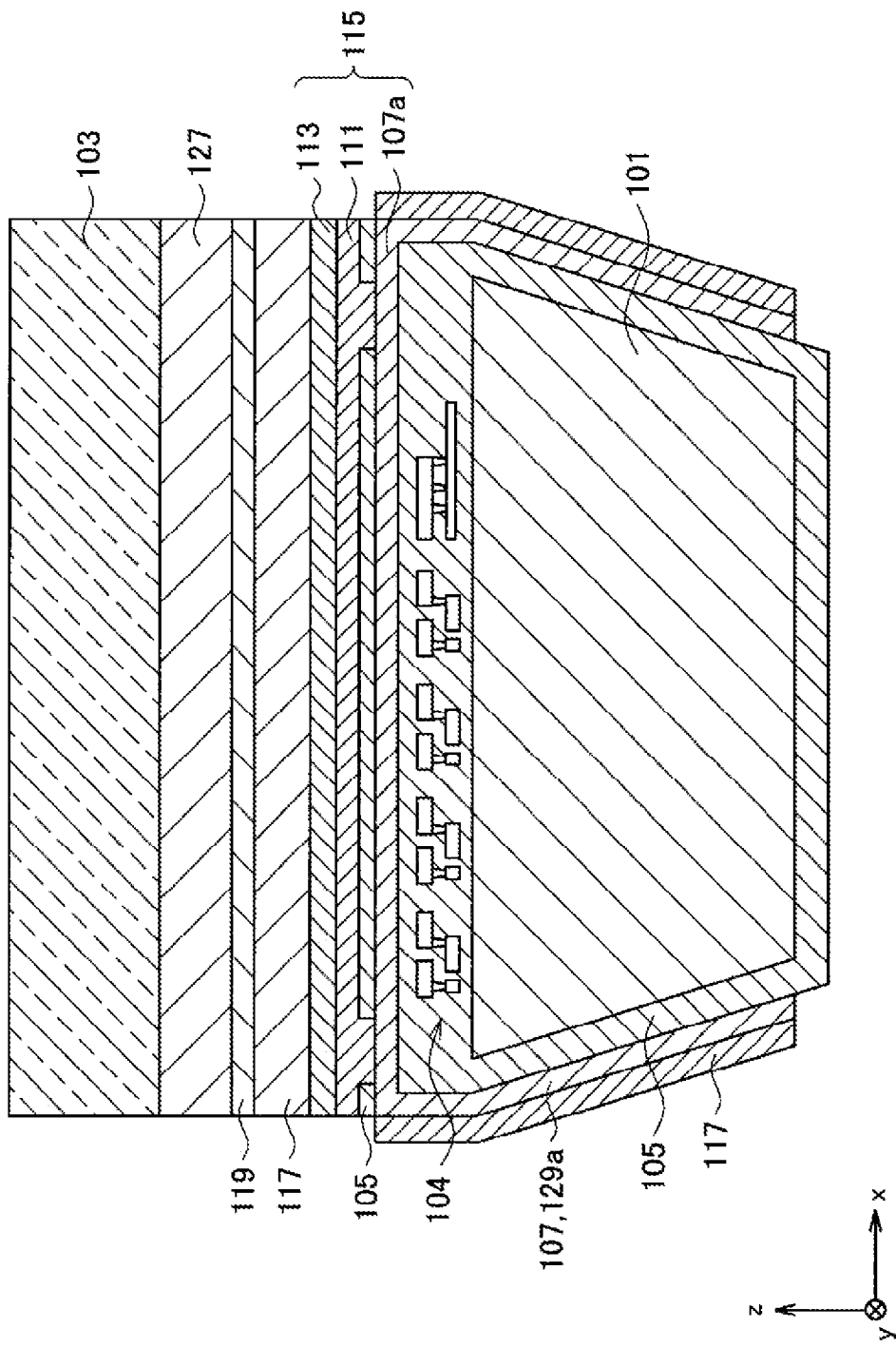

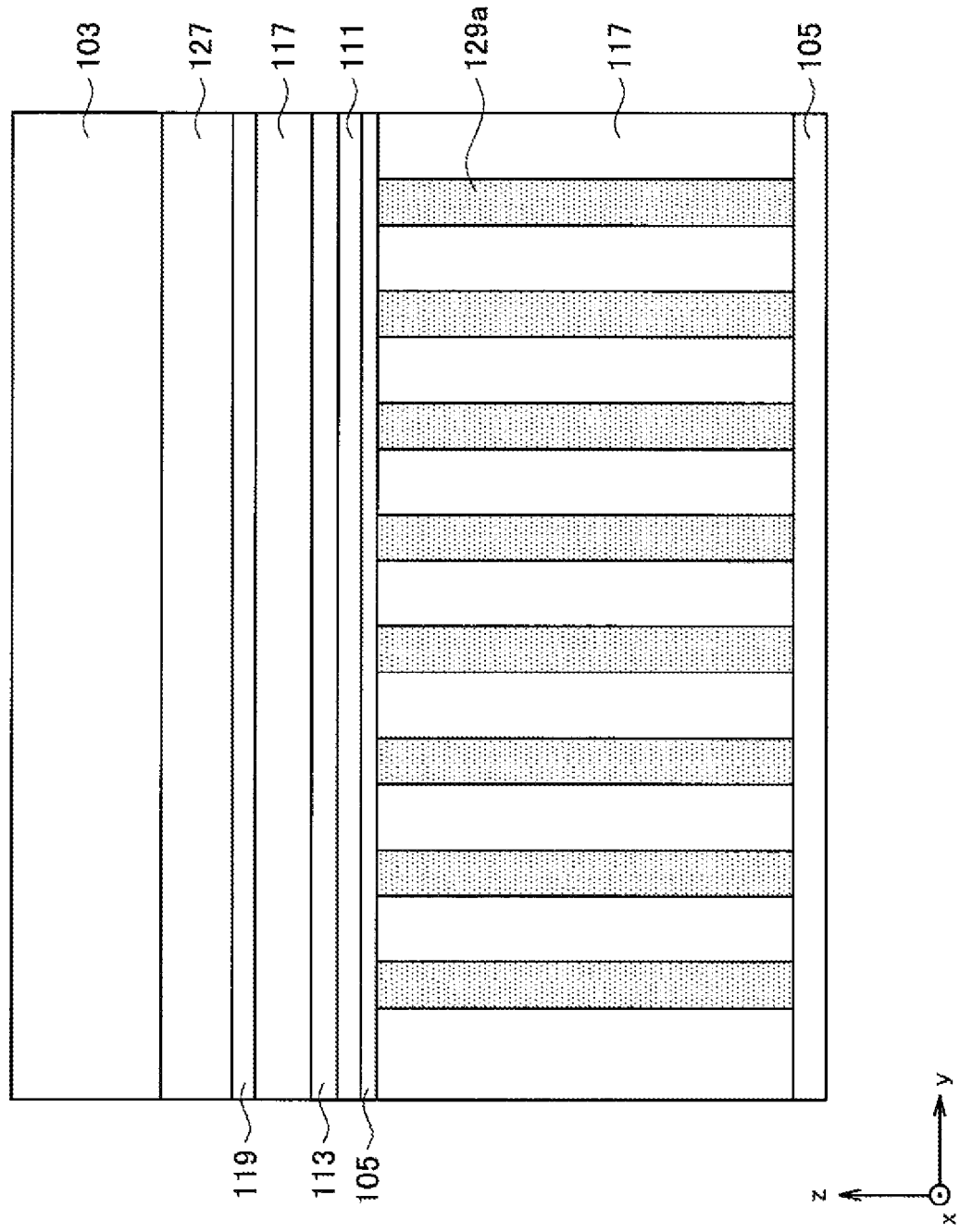

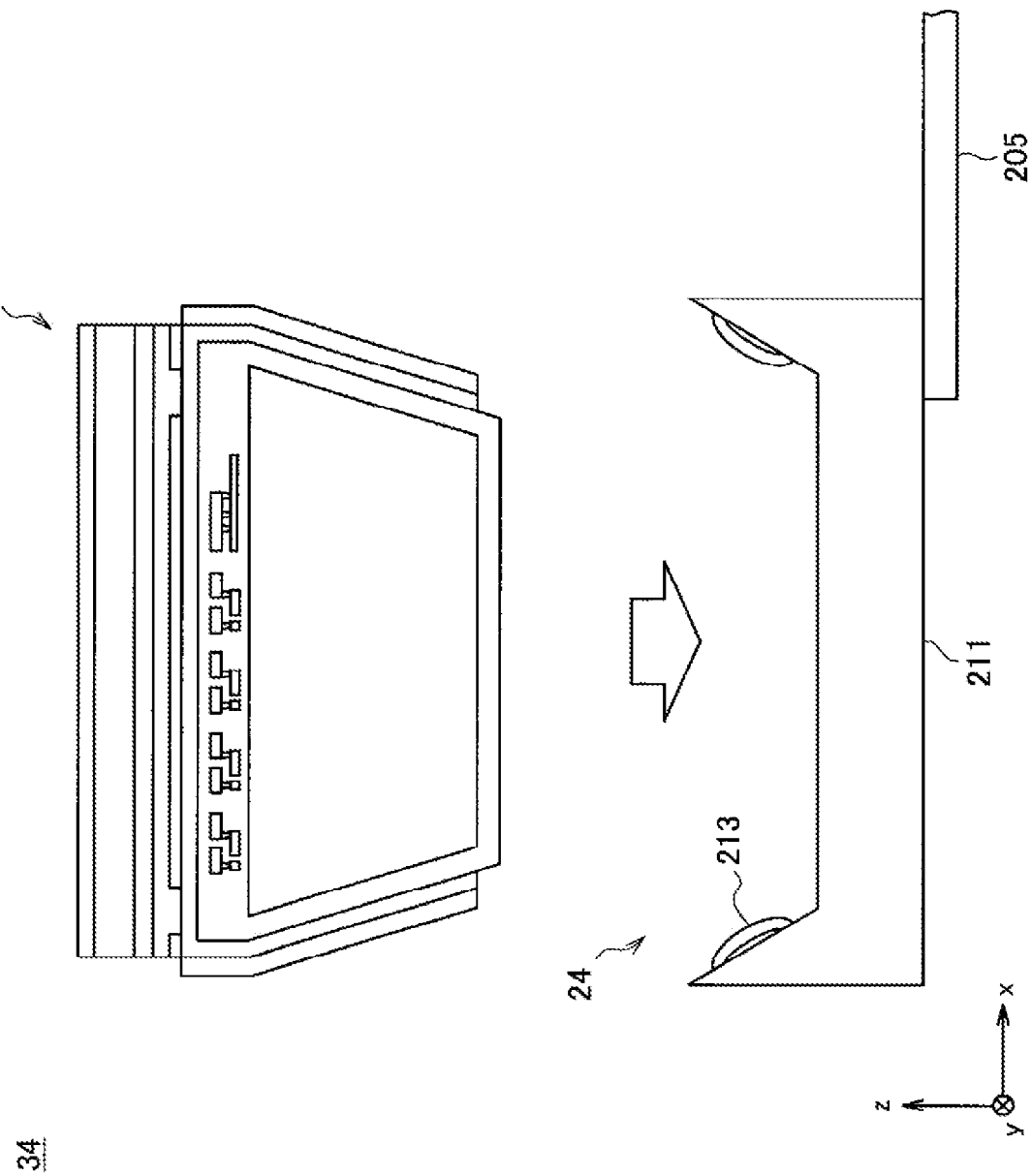

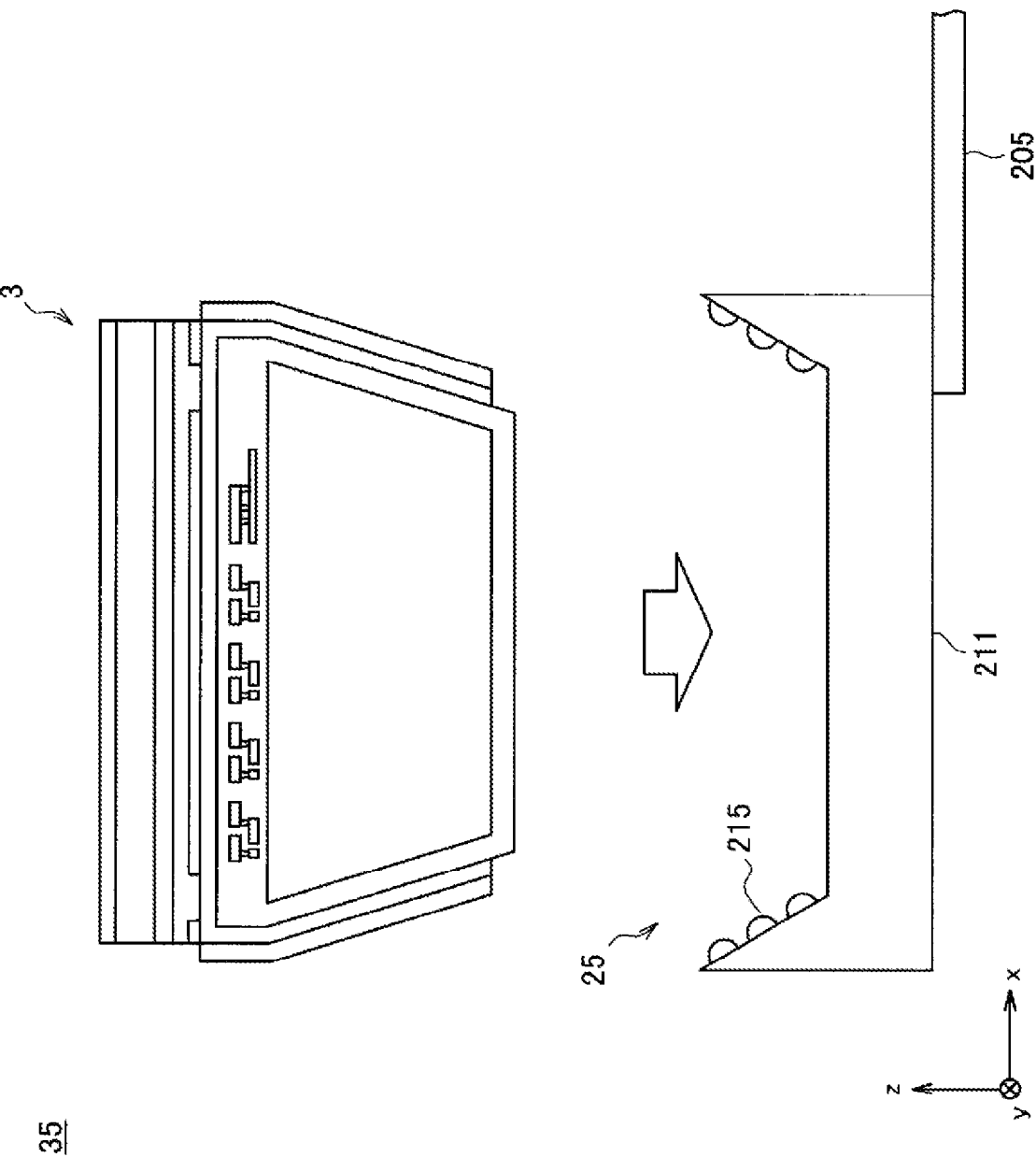

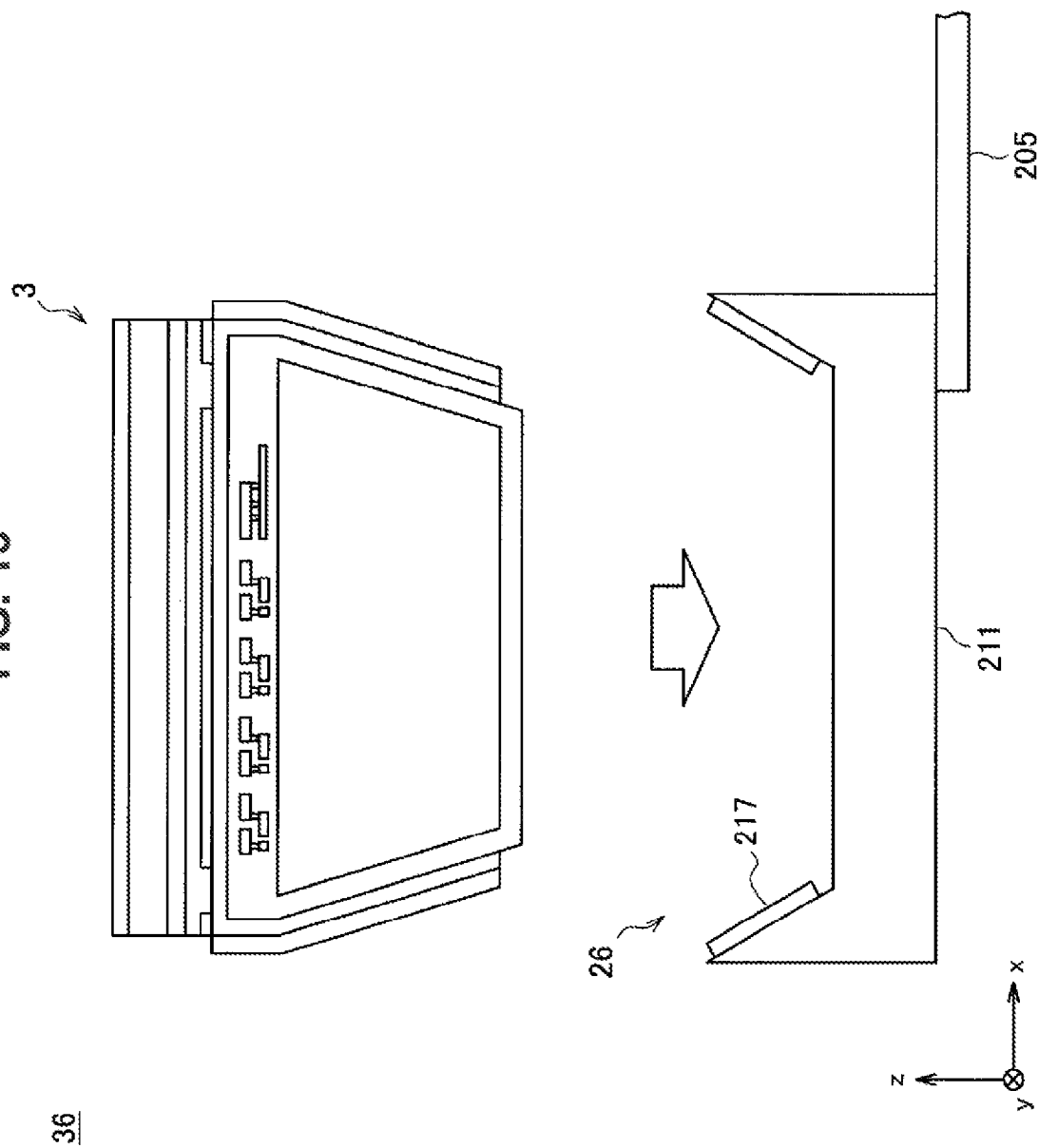

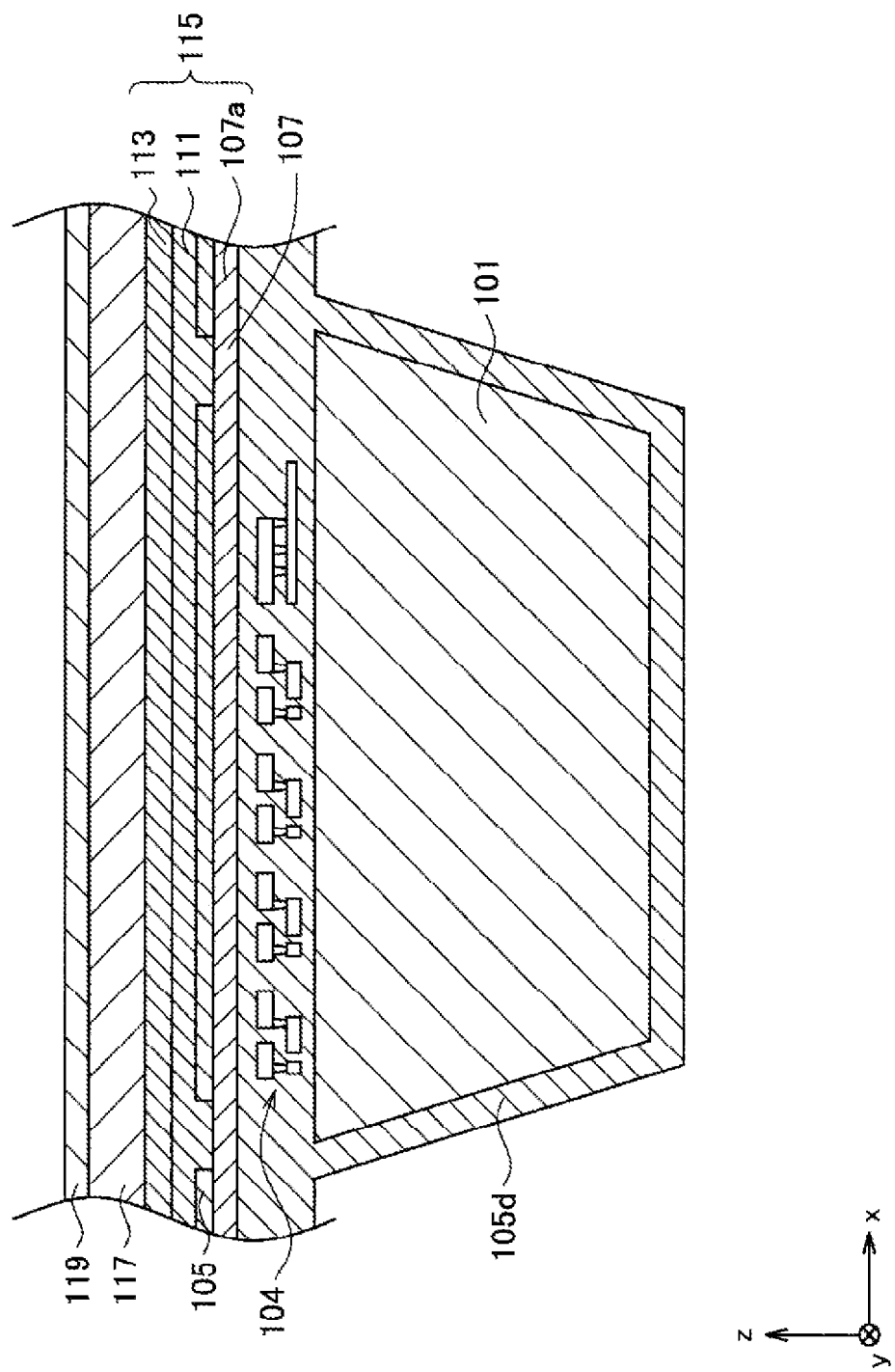

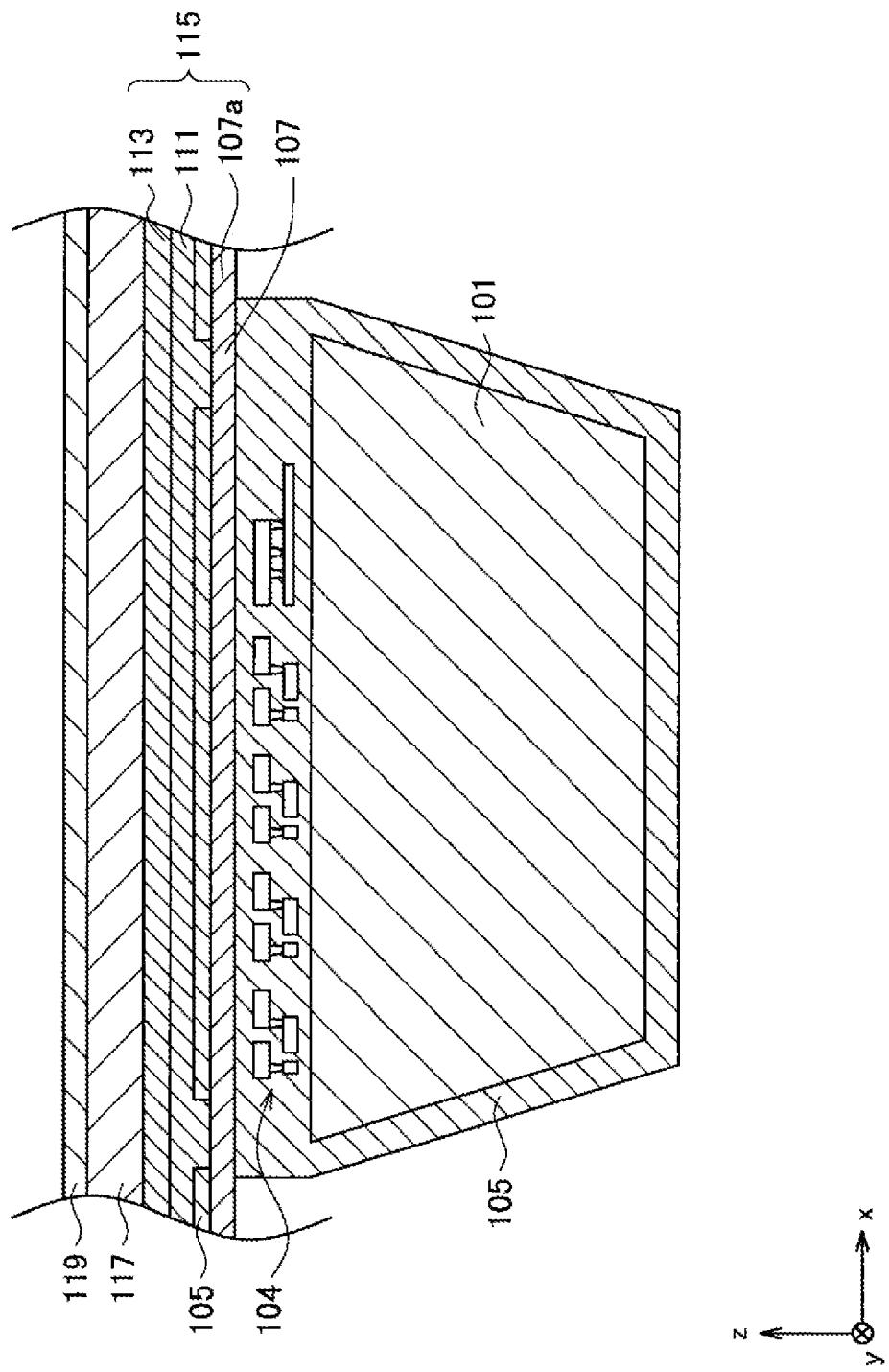

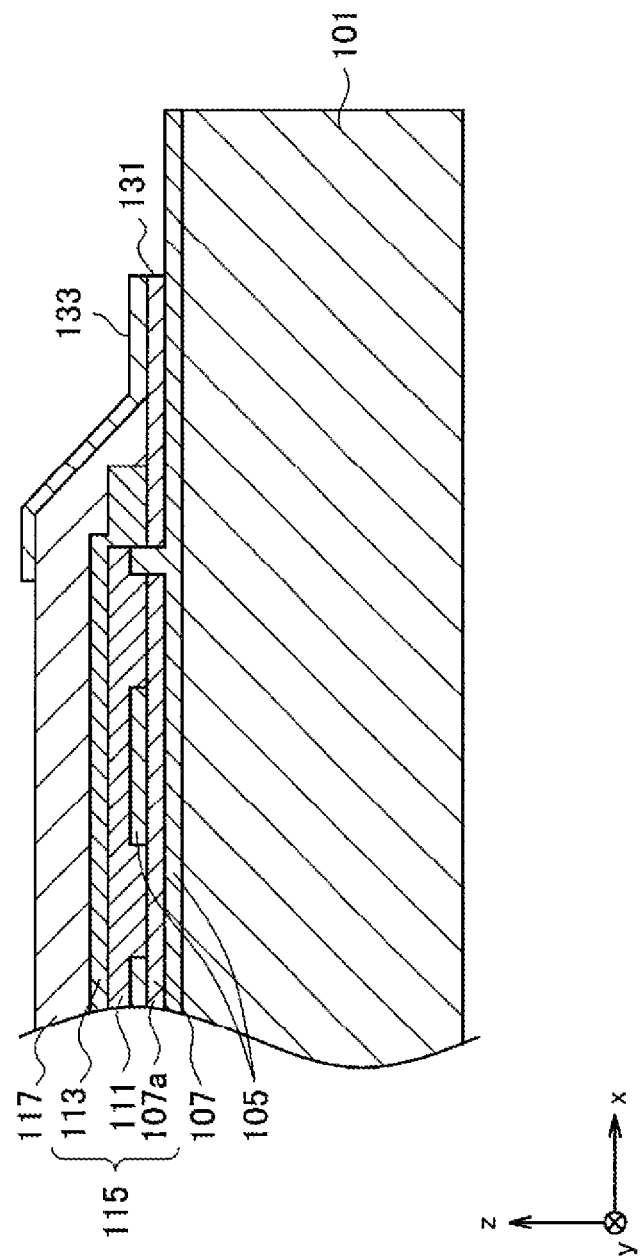

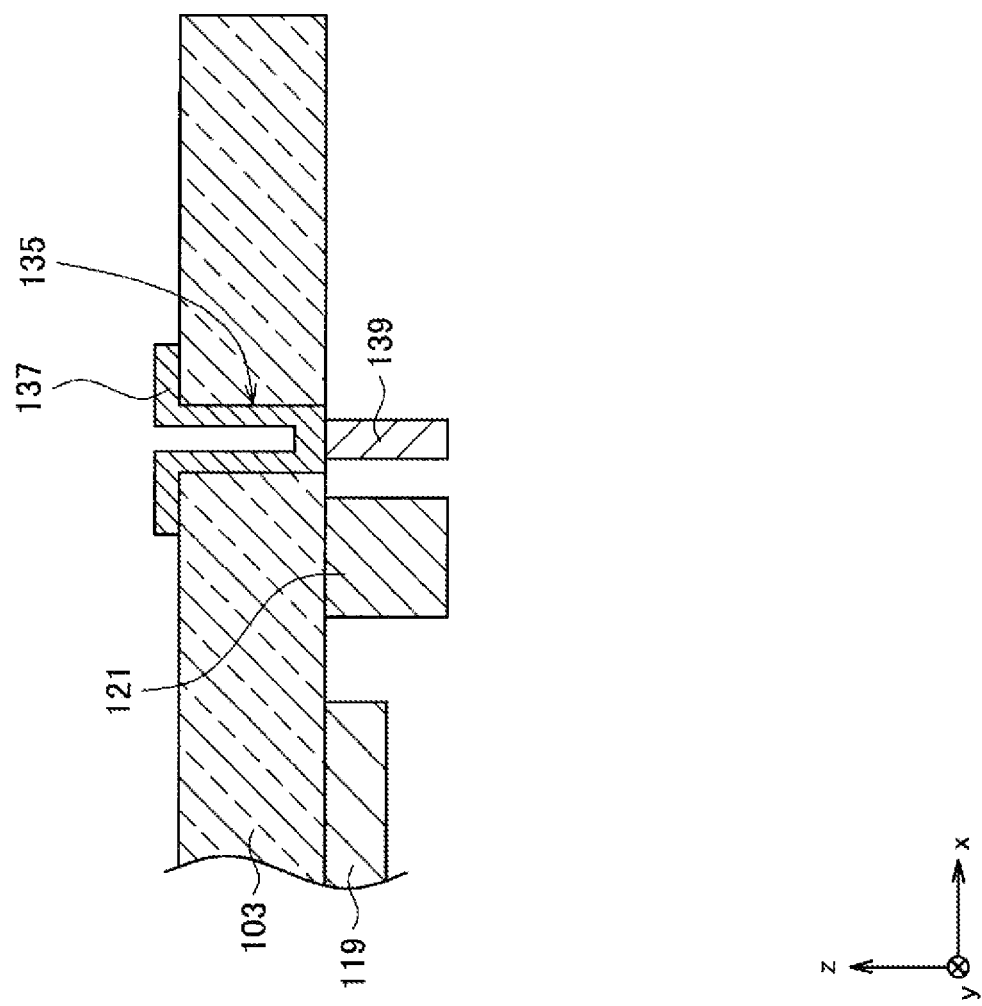

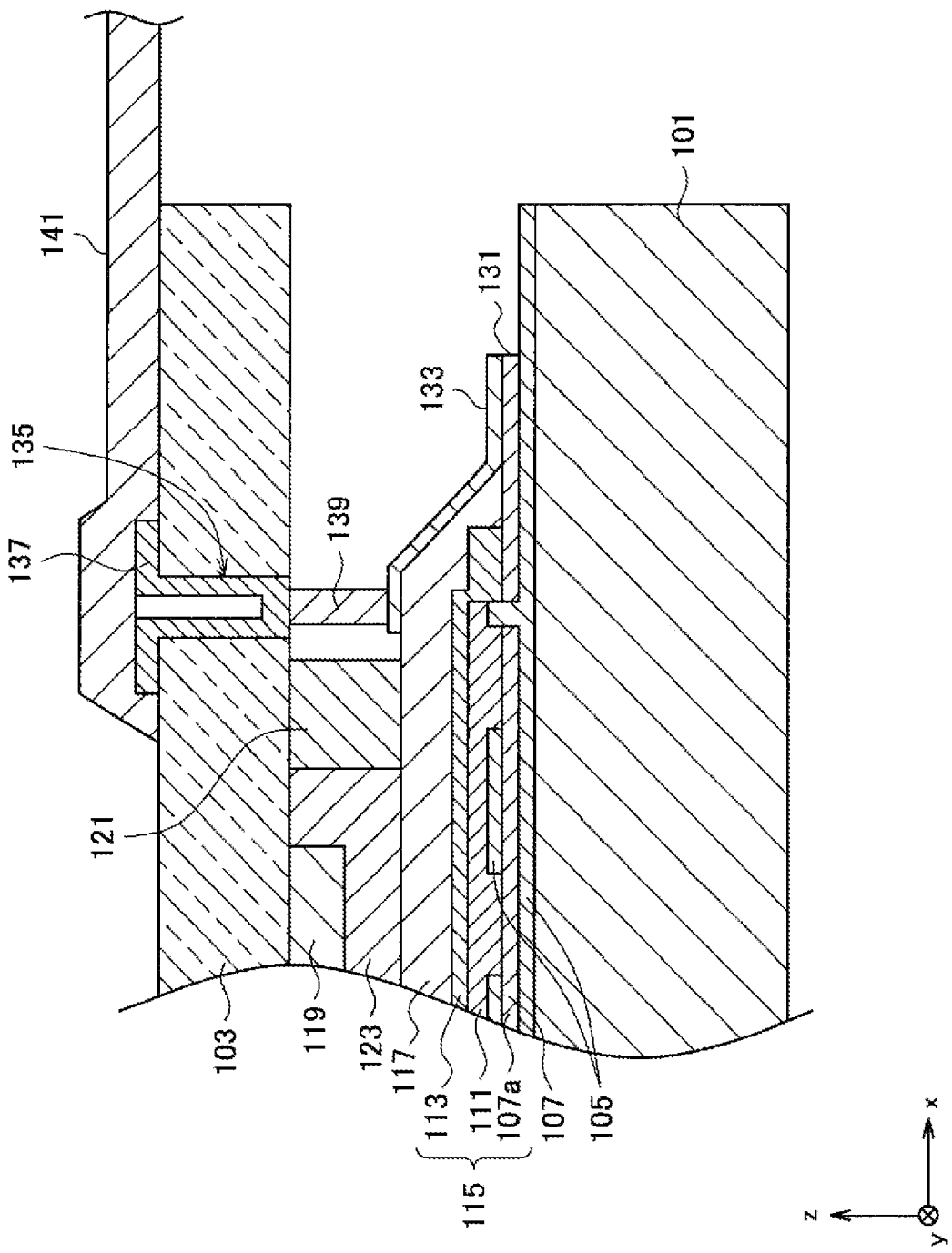

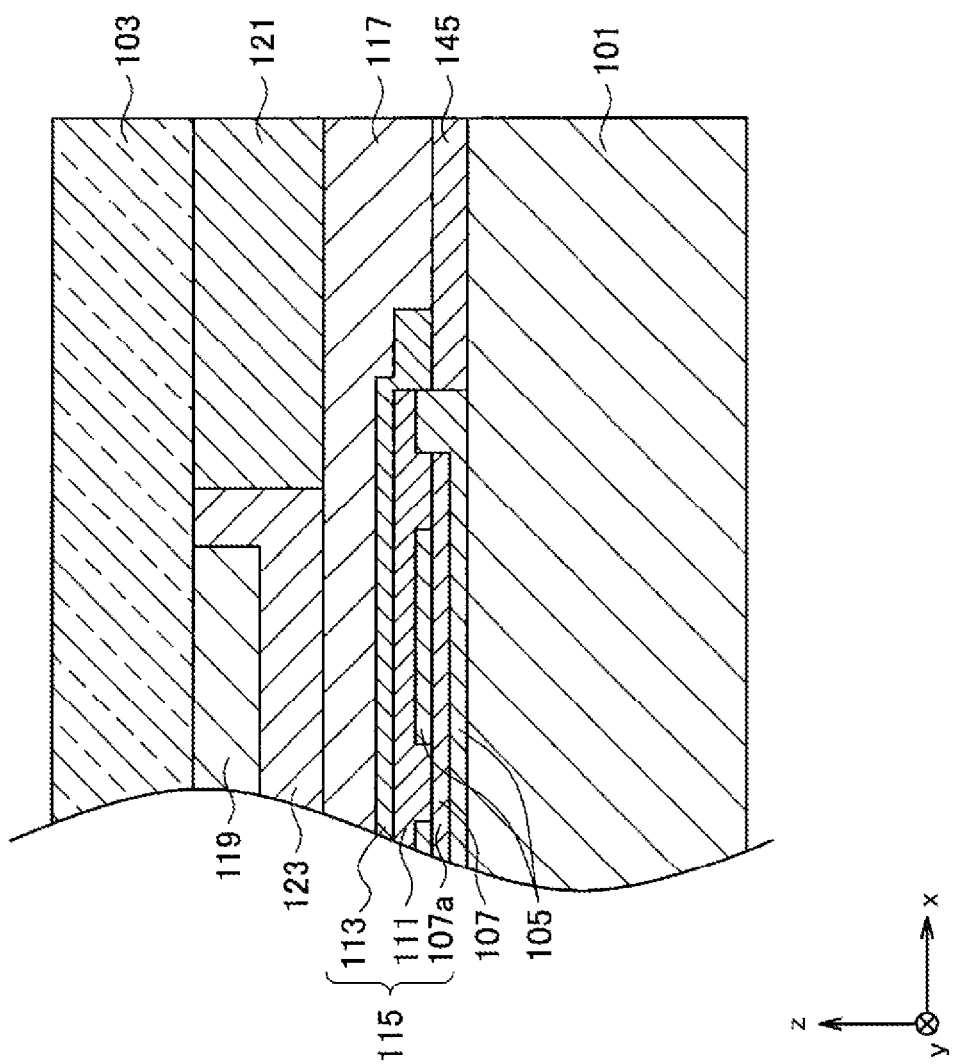

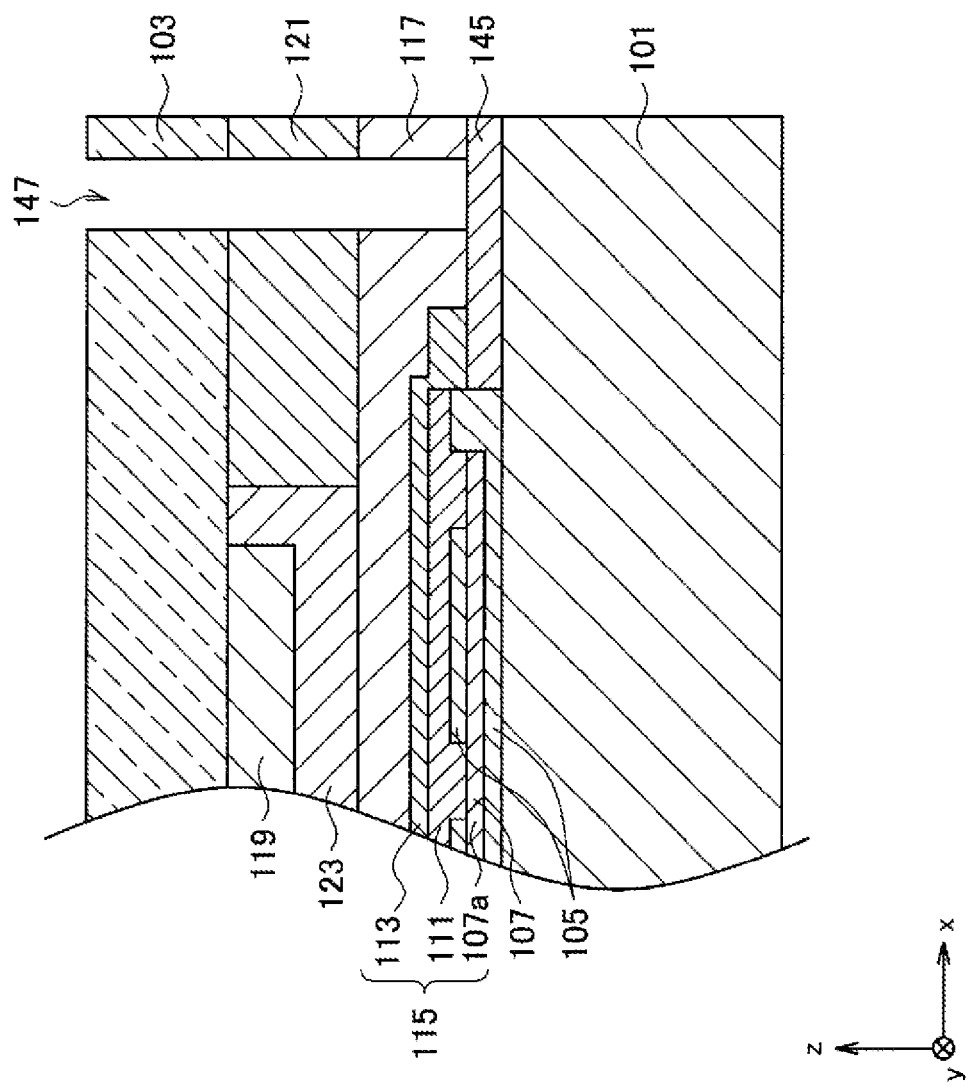

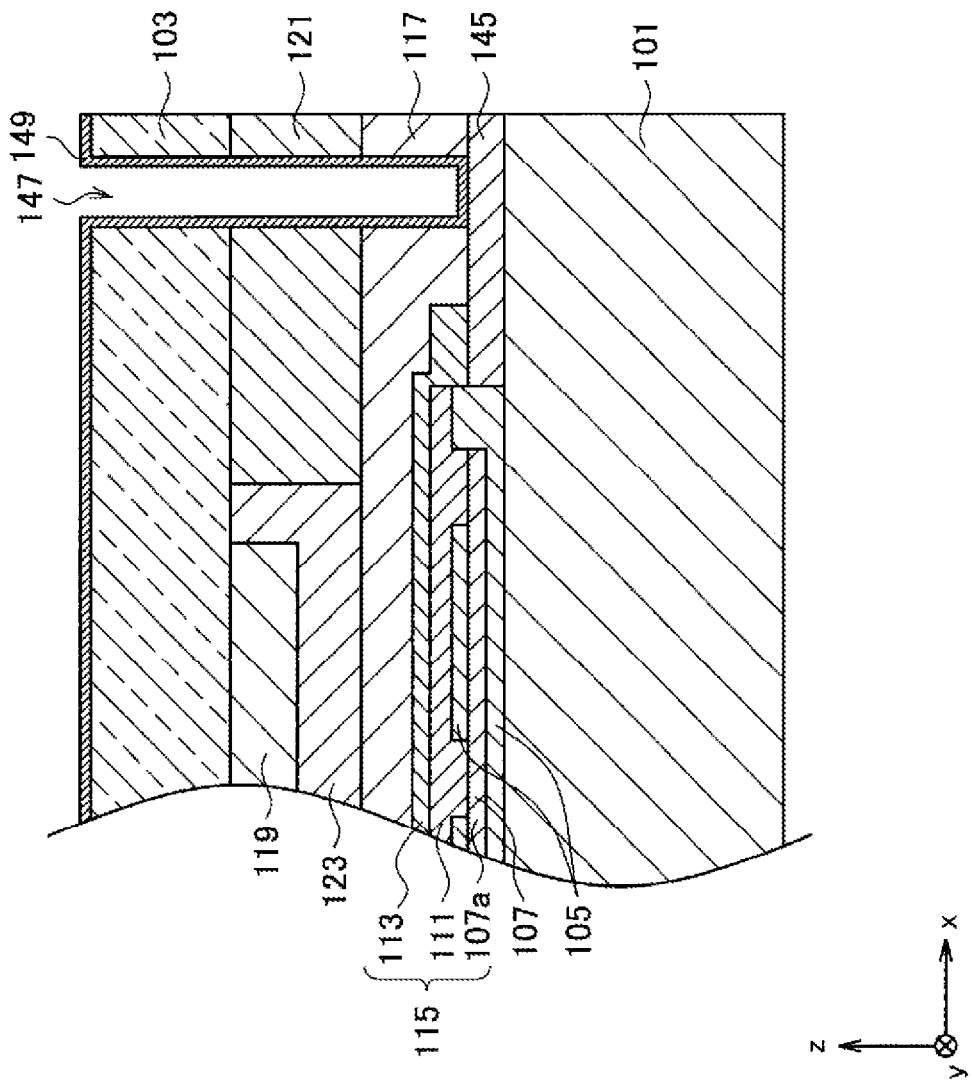

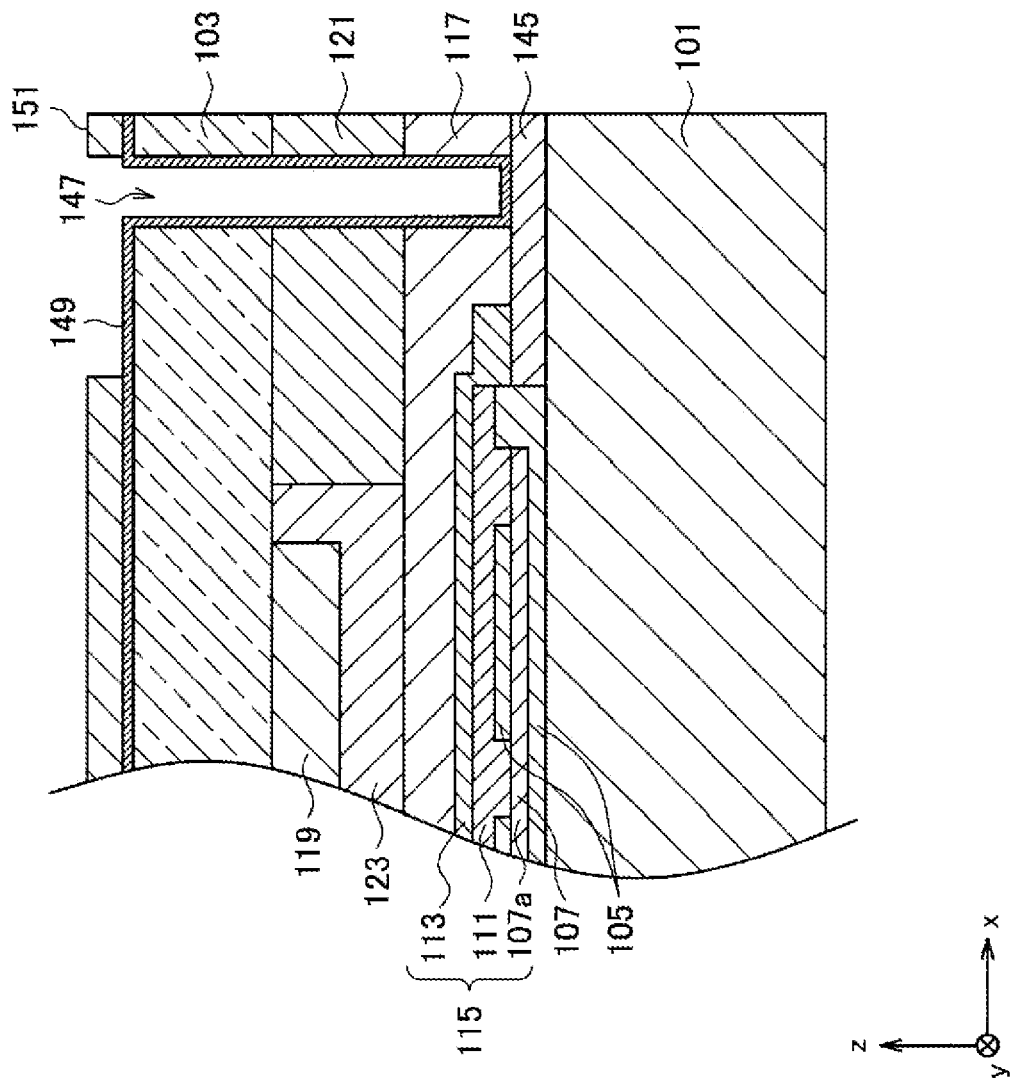

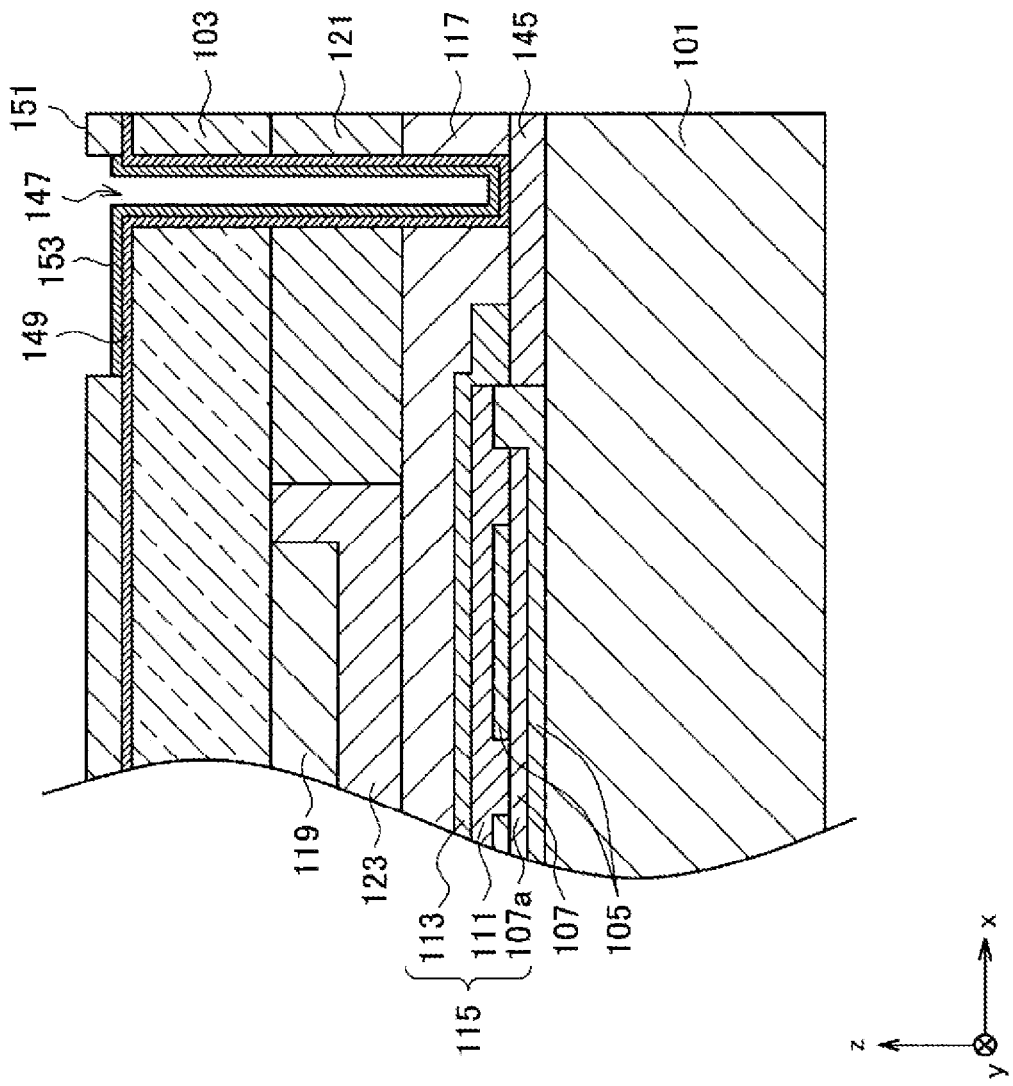

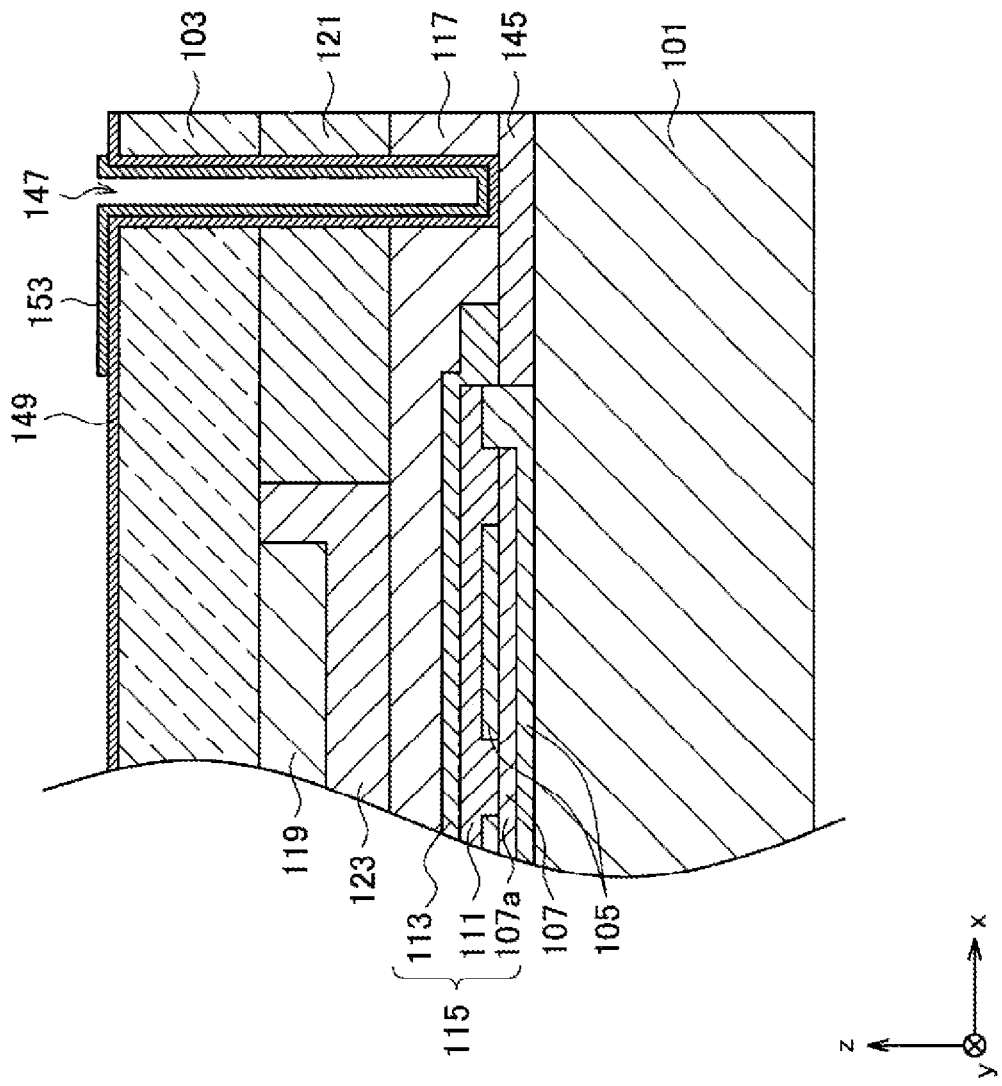

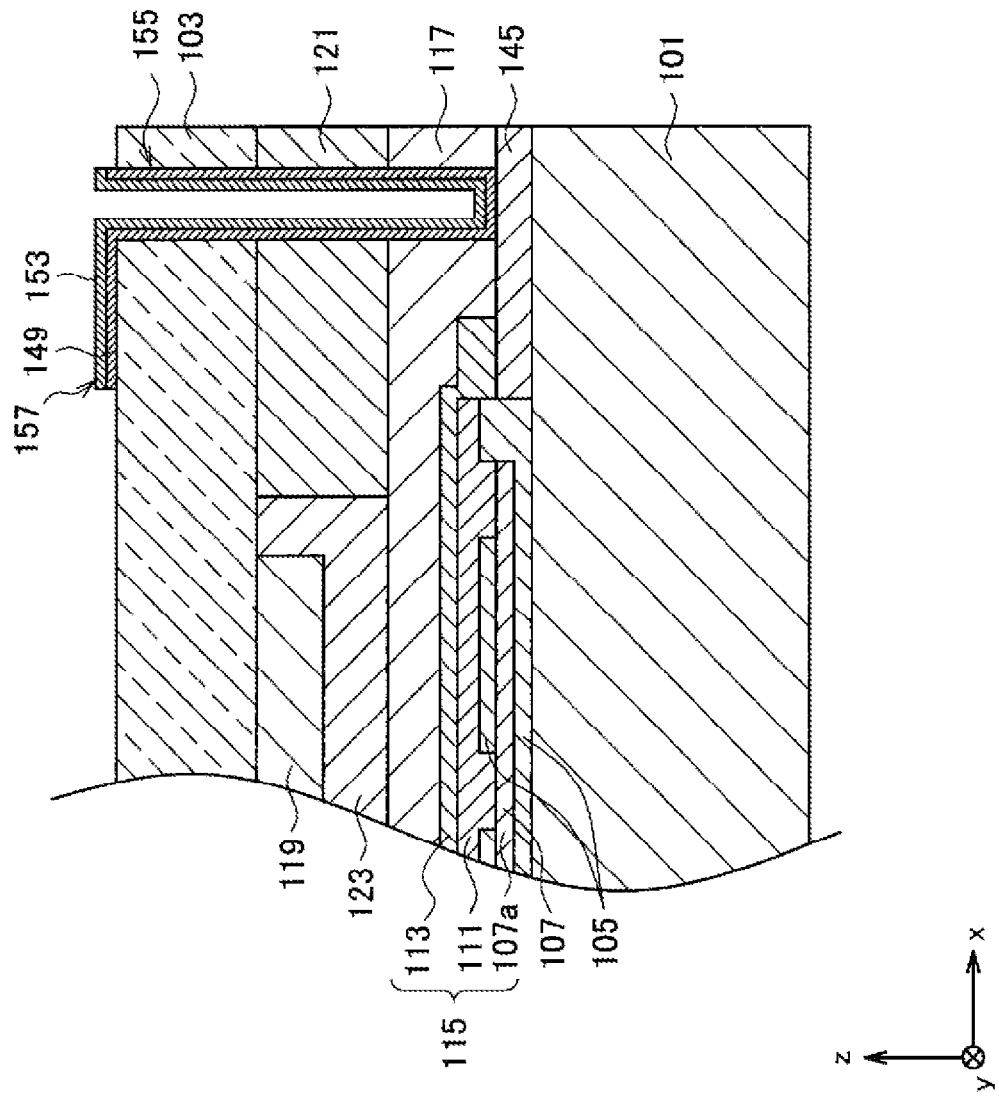

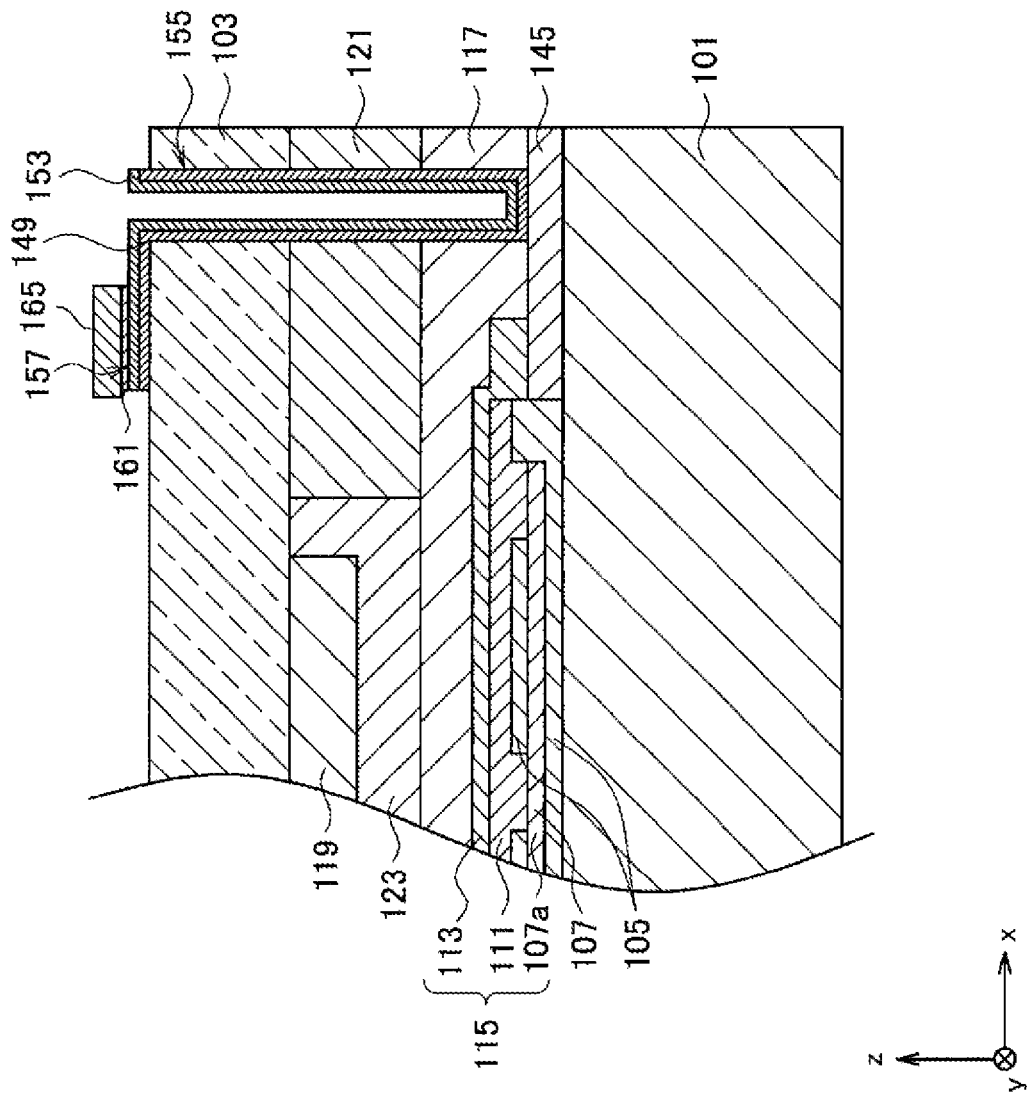

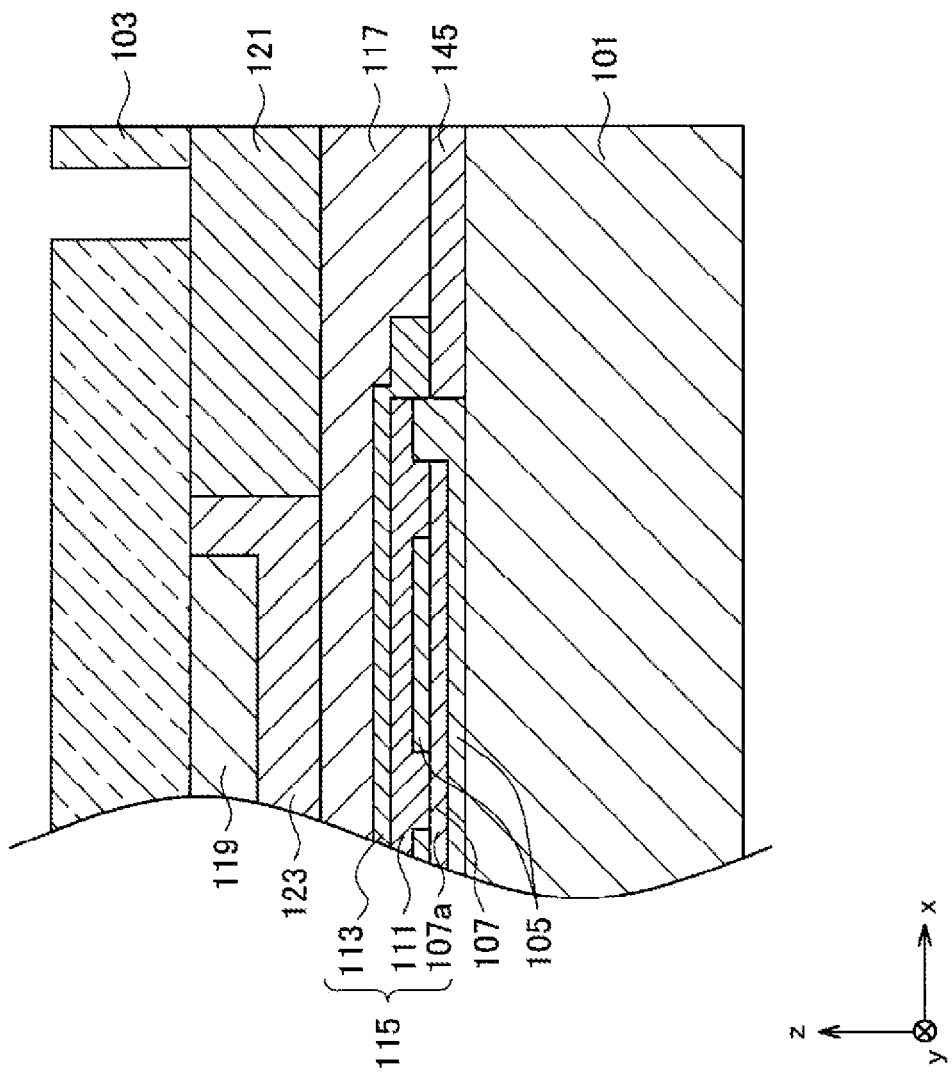

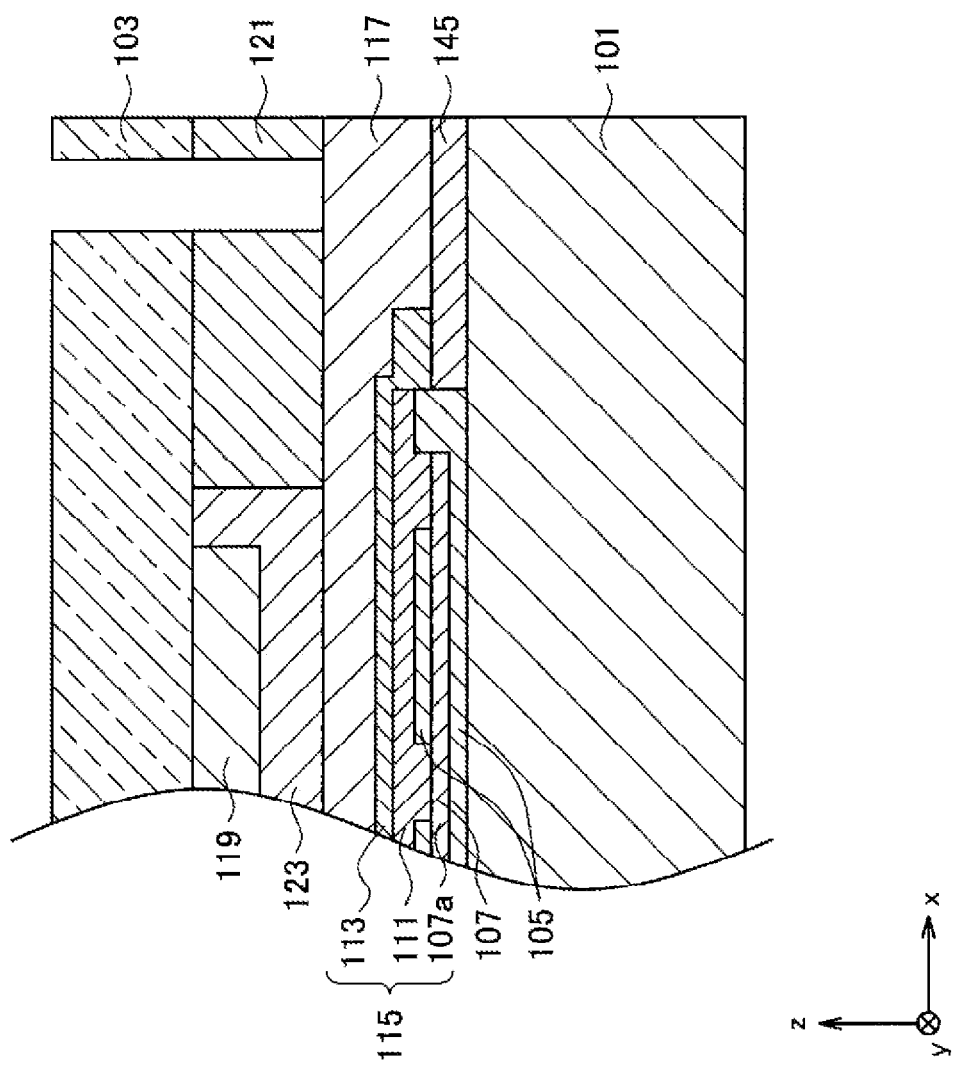

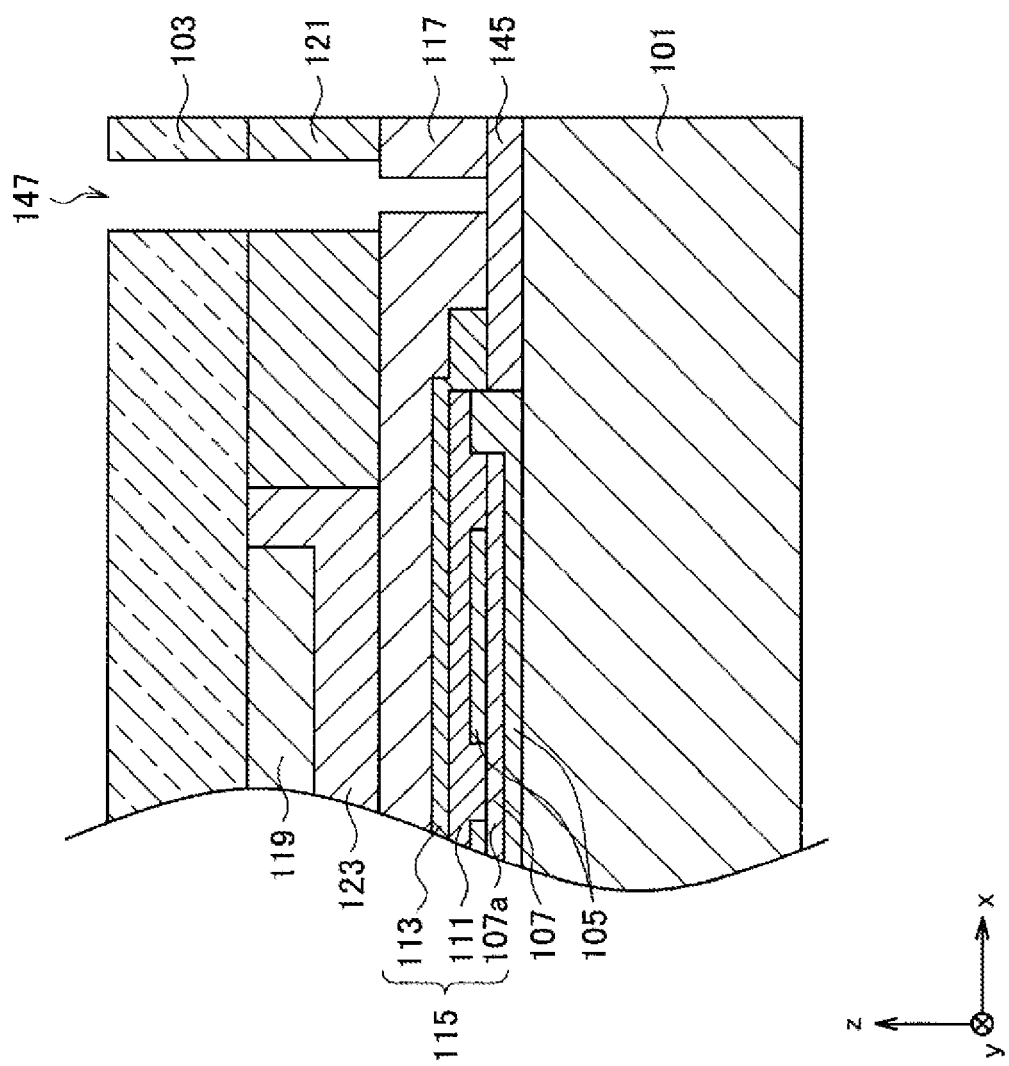

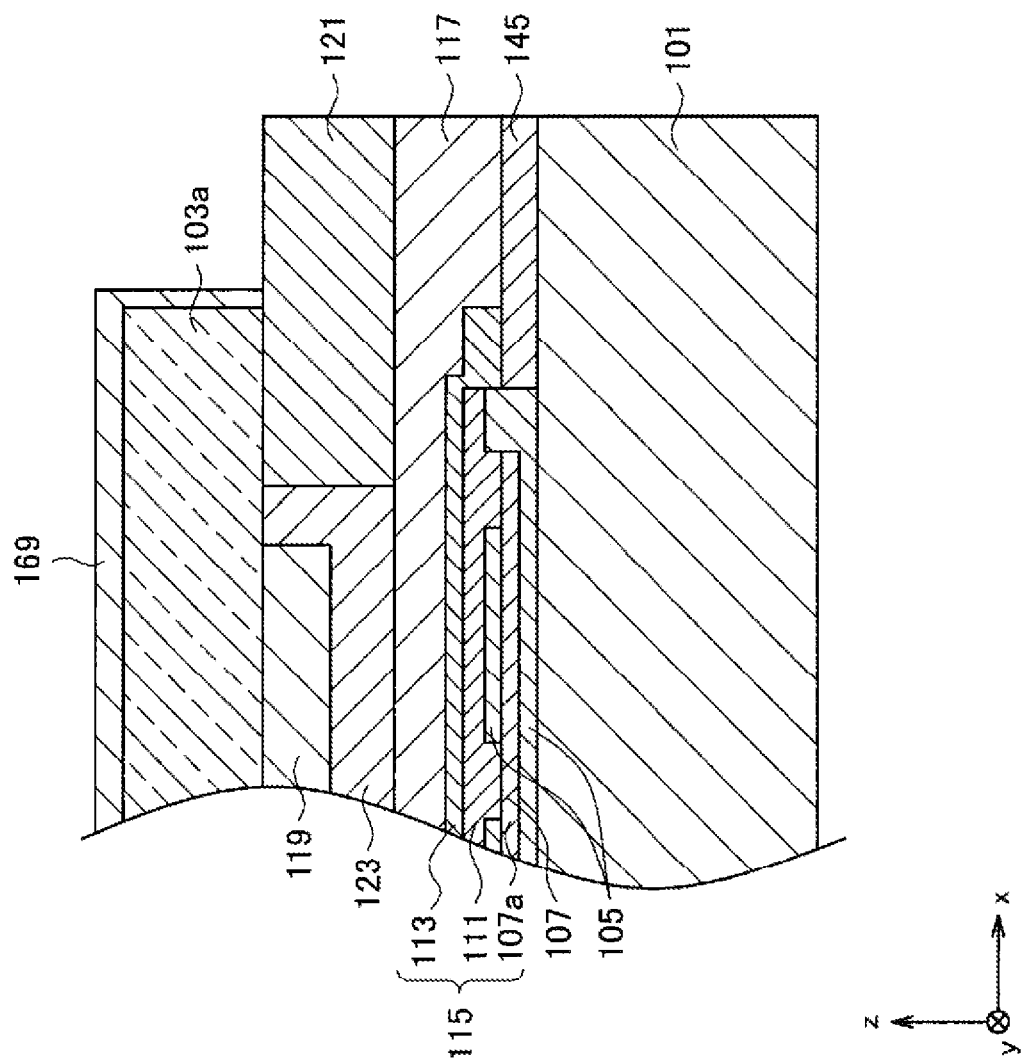

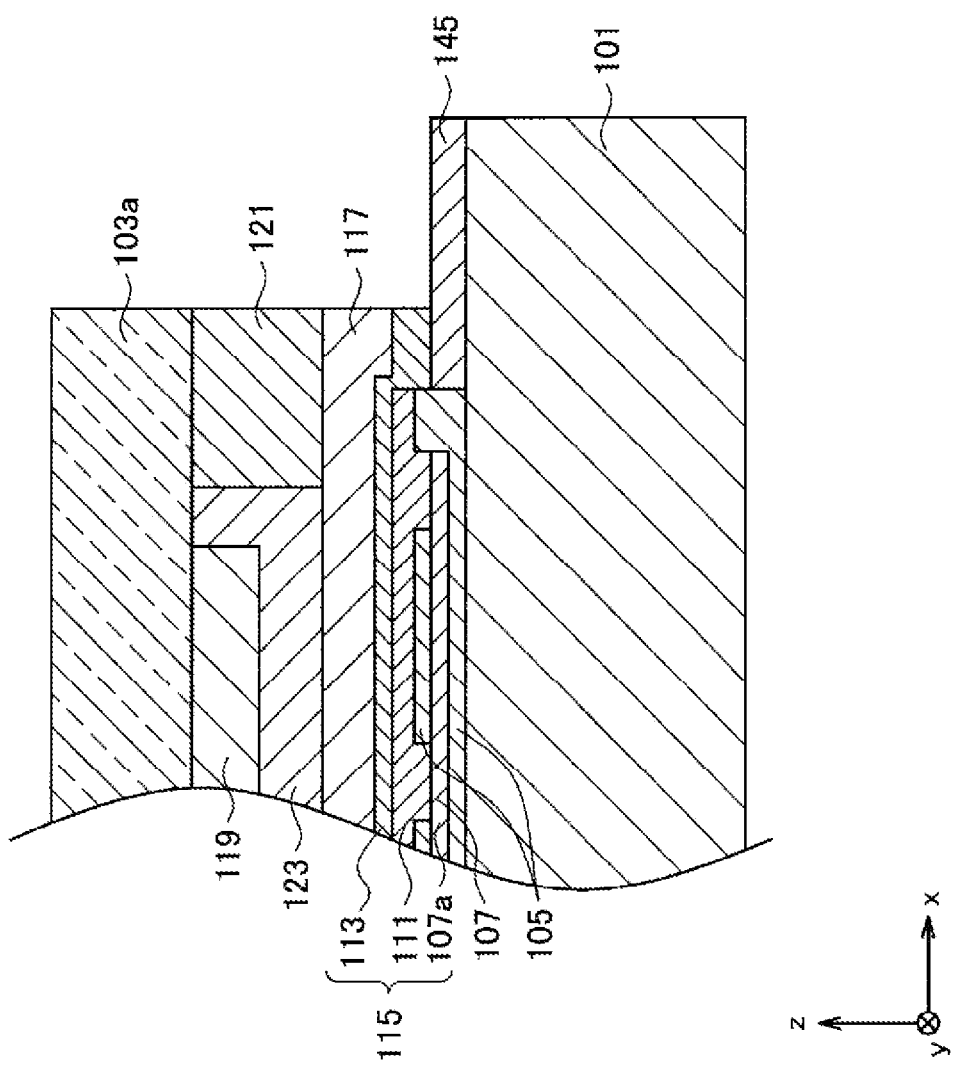

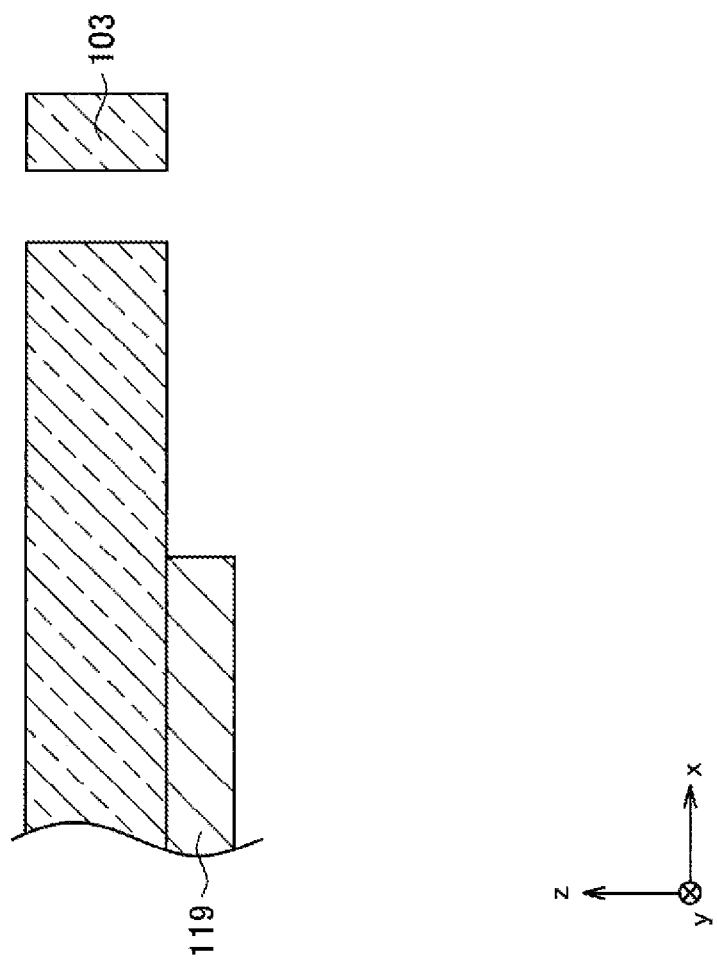

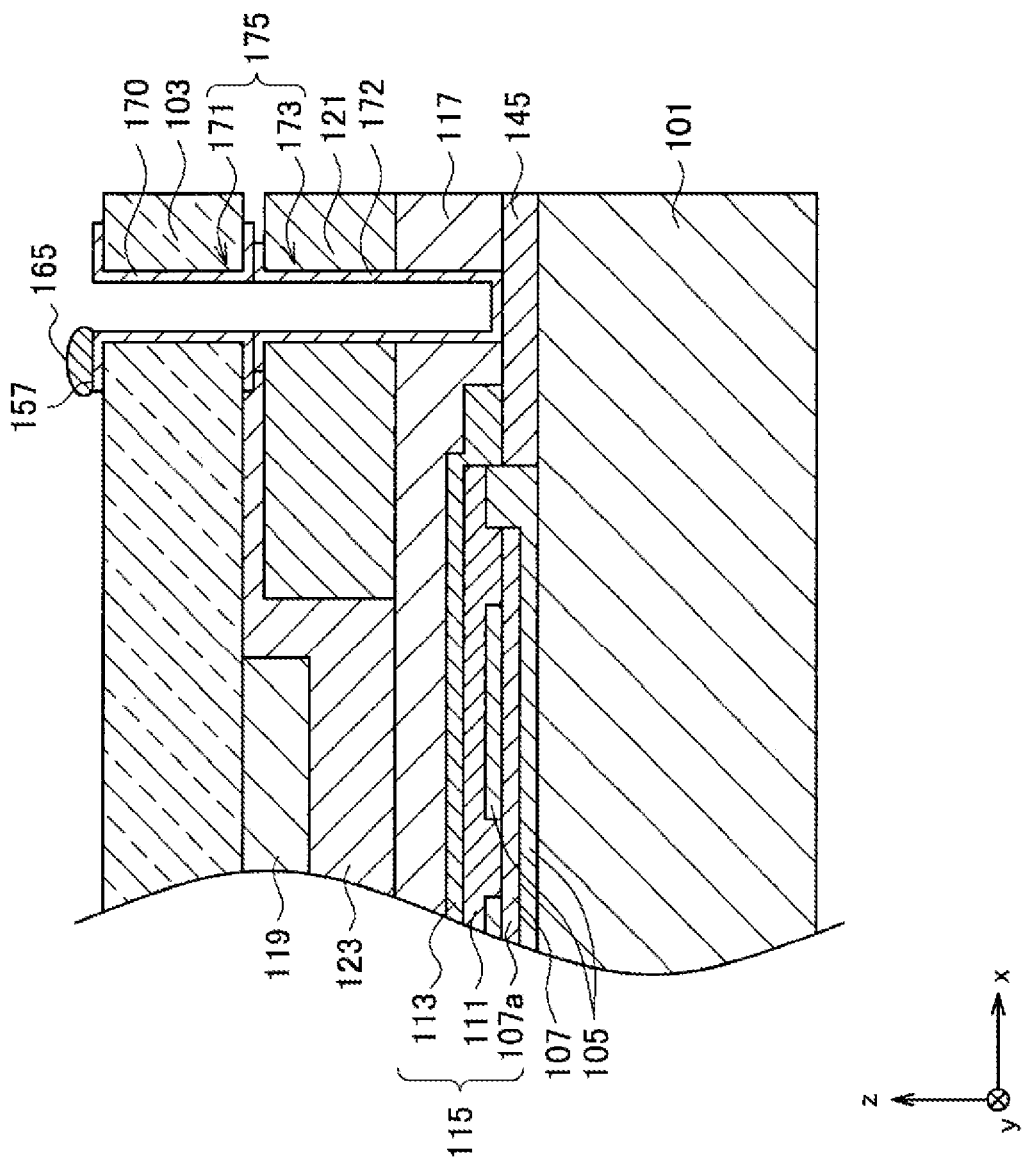

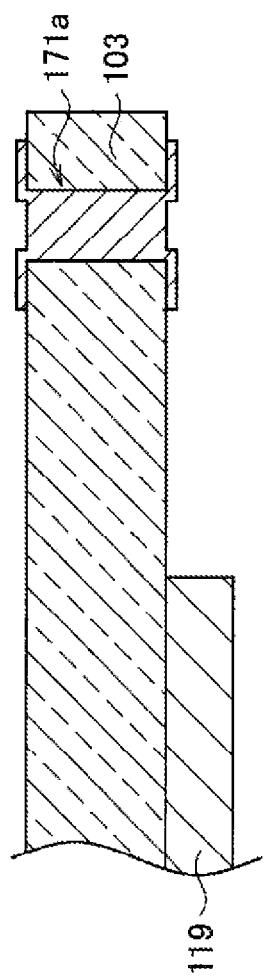
FIG. 25
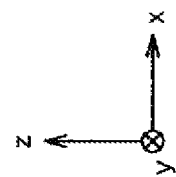

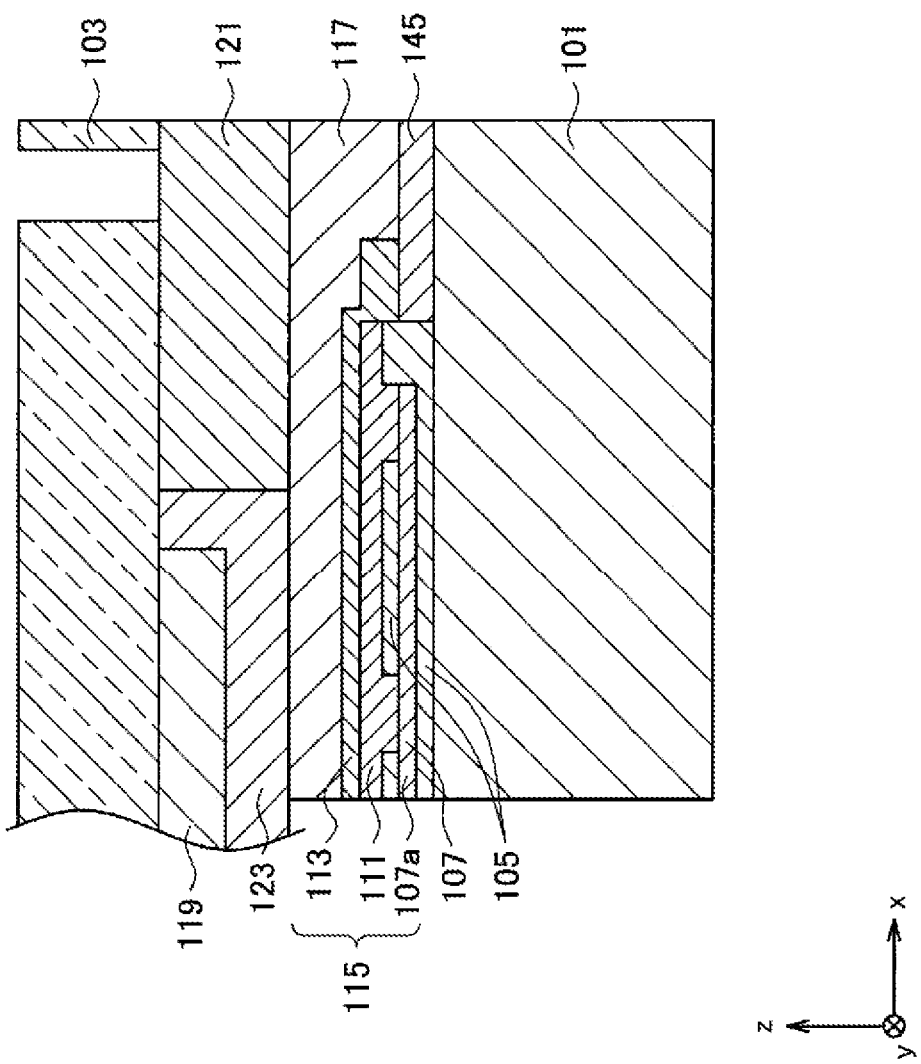

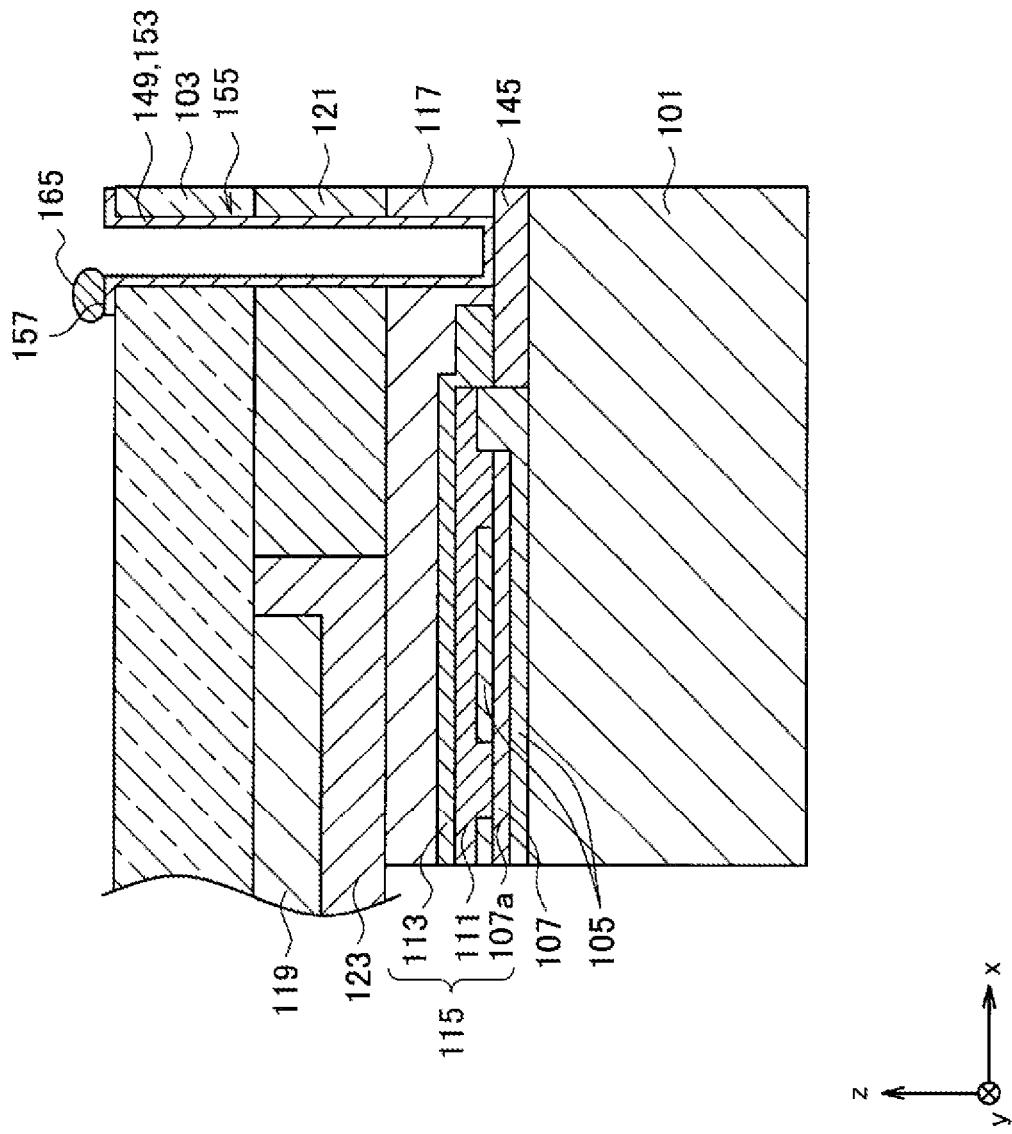

DISPLAY DEVICE, DISPLAY MODULE, METHOD OF MANUFACTURING DISPLAY DEVICE, AND METHOD OF MANUFACTURING DISPLAY MODULE

CROSS REFERENCE TO RELATED APPLICATIONS

This application is a U.S. national phase application of a PCT Application No. PCT/JP2017/015285 filed on Apr. 14, 2017, which claims priority to a Japanese Patent Application No. 2016-103231 filed on May 24, 2016, the disclosures of which are incorporated in their entirety by reference herein.

TECHNICAL FIELD

The present disclosure relates to a display device, a display module, a method of manufacturing the display device, and a method of manufacturing the display module.

BACKGROUND ART

Organic EL elements using electroluminescence of organic materials have been noticed as light emitting elements capable of emitting light with high luminance at low driving voltages. In methods of manufacturing display devices (organic EL displays) using organic EL elements as light-emitting elements, the organic EL elements included in pixels, first substrates (for example, semiconductor substrates) in which driving circuits or the like for driving the pixels are formed, and second substrates (for example, glass substrates) are bonded together. Then, the bonded first and second substrates are diced and organic EL displays segmented in chip shapes are fabricated.

At this time, in order to seal regions in which the organic EL elements are formed (that is, pixel regions in which pixels are formed), sealing materials are generally provided in spaces between the first and second substrates and between outer circumferences of chips and the pixel regions. The sealing materials also function as adhesives that cause the first and second substrates to adhere to each other.

In addition, in the organic EL displays, wirings such as potential supply lines for supplying potentials to driving circuits are also formed above the first substrates. The wirings are formed in so-called frame portions of regions other than the pixel regions on chip surfaces of the organic EL displays. Here, since regions corresponding to the frame portions are regions which do not contribute to display of images intrinsically, the areas of the frame portions on the chip surfaces are preferably small. This is because when the areas of the frame portions can be reduced, chip areas can be reduced and the number of chips which can be acquired from one wafer can be increased, and therefore manufacturing cost can be reduced.

Therefore, in the organic EL displays, many technologies for realizing reductions in the areas of the frame portions have been developed. For example, in the technology disclosed in Patent Literature 1, a reduction in the area of a frame portion can be achieved by contriving a layout of potential supply lines in the organic EL display.

CITATION LIST

Patent Literature

Patent Literature 1: JP 2009-186982A

DISCLOSURE OF INVENTION

Technical Problem

Here, in the organic EL display, it is necessary to also provide an input and output unit (I/O unit) in which pad portions or the like exchanging signals with the outside (hereinafter also referred to as signal electrodes) are provided above the first substrate. For example, in general configurations of the related art including the technology disclosed in the foregoing Patent Literature 1, the I/O unit is provided outside the sealing material. Then, by connecting flexible printed circuits (FPCs) and signal electrodes of the I/O unit by wire bonding or via an anisotropic conductive film (ACF), a chip of the organic EL display can be electrically connected to an external power circuit or the like via the FPC.

In general organic EL displays with the foregoing configuration, it is necessary to reduce the areas of the I/O units in order to reduce the chip areas. However, in technologies of the related art including the technology disclosed in the foregoing Patent Literature 1, the reduction in the area of the I/O units has not been sufficiently examined. That is, in the technologies of the related art, there were situations in which reduction in the area of a region from the outer edge of a chip to the outer edge of a sealing material in a chip surface could not be said to have been sufficiently examined and reduction in chip areas could not be said to have been effectively achieved.

Accordingly, the present disclosure proposes a novel and improved display device, a novel and improved display module, a novel and improved method of manufacturing the display device, and a novel and improved method of manufacturing the display module capable of further reducing a chip area.

Solution to Problem

According to the present disclosure, there is provided a display module including: a display device configured such that a pixel region in which a plurality of pixels for displaying an image are arranged is formed on an upper surface of a substrate, and a device-side signal electrode for exchanging a signal related to the pixels with an outside is disposed on a side surface of the substrate; and a module casing configured to store the display device and have a casing-side signal electrode electrically connected to the device-side signal electrode in a spot facing the device-side signal electrode.

In addition, according to the present disclosure, there is provided a method of manufacturing a display module, the method including: a step of fabricating a display device configured such that a pixel region in which a plurality of pixels for displaying an image are arranged is formed on an upper surface of a substrate, and a device-side signal electrode for exchanging a signal related to the pixels with an outside is disposed on a side surface of the substrate; and a step of storing the display device in a module casing that has a casing-side signal electrode electrically connected to the device-side signal electrode.

In addition, according to the present disclosure, there is provided a display device including: a first substrate configured such that a pixel region in which a plurality of pixels for displaying an image are arranged is formed on an upper surface; a second substrate provided in an upper layer of the first substrate via a bonding material for bonding the first substrate and configured to be transparent to light exiting from the pixels; and a signal electrode located on an upper surface of the second substrate and configured to exchange a signal related to the pixels with an outside.

In addition, according to the present disclosure, there is provided a display module including: a display device including a first substrate configured such that a pixel region in which a plurality of pixels for displaying an image are arranged is formed on an upper surface, a second substrate provided in an upper layer of the first substrate via a bonding material for bonding the first substrate and configured to be transparent to light exiting from the pixels, and a device-side signal electrode located on an upper surface of the second substrate and configured to exchange a signal related to the pixels with an outside; and a module casing configured to store the display device. A casing-side signal electrode electrically connected to the device-side signal electrode via a bump is in a spot corresponding to the device-side signal electrode of the module casing.

In addition, according to the present disclosure, there is provided a method of manufacturing a display device, the method including: a step of forming a pixel region in which a plurality of pixels for displaying an image are arranged on an upper surface of a first substrate; and a step of bonding a second substrate transparent to light exiting from the pixels, to the upper surface of the first substrate via a bonding material. A signal electrode for exchanging a signal related to the pixels with an outside is formed on an upper surface of the second substrate.

According to the present disclosure, in the display device, a device-side signal electrode exchanging the signal related to the pixel with the outside is disposed on the side surface of the substrate. Accordingly, since it is not necessary to ensure a region in which the device-side signal electrode is provided on the upper surface of the substrate, it is possible to reduce the chip area.

In addition, according to the present disclosure, in the display device, the device-side signal electrode exchanging the signal related to the pixel with the outside is disposed on the upper surface of the second substrate bonded to the first substrate in which the pixel region is formed. Accordingly, since it is not necessary to ensure a region in which the device-side signal electrode is provided on the upper surface of the first substrate, it is possible to reduce the chip area.

Advantageous Effects of Invention

As described above, according to the present disclosure, it becomes possible to further reduce a chip area. Note that the effects described above are not necessarily limitative. With or in the place of the above effects, there may be achieved any one of the effects described in this specification or other effects that may be grasped from this specification.

BRIEF DESCRIPTION OF DRAWINGS

FIG. 3B is an explanatory diagram illustrating a method of manufacturing a display device according to a first embodiment.

FIG. 3C is an explanatory diagram illustrating a method of manufacturing a display device according to a first embodiment.

FIG. 3H is an explanatory diagram illustrating a method of manufacturing a display device according to a first embodiment.

FIG. 4 is a diagram illustrating an aspect when a tapered region of the segmented display device illustrated in FIG. 3J is viewed laterally (an x axis direction).

FIG. 5 is a diagram illustrating a schematic configuration of a display module according to the first embodiment.

FIG. 6 is a diagram illustrating a schematic configuration of a display module according to a modification example of the first embodiment.

FIG. 7 is a diagram illustrating a schematic configuration of a display module according to another modification example of the first embodiment.

FIG. 8 is a diagram illustrating a schematic configuration of a display device according to a second embodiment.

FIG. 9A is an explanatory diagram illustrating a method of manufacturing a display device according to a third embodiment.

FIG. 9B is an explanatory diagram illustrating a method of manufacturing a display device according to a third embodiment.

FIG. 9C is an explanatory diagram illustrating a method of manufacturing a display device according to a third embodiment.

FIG. 9D is an explanatory diagram illustrating a method of manufacturing a display device according to a third embodiment.

FIG. 9E is an explanatory diagram illustrating a method of manufacturing a display device according to a third embodiment.

FIG. 9F is an explanatory diagram illustrating a method of manufacturing a display device according to a third embodiment.

FIG. 9G is an explanatory diagram illustrating a method of manufacturing a display device according to a third embodiment.

FIG. 9H is an explanatory diagram illustrating a method of manufacturing a display device according to a third embodiment.

FIG. 9I is an explanatory diagram illustrating a method of manufacturing a display device according to a third embodiment.

FIG. 9K is an explanatory diagram illustrating a method of manufacturing a display device according to a third embodiment.

FIG. 9L is an explanatory diagram illustrating a method of manufacturing a display device according to a third embodiment.

FIG. 10 is a diagram illustrating an aspect when a tapered region of the segmented display device illustrated in FIG. 9L is viewed laterally (the x axis direction).

FIG. 11 is a diagram illustrating a schematic configuration of a display module according to the third embodiment.

FIG. 12 is a diagram illustrating a schematic configuration of a display module according to a modification example of the third embodiment.

FIG. 13 is a diagram illustrating a schematic configuration of a display module according to another modification example of the third embodiment.

FIG. 14B is an explanatory diagram illustrating a method of manufacturing a display device according to a fourth embodiment.

FIG. 14C is an explanatory diagram illustrating a method of manufacturing a display device according to a fourth embodiment.

FIG. 16B is an explanatory diagram illustrating a method of manufacturing a display device according to a fifth embodiment.

FIG. 16D is an explanatory diagram illustrating a method of manufacturing a display device according to a fifth embodiment.

FIG. 16F is an explanatory diagram illustrating a method of manufacturing a display device according to a fifth embodiment.

FIG. 20A is an explanatory diagram illustrating a method of manufacturing a display device according to a ninth embodiment.

FIG. 20B is an explanatory diagram illustrating a method of manufacturing a display device according to a ninth embodiment.

FIG. 20C is an explanatory diagram illustrating a method of manufacturing a display device according to a ninth embodiment.

FIG. 20D is an explanatory diagram illustrating a method of manufacturing a display device according to a ninth embodiment.

FIG. 20E is an explanatory diagram illustrating a method of manufacturing a display device according to a ninth embodiment.

FIG. 20F is an explanatory diagram illustrating a method of manufacturing a display device according to a ninth embodiment.

FIG. 20G is an explanatory diagram illustrating a method of manufacturing a display device according to a ninth embodiment.

FIG. 20L is an explanatory diagram illustrating a method of manufacturing a display device according to a ninth embodiment.

FIG. 22A is an explanatory diagram illustrating a method of opening an extraction electrode using laser processing and dry etching in combination.

FIG. 22B is an explanatory diagram illustrating a method of opening an extraction electrode using laser processing and dry etching in combination.

FIG. 22D is an explanatory diagram illustrating a method of opening an extraction electrode using laser processing and dry etching in combination.

FIG. 23B is an explanatory diagram illustrating a processing method for an opening of an extraction electrode in a case in which a second substrate with a small diameter is used.

FIG. 23C is an explanatory diagram illustrating a processing method for an opening of an extraction electrode in a case in which a second substrate with a small diameter is used.

FIG. 24B is an explanatory diagram illustrating a method of manufacturing a display device according to a tenth embodiment.

FIG. 24H is an explanatory diagram illustrating a method of manufacturing a display device according to a tenth embodiment.

FIG. 25 is a diagram illustrating a schematic configuration of a via-hole provided in the second substrate and configured such that a conductive material is embedded in a through-hole.

FIG. 27A is an explanatory diagram illustrating a method of manufacturing a display device according to an eleventh embodiment.

FIG. 27C is an explanatory diagram illustrating a method of manufacturing a display device according to an eleventh embodiment.

MODE(S) FOR CARRYING OUT THE INVENTION

Figure 1:
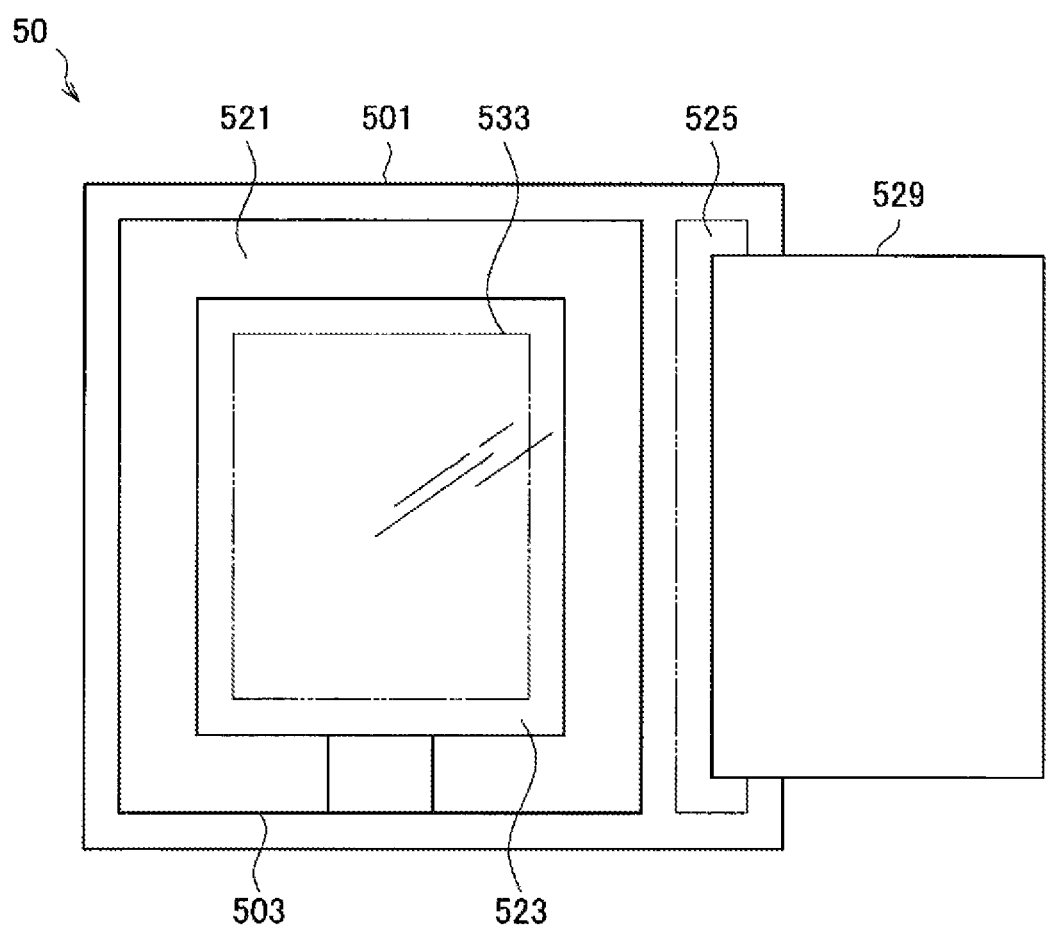
FIG. 1 is a top view illustrating a schematic configuration of a general display device of the related art.

Hereinafter, (a) preferred embodiment(s) of the present disclosure will be described in detail with reference to the appended drawings. Note that, in this specification and the appended drawings, structural elements that have substantially the same function and structure are denoted with the same reference numerals, and repeated explanation of these structural elements is omitted.

Note that the description will be made in the following order.
1. Background to present disclosure
2. First to fourth embodiments
2-1. First embodiment
2-1-1. Configuration of display device
2-1-2. Configuration of display module
2-1-3. Modification example
2-2. Second embodiment
2-3. Third embodiment
2-3-1. Configuration of display device
2-3-2. Configuration of display module
2-3-3. Modification example
2-4. Fourth embodiment
3. Fifth to eleventh embodiments
3-1. Fifth embodiment
3-2. Sixth embodiment
3-3. Seventh embodiment
3-4. Eighth embodiment
3-5. Ninth embodiment
3-5-1. Configuration of display device
3-5-2. Configuration of display module
3-5-3. Modification examples
3-5-3-1. Use of laser processing and dry etching in combination
3-5-3-2. Modification example in which second substrate with small diameter is used
3-6. Tenth embodiment
3-7. Eleventh embodiment
4. Supplement Note that in each embodiment to be described below, for example, a case in which a display device is an organic EL display will be described. However, the technology according to the present disclosure is not limited to this example. The technology according to the present disclosure can also be applied to another type of display device as long as the display device is a display device configured by bonding two substrates together.

In addition, in the present specification, a device in a so-called bare chip cut out from a wafer is referred to as a display device and a module in which a chip serving as a display device is mounted (that is, packaged) and modularized in a casing is referred to as a display module to distinguish the display device and the display module from each other.

In addition, in each embodiment to be described below, for example, a top surface light-emitting type of display device capable of performing full-color display will be described. However, the technology according to the present disclosure is not limited to this example. The technology according to the present disclosure can be applied to a bottom surface light-emitting type of display device or a monochromic display type of display device (that is, a display device in which no color filter (CF) is provided).

In addition, in each drawing to be described below, sizes of some constituent members can be expressed exaggeratedly in some cases for description. In each drawing, relative sizes of constituent members illustrated in the drawings do not necessarily accurately express size relations between actual constituent members.

1. Background to Present Disclosure

To further clarify the present disclosure before preferred embodiments of the present disclosure are described, the background on which the inventors conceived of the present disclosure and the like will be described.

Figure 2:
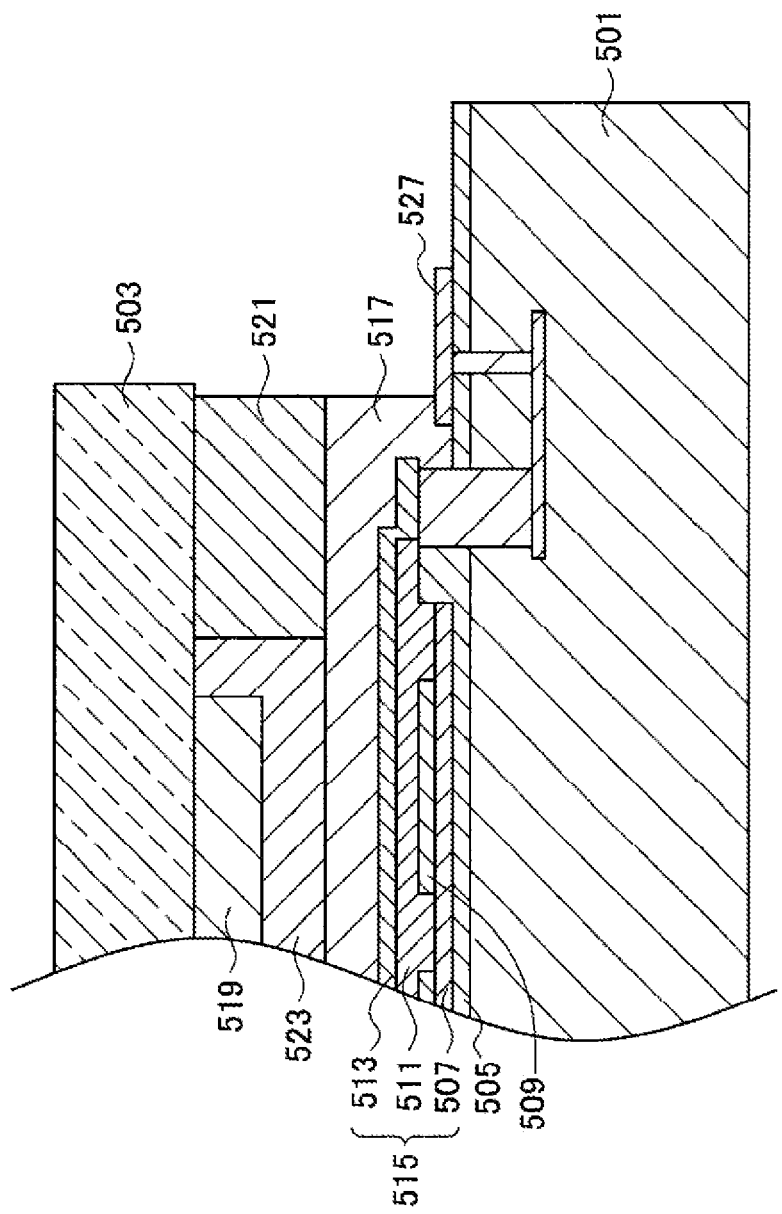
FIG. 2 is a sectional view illustrating a schematic configuration of the circumference of an I/O unit of the general display device of the related art.

A configuration of a generation display device of the related art, particularly, a configuration of an I/O unit, will be described with reference to FIGS. 1 and 2. FIG. 1 is a top view illustrating a schematic configuration of a general display device 50 of the related art. FIG. 2 is a sectional view illustrating a schematic configuration of the circumference of an I/O unit of the general display device 50 of the related art.

Referring to FIGS. 1 and 2, the general display device 50 of the related art is formed by bonding a first substrate 501 formed of a semiconductor such as Si to a second substrate 503 formed of a material that is transparent to visible light such as glass.

On the first substrate 501, a pixel region 533 in which a pixel array is provided is formed. Each pixel includes an organic EL element 515 which is a light-emitting element and a transistor (not illustrated) that drives the light-emitting element and the like.

As illustrated in FIG. 2, the organic EL element 515 is formed on the first substrate 501 via an insulation film 505 so that a first electrode 507 functioning as an anode, an organic layer 511, and a second electrode 513 functioning as a cathode are stacked in that order. More specifically, an insulation film 509 with an opening is stacked on the first electrode 507 so that at least a part of the first electrode 507 is exposed, and the organic layer 511 is provided to come into contact with the first electrode 507 exposed in a bottom portion of the opening. In this way, the organic EL element 515 has a configuration in which the first electrode 507, the organic layer 511, and the second electrode 513 are stacked in that order in the opening of the insulation film 509. The insulation film 509 functions as a pixel definition film that is provided between pixels and demarcates an area of the pixel. Further, a protective film 517 is stacked on the organic EL element 515.

A color filter layer 519 (CF layer 519) is formed on the second substrate 503. Although not illustrated in detail in FIG. 2, the CF layer 519 is formed so that a CF of each color (R, G, and B) with a predetermined area is provided in each organic EL element 515.

The display device 50 is formed by bonding the first substrate 501 in which the organic EL element 515 is formed on the second substrate 503 in which the CF layer 519 is formed via a sealing material 521. In this way, the display device 50 is a so-called counter CF type of display device. Specifically, the sealing material 521 is formed between the first substrate 501 and the second substrate 503 to surround the pixel region 533 in the chip surface. The sealing material 521 functions as an adhesive that bonds the first substrate 501 on the second substrate 503 and has a function of sealing the pixel region 533. In addition, a space including the pixel region 533 sealed by the sealing material 521 is filled with a sealing resin 523 in order to protect an organic material of the organic EL element 515 against water or the like.

Further, an I/O unit 525 including a signal electrode 527 or the like that exchanges a signal with the outside is provided on the first substrate 501. An FPC 529 is connected to the signal electrode 527 of the I/O unit 525, and the display device 50 and an external circuit are electrically connected via the FPC 529. As illustrated, the size of the second substrate 503 is adjusted so that the second substrate 503 has a smaller area than the first substrate 501, and the I/O unit 525 is generally provided in a region which is outside the sealing material 521 and that the second substrate 503 is not immediately above the sealing material 521 in consideration of the connection with the FPC 529.

The schematic configuration of the general display device 50 of the related art has been described above. Here, in order to increase the number of chips acquired per wafer and reduce manufacturing cost, a smaller chip area of the display device is generally requested. In response to this request, many technologies for reducing the chip area in the display device 50 of the related art have been proposed so far. For example, in the technology disclosed in the foregoing Patent Literature 1, a reduction in the chip area is achieved by contriving a layout of potential supply lines disposed immediately below the sealing member 521.

Here, as illustrated in FIGS. 1 and 2, the I/O unit 525 considerably contributes to the chip area. Accordingly, contriving the configuration of the I/O unit 525 is also considered to enable the reduction in the chip area. However, an achievement of a reduction in the chip area has not been sufficiently examined so far because the configuration of the I/O unit 525 in the display device has been focused on.

In view of the foregoing circumstances, the inventors and others have thoroughly examined the technology for reducing a chip area by contriving the configuration of the I/O unit 525 and have concluded the present disclosure. Hereinafter, preferred embodiments of the present disclosure concluded by the inventors and the like will be described.

2. First to Fourth Embodiments

First to fourth embodiments of the present disclosure will be described. In the display device 50 of the related art, as described above, the I/O unit 525 is provided outside the sealing material 521, that is, in the vicinity of the outer circumference of the chip in the chip surface in many cases. One reason for adopting this configuration, for example, is that it is necessary to protect the organic EL element 515 against heat applied at the time of connection of the I/O unit 525 and the FPC 529 because of the ACF connection. Specifically, in order to appropriately maintain characteristics of the organic EL element 515, it is generally considered unfavorable to apply a temperature higher than, for example, about 110° C. to the organic EL element 515. However, in the ACF connection, for example, a temperature of about 160° C. can be applied to the connection portion. Accordingly, in order to reduce an influence of the heat applied at the time of the AFC connection, the I/O unit 525 is provided in the vicinity of the outer circumference of the chip relatively distant from the organic EL element 515, that is, the pixel region 533, in the chip surface in many cases. In this way, in the display device 50, since it is necessary to provide the I/O unit 525 separately by a predetermined distance from the pixel region 533 due to a connection method for the FPC 529 in the I/O unit 525, there is a circumstance in which the chip area increases.

In addition, even when the I/O unit 525 is provided in the vicinity of the outer circumference of the chip, it is difficult to sufficiently suppress the influence of the heat applied at the time of the ACF connection on the organic EL element 515 in some cases. In these cases, in an AFC connection step, the pixel region 533 is locally cooled. This cooling has resulted in an increase in chip cost and process cost.

As described above, in the display device 50 of the related art, the increase in the chip area and the increase in the chip cost and the process cost occurred due to the connection method for the FPC 529 in the I/O unit 525. In view of these circumstances, the inventors and the like have thoroughly examined and devised a configuration of the I/O unit 525 and have obtained knowledge by which such a disadvantage can be overcome. The first to fourth embodiments of the present disclosure are based on this knowledge.

2-1. First Embodiment (2-1-1. Configuration of Display Device)

Figure 3A:
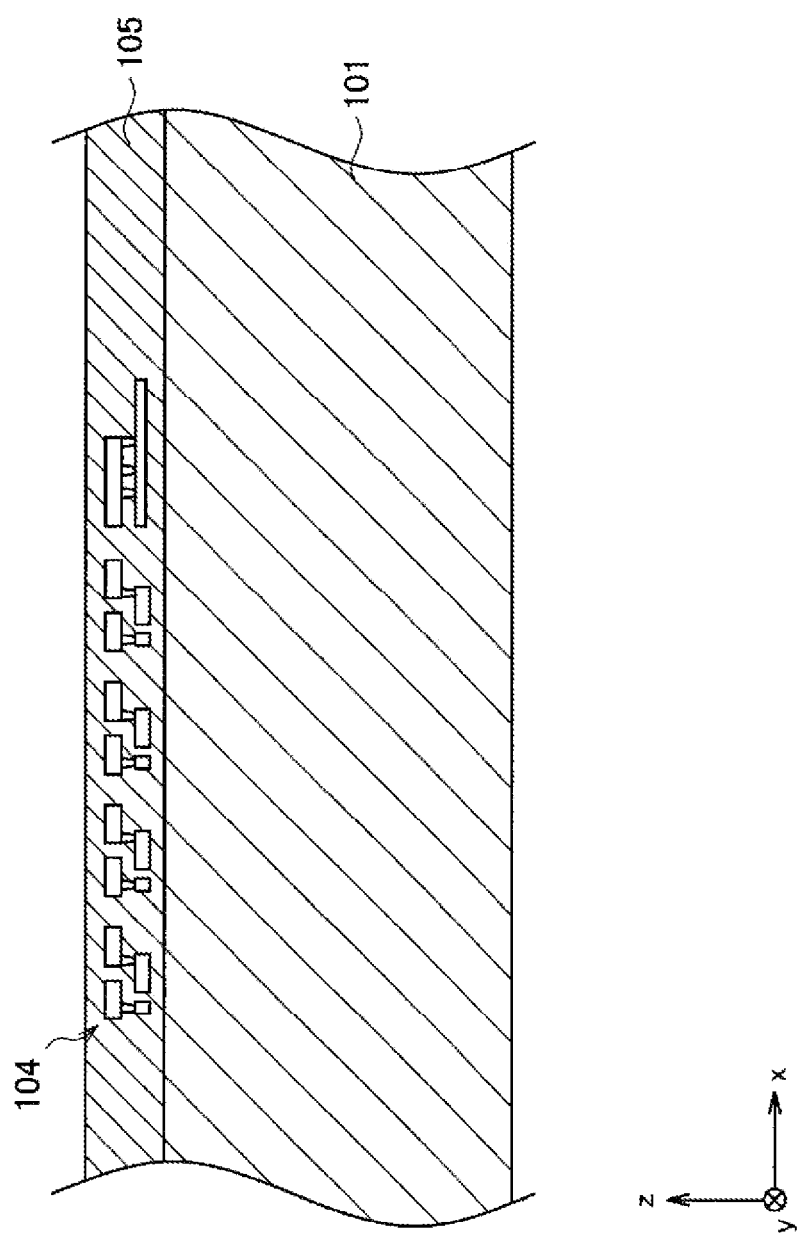
FIG. 3A is an explanatory diagram illustrating a method of manufacturing a display device according to a first embodiment.
Figure 3D:
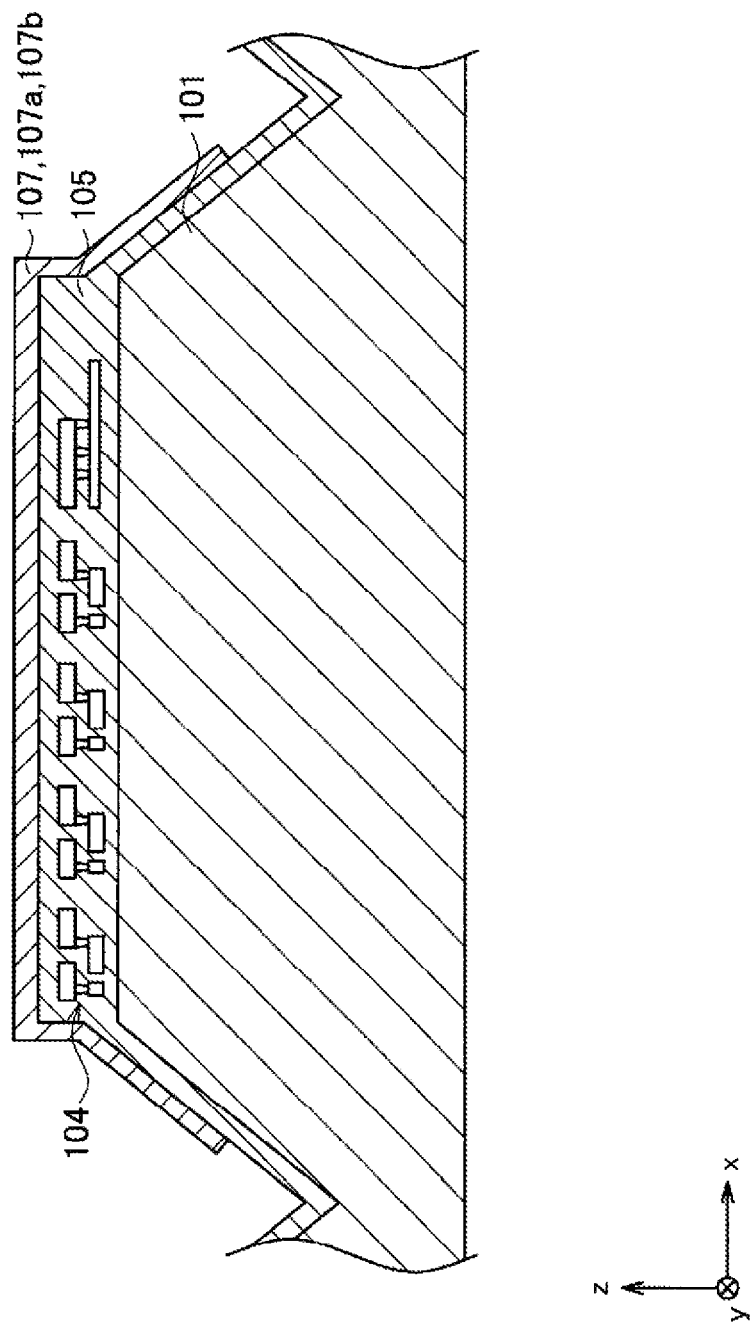
FIG. 3D is an explanatory diagram illustrating a method of manufacturing a display device according to a first embodiment.
Figure 3E:
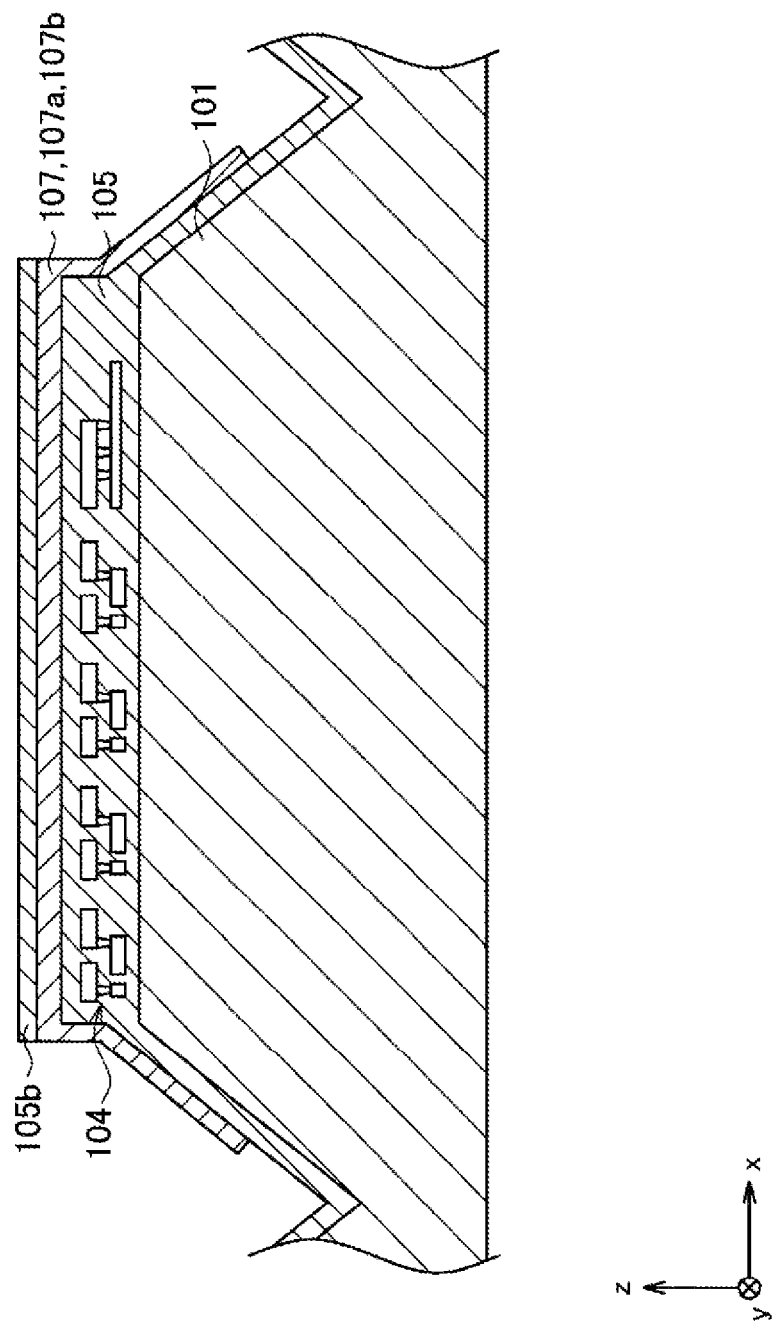
FIG. 3E is an explanatory diagram illustrating a method of manufacturing a display device according to a first embodiment.
Figure 3F:
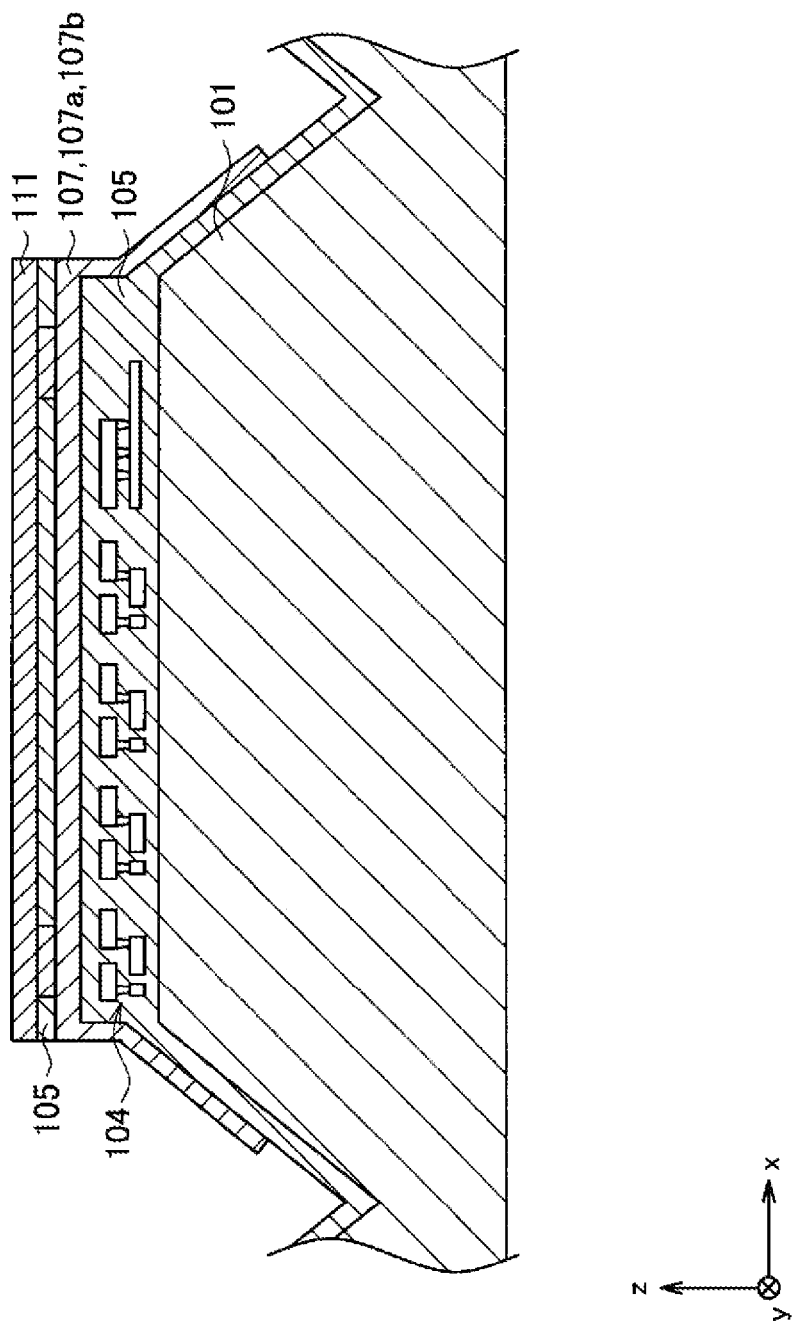
FIG. 3F is an explanatory diagram illustrating a method of manufacturing a display device according to a first embodiment.
Figure 3G:
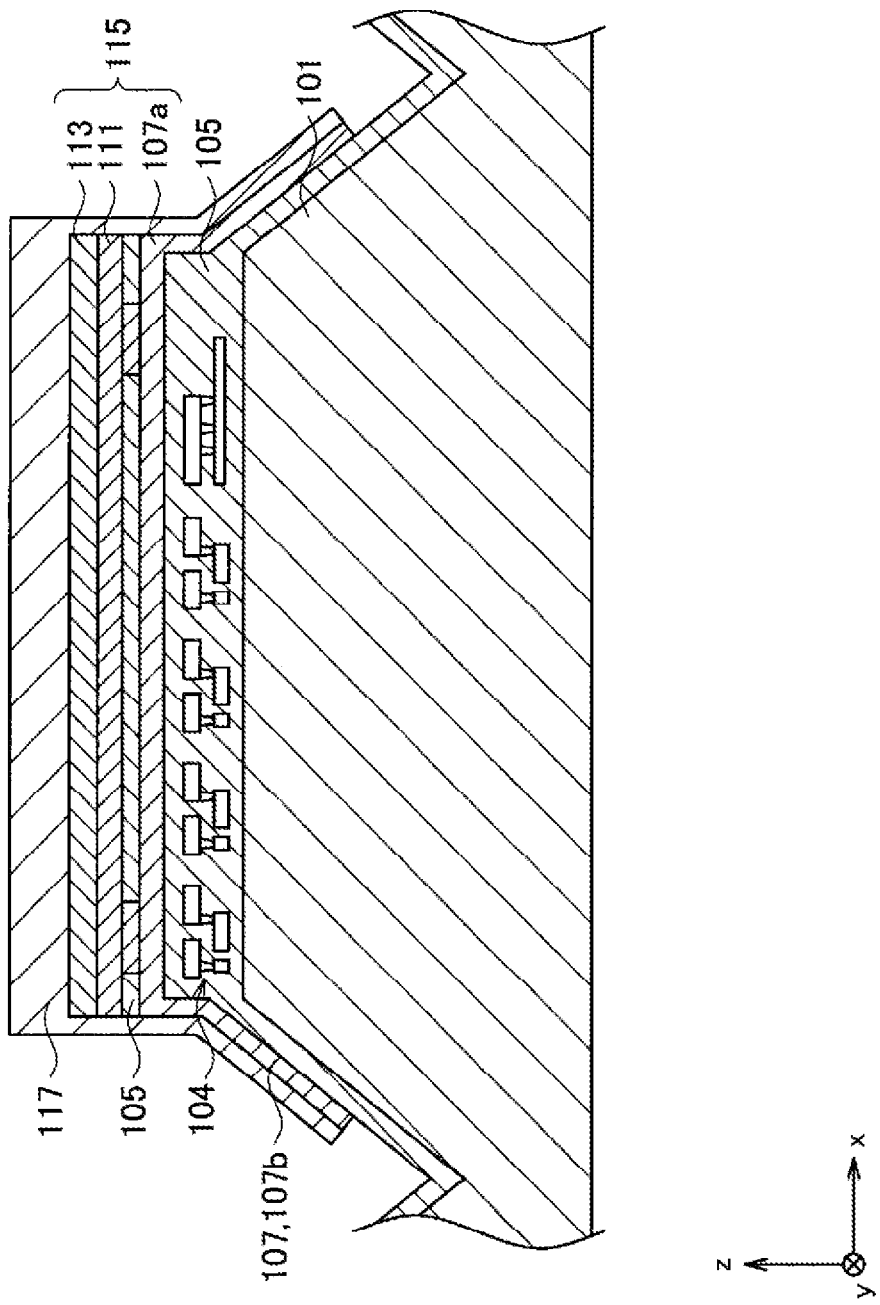
FIG. 3G is an explanatory diagram illustrating a method of manufacturing a display device according to a first embodiment.
Figure 3I:
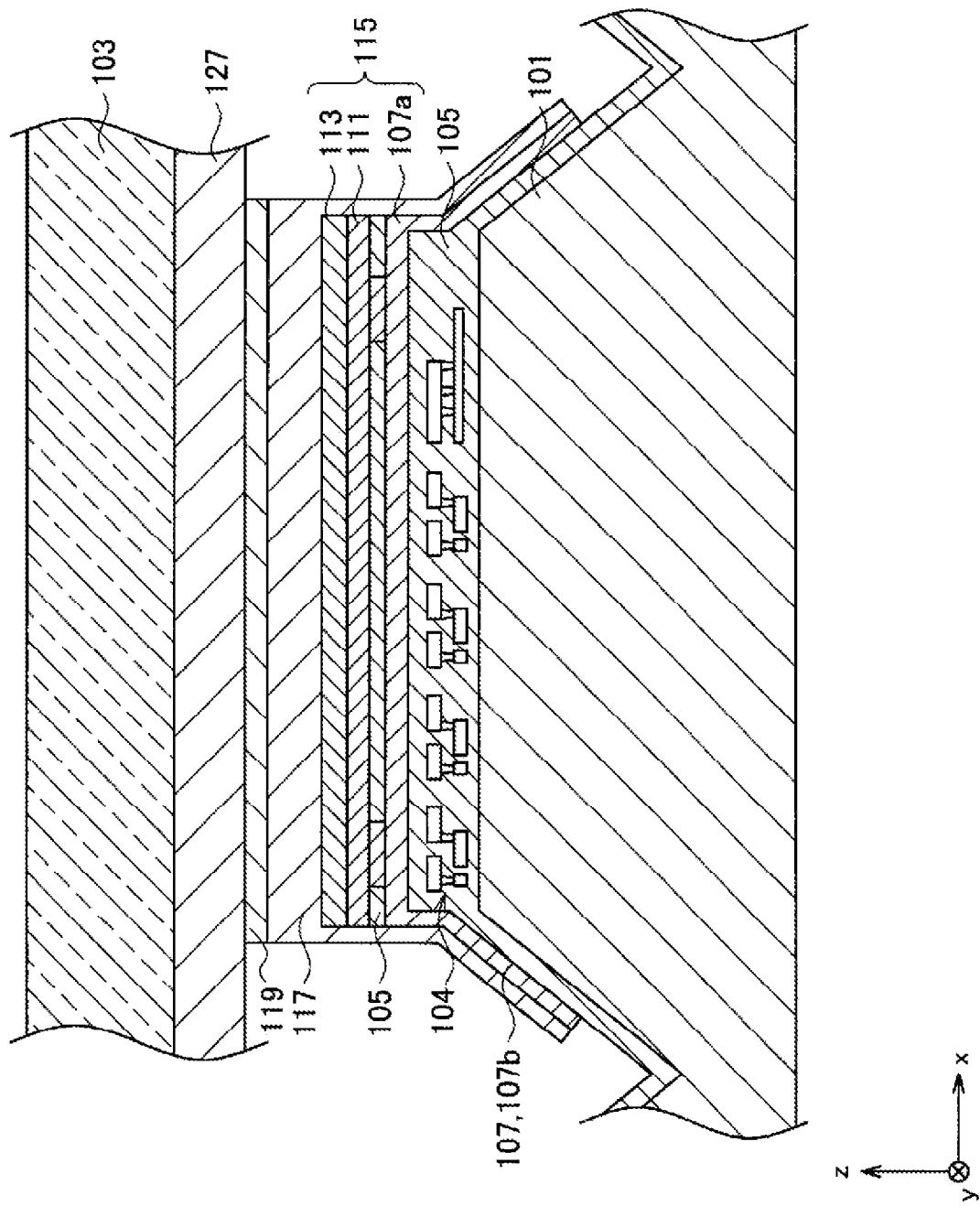
FIG. 3I is an explanatory diagram illustrating a method of manufacturing a display device according to a first embodiment.
Figure 3J:
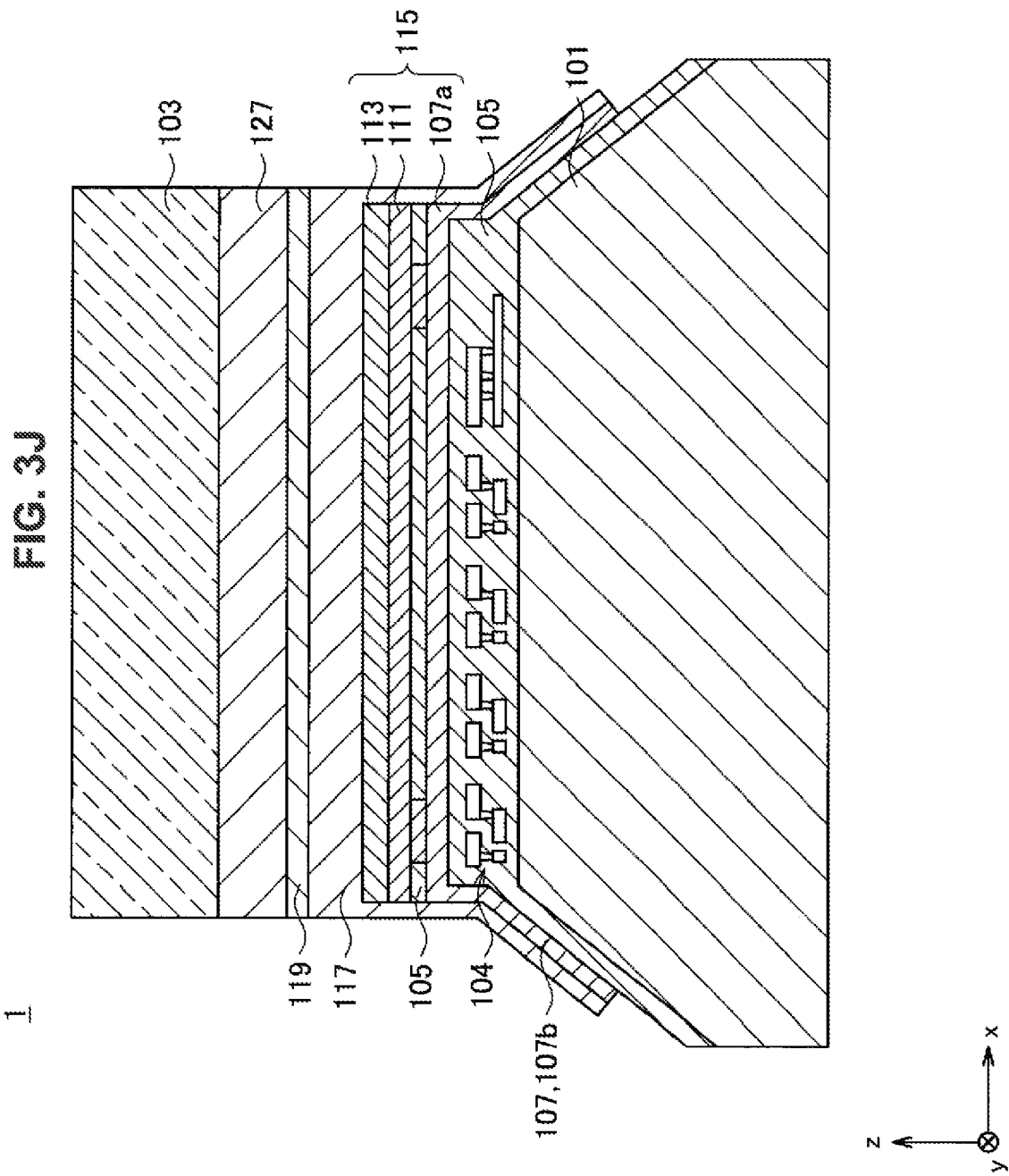
FIG. 3J is an explanatory diagram illustrating a method of manufacturing a display device according to a first embodiment.
Figure 91:
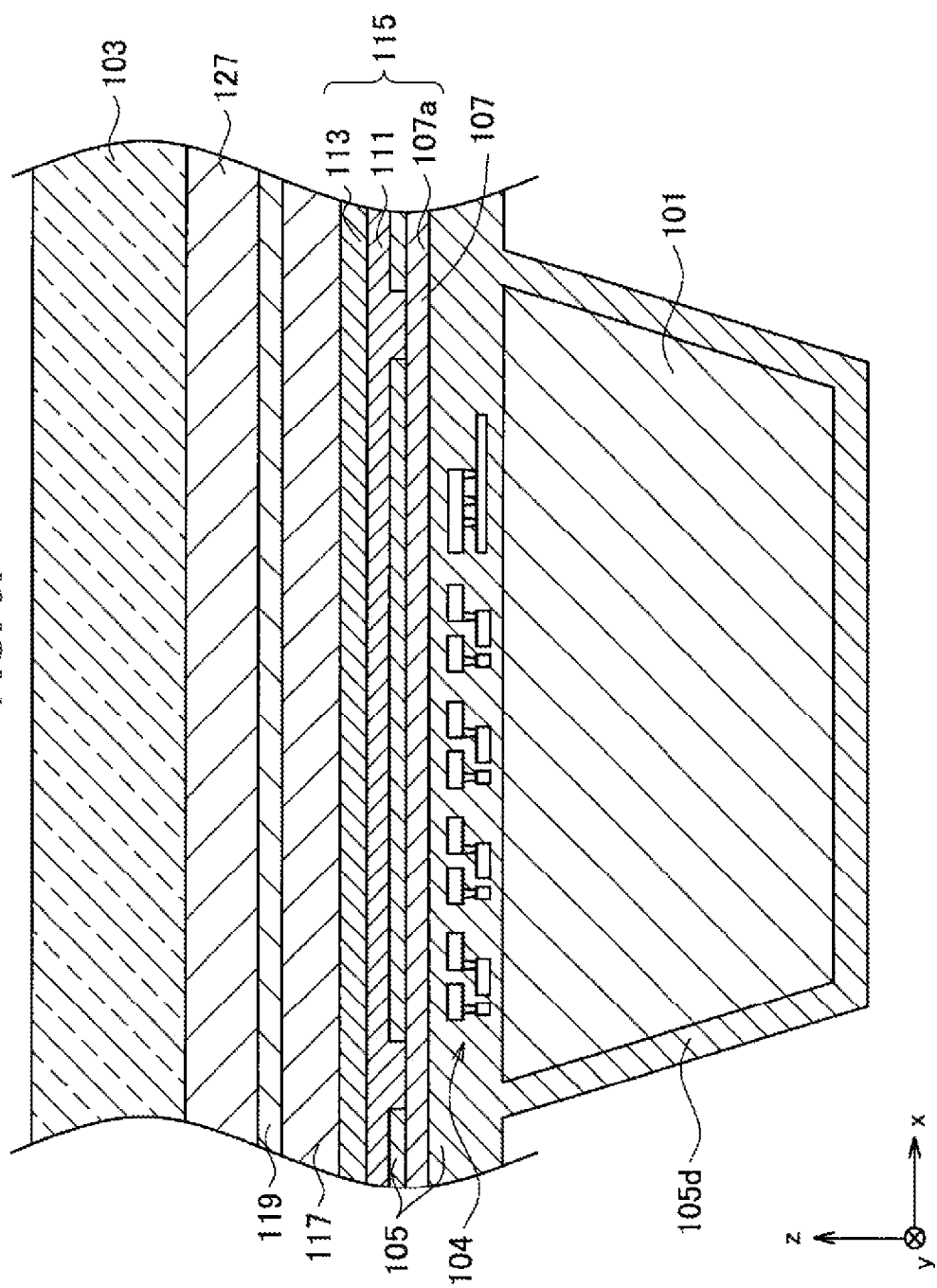

Referring to FIGS. 3A to 3J, a method of manufacturing a display device 1 according to the first embodiment will be described and a configuration of the display device 1 will be described. FIGS. 3A to 3J are explanatory diagrams illustrating the method of manufacturing the display device 1 according to the first embodiment. FIGS. 3A to 3J schematically illustrate cross sections parallel in a stacking direction (vertical direction) of the display device 1 in the order of steps in the method of manufacturing the display device 1 and illustrate a process flow of the manufacturing method. In FIGS. 3A to 3J, portions corresponding to one display device 1 in a wafer are extracted and illustrated. FIG. 3J illustrates the cross section of one diced and segmented display device 1.

Here, in the first embodiment, the display device 1 is configured as a chip of which a planar shape is a rectangular shape. FIGS. 3A to 3J illustrate sectional views of cross sections parallel to a certain side of the rectangular shape. In FIGS. 3A to 3I illustrating the sectional views in a wafer state, in practice, structures similar to structures described with reference to FIGS. 3A to 3I are also continuously formed in depth directions on paper.

In addition, in the following description, a stacking direction of the layers in the display device 1 is also referred to as a z axis direction. In addition, two directions orthogonal to the z axis direction are an x axis direction and a y axis direction. Further, the x axis direction and the y axis direction are respectively a direction parallel to a direction parallel to one side of the chip of the display device 1 and a direction parallel to another side orthogonal to the one side. For example, FIGS. 3A to 3J illustrate sectional views on the x-z plane of the display device 1.

In the method of manufacturing the display device 1, circuits (for example, a driving circuit and the like) processing various signals related to an organic EL element 115 to be described below and transistors (so-called thin film transistors (TFTs) and the like) are first formed on a first substrate 101 (see FIG. 3A). In FIG. 3A, wiring layers 104 formed in an insulation film 105 are illustrated simulatively to express the circuits and the transistors. Circuits and transistors with various known configurations may be used as the circuits and the transistors. Therefore, specific description of configurations or forming methods will be omitted.

The first substrate 101 is, for example, a Si substrate. However, the first embodiment is not limited to the example and a substrate formed of any of various known materials used as a substrate in which a light-emitting element is formed in a general organic EL display can be applied as the first substrate 101. In addition, a material of the insulation film 105 is not limited. For example, the insulation film 105 may be formed of any of various insulation materials used in general semiconductor processes, such as $SiO_2$, SiON, SiO, or SiN. As a method of forming the insulation film 105, for example, any of various methods used to form insulation films in general semiconductor processes, such as a chemical vapor deposition (CVD) method, may also be used.

Subsequently, a region corresponding to a scribe line or an outer circumference of the chip in the first substrate 101 and the insulation film 105 (that is, a region between the mutually adjacent display devices 1) is etched by dry etching (see FIG. 3B). In the dry etching, as illustrated in FIG. 3B, in the etching region, the insulation film 105 is completely removed and the first substrate 101 is etched so that the front surface of the first substrate 101 has a tapered shape in which the thickness of the first substrate 101 is gradually thinned toward the outer circumference of the chip. Note that a specific method of the dry etching is not limited. Any method may be applied as long as the foregoing processing of the first substrate 101 and the insulation film 105 is possible. For example, reactive ion etching (RIE), deep RIE (DRIE), inductive coupled plasma-RIE (ICP-RIE), or the like can be used as the dry etching.

In the following description, a region with a tapered shape of the front surface of the first substrate 101 obtained by the etching is referred to as a tapered region and the other region is referred to as a flat region.

Subsequently, an insulation film 105a is formed as a film by forming an insulation material on the flat region and the tapered region (see FIG. 3C). At this time, the insulation film 105a can be formed to cover at least the tapered region. The insulation film 105a can be formed of the same material as the above-described insulation film in accordance with the same method. Note that in the description of the subsequent method of manufacturing the display device 1, in order to avoid complex description, both the insulation film 105 and the insulation film 105a are referred to as the insulation film 105 in a case in which it is not particularly necessary to distinguish the insulation film 105 and the insulation film 105a from each other. In addition, to correspond to this, only reference numeral "105" generally denoting the insulation films is affixed to the insulation film 105 and the insulation film 105a in the subsequent FIGS. 3D to 3J.

Subsequently, a wiring layer 107 is formed by forming a conductive material as a film on the flat region and the tapered region and subsequently patterning the conductive material in a predetermined shape (see FIG. 3D; the patterning is not illustrated in FIG. 3D). In the wiring layer 107, first electrodes 107a functioning as anodes in the organic EL elements 115, driving wirings for driving the organic EL elements 115, signal electrodes 107b exchanging predetermined signals related to the organic EL elements 115 with the outside, lead-out wirings for transmitting the predetermined signals related to the organic EL elements 115 to the signal electrodes 107b, and the like are formed.

Of the electrodes and the wirings, the first electrodes 107a, the driving wirings, and the lead-out wirings are formed at respective positions corresponding to the flat region. For example, each first electrode 107a is formed at a position corresponding to a pixel in a pixel region since the first electrode 107a is included in the organic EL element 115. Since the layout of the first electrodes 107a, the driving wirings, and the lead-out wirings may be a general layout, the detailed description thereof will be omitted.

On the other hand, the signal electrodes 107b are formed in the tapered region. The number of signal electrodes 107b necessary to exchange a signal with the outside can be formed in accordance with a circuit configuration or the like of the display device 1. Here, in the first embodiment, the signal electrodes 107b are formed only on one pair of sides between two pairs of sides facing each other in the chip of the display device 1 with the rectangular shape. In the illustrated configuration example, the signal electrodes 107b are formed only on the two sides orthogonal to the x axis direction (the two sides in the horizontal direction of the page).

Note that although not illustrated in detail, a step of providing a contact hole in the insulation film 105 is performed before the wiring layer 107 is formed. Because of the contact hole, the first electrode 107a, the driving wiring, the signal electrode 107b, the lead-out wiring, and the like formed in the wiring layer 107 are electrically connected to corresponding wirings of the wiring layer 104 of a lower layer. Since the contact hole may be formed in accordance with any of various known methods, the detailed description thereof will be omitted.

A material of the wiring layer 107 is not limited. For example, the wiring layer 107 may be formed of any of various wiring materials used in general semiconductor processes, such as Al, TiN, TiON, AlCu, or ALSiCu. As a method of forming the wiring layer 107, any of various methods used to form wiring layers in general semiconductor processes may also be used. For example, a sputtering method or the like can be used as a method of forming the wiring layer 107 as a film. In addition, for example, the patterning of the wiring layer 107 can be performed using a known photolithography technology and etching technology.

Subsequently, the insulation film 105b is formed in the flat region by forming an insulation material as a film on the flat region and the tapered region and subsequently removing the insulation film in the tapered region (see FIG. 3E). The insulation film 105b is formed of the same material as the above-described insulation film 105. In addition, the insulation film 105b can be formed, for example, by forming an insulation film in accordance with, for example, any of various methods used to form insulation films in general semiconductor processes, such as a CVD method, and subsequently patterning the insulation film using a known photolithography technology and etching technology. Note that in the description of the subsequent manufacturing method, in order to avoid complex description, the insulation film 105, the insulation film 105a, and the insulation film 105b are referred to as the insulation film 105 in a case in which it is not particularly necessary to distinguish the insulation film 105, the insulation film 105a, and the insulation film 105b from each other. In addition, to correspond to this, only reference numeral "105" generally denoting the insulation films is affixed to the insulation film 105, the insulation film 105a, and the insulation film 105b in the subsequent FIGS. 3F to 3J.

Subsequently, an organic layer 111 is formed in the flat region by forming an opening at a position corresponding to a portion immediately above the first electrode 107a of the insulation film 105, subsequently forming an organic material as a film on the flat region and the tapered region, and removing the organic material of the tapered region (see FIG. 3F). Although not illustrated in detail, at this time, the organic layer 111 is appropriately patterned to correspond to each pixel in the flat region. As a material of the organic layer 111, any of various known materials generally used as a light-emitting layer of an organic EL element can be applied. In addition, as a method of forming the organic layer 111, for example, any of various known methods generally used when an organic EL element is formed, such as a vacuum evaporation method, can be applied.

Subsequently, a wiring layer 113 is formed by forming a conductive material as a film on the flat region and the tapered region and subsequently removing the conductive material of the tapered region. At this time, the wiring layer 113 is also appropriately patterned in the flat region. Further, a protective film 117 is formed on the flat region and the tapered region (see FIG. 3G).

The wiring layer 113 corresponds to a second electrode 113 that functions as a cathode in the organic EL element 115. Since the display device 1 is a top surface light-emitting type of display device, the second electrode 113 can be formed of a material with high transmittance through which light from the organic EL element 115 can suitably passes. For example, the second electrode 113 is formed of any of various known materials, such as ITO or IZO, generally used as a transparent electrode of an organic EL element. In addition, as a method of forming the second electrode 113, any of various methods generally used to form the transparent electrode of the organic EL element may also be applied. For example, as in the wiring layer 107, the second electrode 113 can be formed by forming a material as a film with a predetermined thickness in accordance with a sputtering method or the like and subsequently patterning the film by a known photolithography technology and etching technology.

In the opening of the insulation film 105, the organic EL element 115 is formed by stacking the first electrode 107a, the organic layer 111, and the second electrode 113 in this order. The insulation film 105 on the first electrode 107a functions as a pixel definition film that is provided between the pixels and demarcates an area of the pixel.

The protective film 117 is provided to cover the second electrode 113 in the flat region. In the tapered region, on the other hand, the protective film 117 is patterned to expose the signal electrode 107b. Note that the protective film 117 in the tapered region may not be patterned and may be removed.

A material of the protective film 117 is not limited. The protective film 117 may be formed of any of various materials, such as SiN, $Al_2O_3$/TiO, or SiON, used as protective films in general organic EL displays. As a method of forming the protective film 117, any of various methods used to form protective films in the general organic EL displays may also be applied. For example, a CVD method or the like can be used as a method of forming the protective film 117. In addition, for example, the protective film 117 can be patterned using a known photolithography technology and etching technology.

Subsequently, a CF layer 119 is formed in the flat region (see FIG. 3H). Although not illustrated in detail, the CF layer 119 is formed so that a CF of each color (R, G, and B) with a predetermined area is provided in each organic EL element 115 provided in each pixel. One pixel is formed by combining one organic EL element 115 and one CF. In this way, the display device 1 is a so-called on-chip color filter (OCCF) type of display device in which the CF layer 119 is formed on the first substrate 101 in which the organic EL elements 115 are formed. However, the first embodiment is not limited to this example and the display device 1 may be a counter CF type of display device.

The CF layer 119 can be formed, for example, by exposing and developing a resist material in a predetermined shape by a photolithography technology. Besides, any of various known materials and methods may be used as a material of the CF layer 119 and a method of forming the CF layer 119.

Subsequently, the second substrate 103 is bonded to the first substrate 101 via the bonding material resin material 127 (see FIG. 3I). The bonding material resin material 127 is a resin-based material that has a function of an adhesive. A material of the bonding material resin material 127 is not limited and any of various known materials may be used. Note that, in the present specification, members such as the bonding material resin material 127 and a sealing material 121 illustrated in FIG. 16 and the like to be described below are generally named as bonding materials functioning as adhesives when the first substrate 101 and the second substrate 103 are bonded together.

Here, the display device 1 is a top surface light-emitting type of display device. Accordingly, as the bonding material resin material 127 and the second substrate 103, a material with high transmittance through which light from the organic EL element 115 can suitably pass is used. For example, the second substrate 103 is a quartz glass substrate. However, the first embodiment is not limited to this example. As the second substrate 103, a substrate of any of various known materials used as a light exit side substrate in a general organic EL display can be applied.

Finally, the segmented display device 1 is fabricated by performing dicing (see FIG. 3J). Note that, at the time of the dicing, a position corresponding to a boundary between the flat region and the tapered region is cut in the second substrate 103 and an outer edge of the tapered region corresponding to a boundary between mutually adjacent chips is cut in the first substrate 101. Thus, as illustrated, in the display device 1, the second substrate 103 is not immediately above the signal electrode 107b formed in the tapered region. That is, the signal electrode 107b is exposed in an immediately upper direction and the in-plane direction.

FIG. 4 is a diagram illustrating an aspect when a tapered region of the segmented display device 1 illustrated in FIG. 3J is viewed laterally (the x axis direction). As illustrated in FIG. 4, the plurality of signal electrodes 107b are arranged in the tapered region of the display device 1. In the illustrated example, the rectangular signal electrodes 107b are arranged side by side at the same pitch in a direction parallel to the y axis direction. The pitch is, for example, about 200 to 300 μm. However, the first embodiment is not limited to this example. The shape of the signal electrodes 107b, the number of disposed signal electrodes 107b, the positions of the disposed signal electrodes 107b, and the like may be appropriately decided in accordance with a circuit configuration or the like of the display device 1 so that a desired signal can be exchanged with the outside.

The method of manufacturing the display device 1 according to the first embodiment has been described above. By fabricating the display device in accordance with the above-described manufacturing method, the display device 1 has a configuration in which the signal electrodes 107b are disposed in a partial region of the side surface of the chip. Hereinafter, a region in which the signal electrodes 107b are disposed is also referred to as an electrode disposition region. In the display device 1, the electrode disposition region corresponds to the tapered region.

Here, in a display device of the related art such as the above-described display device 50, the signal electrodes 527 are provided on the upper surface of a chip. In the display device 1, however, as described above, the electrode disposition region is provided not on the upper surface of the chip but on the side surface. Accordingly, in the display device 1, a chip area can be further reduced than in the display device of the related art. Accordingly, it is possible to increase the number of chips acquired per wafer, and thus it is possible to realize a reduction in manufacturing cost.

In addition, as will be described below in description of a configuration of a display module, in the first embodiment, the signal electrodes 107b and an FPC of the display device 1 can be connected without performing a process of applying heat by providing the electrode disposition region, as described above. Accordingly, since it is not necessary to display the electrode disposition region away from the pixel region in consideration of delivery of heat, it is possible to further reduce the chip area.

Note that, as illustrated in FIG. 3K, in the display device 1, the electrode disposition region has the tapered shape in which the area of the cross section parallel to the in-plane direction of the substrate gradually increases from the upper surface to the lower surface, but the technology according to the present disclosure is not limited to this example. In the technology according to the present disclosure, the electrode disposition region may be provided in a part of a side surface of the chip or any position or any shape of the electrode disposition region may be used. For example, the electrode disposition region of the display device may have a tapered shape in which the area of the cross section parallel to the in-plane direction of the substrate gradually decreases from the upper surface to the lower surface (the configuration of the display device having such a configuration will be described in the following (2-3. Third embodiment)). Alternatively, the electrode disposition region may be formed so that the electrode disposition region has a surface substantially parallel to the z axis direction.

(2-1-2. Configuration of Display Module)

Referring to FIG. 5, a configuration of a display module 31 according to the first embodiment will be described. FIG. 5 is a diagram illustrating a schematic configuration of the display module 31 according to the first embodiment.

FIG. 5 is an exploded side view illustrating a display module 31 (the display device 1 is simulatively illustrated as a sectional view similar to FIG. 3J to clarify a positional relation between the signal electrode 107b and a module casing 21). As illustrated in FIG. 5, the display module 31 is configured such that the display device 1 is stored in the module casing 21.

The module casing 21 is configured such that the signal electrode 203 electrically connected to the signal electrode 107b of the display device 1 is provided in a casing body 201. The casing body 201 includes a top plate that has a rectangular shape and a side wall extending from four sides of the top plate in a direction vertical to the top plate. In addition, the signal electrode 203 is electrically connected to the top plate of the module casing 21 and an FPC 205 extending toward the outside is connected to the top plate.

As illustrated, the upper surface which is a display surface of the display device 1 is inserted from a downward opening of the casing body 201 in a direction facing the inner surface of the top plate of the casing body 201 so that the display device 1 is stored inside the module casing 21. Although not clearly illustrated in FIG. 5, an opening corresponding to the pixel region of the display device 1 is provided in the middle of the top plate of the casing body 201. When the display device 1 is stored in the module casing 21, the pixel region of the display device 1 is exposed from the opening.

The stored display device 1 is solidified in the module casing 21 by a latch or the like (not illustrated). This fixing means is not particularly limited and any configuration of the latch may be used.

The signal electrode 203 is provided on an inner surface of the side wall corresponding to the side on which the signal electrode 107b is disposed among the four sides of the chip of the display device 1 in the side wall of the casing body 201 to face the signal electrode 107b. Hereinafter, the signal electrode 107b of the display device 1 is also referred to as a device-side signal electrode 107b and the signal electrode 203 provided in the module casing 21 is also referred to as a casing-side signal electrode 203 to distinguish these electrodes from each other. As illustrated, the casing-side signal electrode 203 has a plate spring shape and is configured to be elastically deformable with respect to the side wall of the casing body 201. One end of the FPC 205 extending toward the outside is connected to the top plate of the casing body 201. The casing-side signal electrode 203 and the FPC 205 are electrically connected by a wiring (not illustrated) provided on the wall surface of the casing body 201.

A spot in which the casing-side signal electrode 203 on the side wall of the casing body 201 is provided is configured to have a surface substantially parallel to the tapered shape of the electrode disposition region of the display device 1. In addition, the disposition positions and the number of casing-side signal electrodes 203 are adjusted to correspond to the disposition positions and the number of device-side signal electrodes 107b of the display device 1. Accordingly, when the display device 1 is stored in the module casing 21, as described above, the device-side signal electrode 107b and the casing-side signal electrode 203 come into contact with each other so that both the device-side signal electrode 107b and the casing-side signal electrode 203 are electrically connected. Here, in a case in which the display device 1 is stored and fixed to the module casing 21, shapes of the casing-side signal electrode 203 and the side wall of the casing body 201 are appropriately adjusted so that the device-side signal electrodes 107b are pressed on the casing-side signal electrodes 203 with a predetermined pressing force to the degree that at least the casing-side signal electrodes 203 with the plate spring shape can be deformed. Thus, both the device-side signal electrodes 107b and casing-side signal electrodes 203 can be reliably conducted.

The configuration of the display module 31 according to the first embodiment has been described above. As described above, according to the first embodiment, the display module 21 is configured such that the display device 1 is stored in the module casing 21. The casing-side signal electrode 203 is provided at the position facing the device-side signal electrode 107b of the display device 1 in the module casing 21. Accordingly, by storing the display device 1 in the module casing 21, it is possible to electrically connect the device-side signal electrode 107b to the casing-side signal electrode 203 by the pressing force when the display device 1 is stored in the module casing 21, and it is possible to extract a signal of the device-side signal electrode 107b to the outside via the FPC 205. In this way, according to the first embodiment, since the signal of the device-side signal electrode 107b can be extracted to the outside without performing a process of applying heat, it is possible to achieve a more reduction in the chip area. Further, since the casing-side signal electrode 203 has the plate spring shape, it is possible to electrically connect the device-side signal electrode 107b to the casing-side signal electrode 203 more reliably. Note that in the above-described configuration example, the device-side signal electrodes 107b are formed on only two surfaces facing each other in the side surface of the chip of the display device 1 that has the rectangular shape. Accordingly, the casing-side signal electrodes 203 are formed on two side walls facing each other in the side walls of the casing body 201, but the first embodiment is not limited to this example. When the device-side signal electrodes 107b are disposed on the side surface of the display device 1, the device-side signal electrodes 107b may be disposed at any positions. For example, the device-side signal electrodes 107b may be disposed on only one surface among side surfaces of the display device 1, may be disposed on three surfaces, or may be disposed on all the four surfaces. In addition, the disposition positions of the casing-side signal electrodes 203 in the module casing 21 may be appropriately changed in accordance with the disposition positions of the device-side signal electrodes 107b.

(2-1-3. Modification Example)

As a modification example of the first embodiment, a modification example in which the shapes of the casing-side signal electrodes 203 of the above-described module casing 21 are different will be described. Note that the display module according to the modification example is similar to the display module 31 according to the above-described first embodiment other than the fact that the shapes of the casing-side signal electrodes 203 are different. Accordingly, in the description of the following modification example, different factors from the display module 31 will be mainly described. The detailed description of the repeated factors will be omitted.

FIG. 6 is a diagram illustrating a schematic configuration of the display module 32 according to a modification example of the first embodiment. FIG. 6 illustrates an exploded side view of the display module 32 (the display device 1 is simulatively illustrated as a sectional view similar to FIG. 3J to clarify a position relation between the signal electrodes 107b and the module casings 22). As illustrated in FIG. 6, the display module 32 is configured such that the display device 1 is stored in the module casing 22.

The module casing 22 is configured such that the casing-side signal electrodes 207 are provided in the casing body 201. The configuration of the casing body 201 is similar to the casing body 201 of the display module 31 illustrated in FIG. 5.

In the modification example, the casing-side signal electrodes 207 are configured as electrodes that have a ball shape. When the display device 1 is stored in the module casing 22 as in the above-described display module 31, the device-side signal electrode 107b and the casing-side signal electrode 207 with the ball shape come into contact with each other so that both the device-side signal electrode 107b and the casing-side signal electrode 207 are electrically connected. Here, in a case in which the display device 1 is stored in the module casing 22, the shapes of the casing-side signal electrode 207 and the side wall of the casing body 201 are appropriately adjusted so that the device-side signal electrode 107b is pressed on the casing-side signal electrode 207 with a predetermined pressure. Thus, conduction of both the casing-side signal electrode 207 and the device-side signal electrode 107b can be reliably conducted.

In this way, in the display module 32 configured such that the casing-side signal electrode 207 has the ball shape, it is also possible to obtain advantageous effects similar to those of the above-described display module 31, that is, it is possible to connect the device-side signal electrode 107b to the FPC 205 without applying heat. Note that the casing-side signal electrode 207 may be provided to be fixed to the inner wall surface of the casing body 201 or may be configured to be elastically movable in a direction vertical to the inner wall surface of the casing body 201. By configuring the casing-side signal electrode 207 to be elastically movable, it is possible to further ensure the electrical connection between both the device-side signal electrode 107b and the casing-side signal electrode 207 because of an elastic restoring force of the casing-side signal electrode 207 when the device-side signal electrode 107b is pressed on the casing-side signal electrode 207.

FIG. 7 is a diagram illustrating a schematic configuration of the display module 33 according to another modification example of the first embodiment. FIG. 7 illustrates an exploded side view of the display module 33 (the display device 1 is simulatively illustrated as a sectional view similar to FIG. 3J to clarify a position relation between the signal electrodes 107b and the module casings 23). As illustrated in FIG. 7, the display module 33 is configured such that the display device 1 is stored in the module casing 23.

The module casing 23 is configured such that the casing-side signal electrodes 209 are provided in the casing body 201. The configuration of the casing body 201 is similar to the casing body 201 of the display module 31 illustrated in FIG. 5.

In the modification example, the casing-side signal electrode 209 is configured as an electrode that has a plate shape. When the display device 1 is stored in the module casing 23 as in the above-described display module 31, the device-side signal electrode 107b comes into contact with the casing-side signal electrode 209 that has the plate shape to be electrically connection. Here, in a case in which the display device 1 is stored in the module casing 23, the device-side signal electrode 107b is pressed on the casing-side signal electrode 209 with a predetermined pressure, and thus the shapes of the casing-side signal electrode 209 and the side wall of the casing body 201 are appropriately adjusted so that both the device-side signal electrode 107b and the casing-side signal electrode 209 can be come into contact with each other in a so-called fastening state. Thus, conduction of both the casing-side signal electrode 209 and the device-side signal electrode 107b can be reliably conducted.

In this way, in the display module 33 configured such that the casing-side signal electrode 209 has a plate shape, it is also possible to obtain advantageous effects similar to those of the above-described display module 31, that is, it is possible to connect the device-side signal electrode 107b to the FPC 205 without applying heat. In addition, according to the modification example, since the shape of the casing-side signal electrode 209 is simple, the module casing 23 can be fabricated at lower cost. Therefore, it is possible to expect the advantageous effect of further reducing the manufacturing cost.

2-2. Second Embodiment

Referring to FIG. 8, a configuration of a display device 2 according to the second embodiment will be described. FIG. 8 is a diagram illustrating a schematic configuration of the display device 2 according to the second embodiment. FIG. 8 illustrates a sectional view on the x-z plane of the display device 2 as in FIGS. 3A to 3J.

Referring to FIG. 8, the display device 2 corresponds to a display device in which the bonding material resin material 127 and the second substrate 103 are not provided in the display device 1 illustrated in FIG. 3J according to the first embodiment. In this way, in the present disclosure, the display device 2 in which the second substrate 103 is not provided may be supplied.

Note that other factors of the display device 2 are the same as those of the display device 1 except that the bonding material resin material 127 and the second substrate 103 are not provided. Therefore, the detailed description of the configuration of the display device 2 and the method of manufacturing the display device 2 will be omitted herein. For example, the method of manufacturing the display device 2 is the same as the method of manufacturing the display device 1 except that dicing is performed without bonding the second substrate 103.

In addition, in the display device 2, a display module can be configured by storing the display device 2 in module casings 21, 22, or 23 as in the display device 1. Since the configuration of the display module is the same as the display modules 31, 32, and 33 according to the first embodiment except that the configuration of the display device 2 is different, the repeated description will be omitted.

The configuration of the display device 2 according to the second embodiment has been described above. In the display device 2 that has the above-described configuration, it is also possible to obtain the advantageous effect of reducing the chip area as in the first embodiment. In addition, in the display module according to the second embodiment, it is also possible to obtain the advantageous effect that the display device 2 can be connected to the FPC 205 without applying heat as in the display modules 31, 32, and 33 according to the first embodiment.

2-3. Third Embodiment (2-3-1. Configuration of Display Device)

Figure 9J:
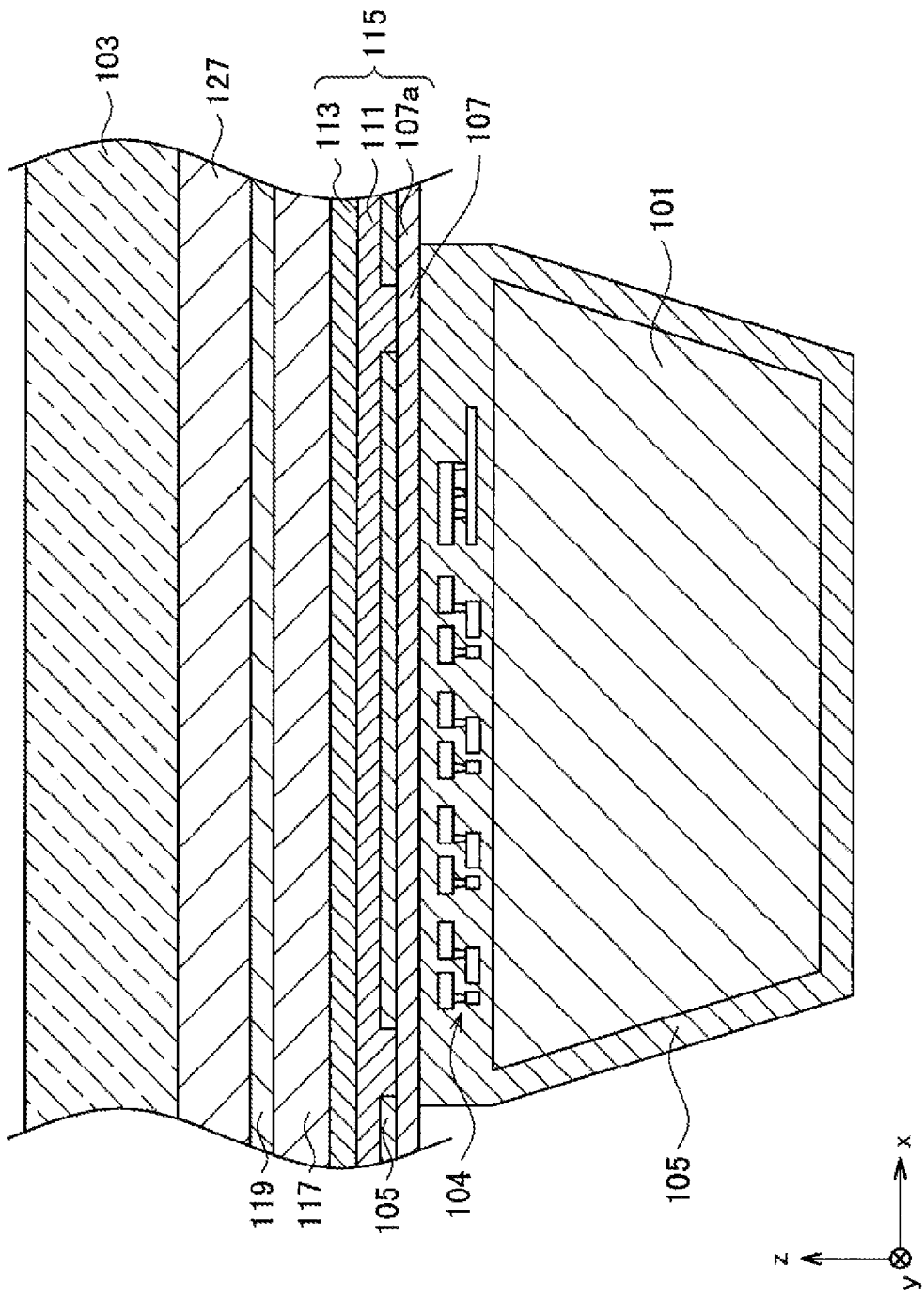
FIG. 9J is an explanatory diagram illustrating a method of manufacturing a display device according to a third embodiment.

Referring to FIGS. 9A to 9L, a method of manufacturing a display device 3 according to the third embodiment will be described and a configuration of the display device 3 will be described. FIGS. 9A to 9L are explanatory diagrams illustrating the method of manufacturing the display device 3 according to the third embodiment. FIGS. 9A to 9L schematically illustrate cross sections of the display device 3 on the x-z plane in the order of steps in the method of manufacturing the display device 3 in a way similar to FIGS. 3A to 3J, and illustrate a process flow of the manufacturing method. In FIGS. 9A to 9K, portions corresponding to one display device 3 in a wafer are extracted and illustrated. FIG. 9L illustrates the cross section of one diced and segmented display device 3.

Here, the display device 3 according to the third embodiment corresponds to a display device in which the structure of the electrode disposition region is changed in the display device 1 according to the first embodiment. The other factors of the display device 3 are the same as those of the display device 1. Therefore, in the description of the following third embodiment, different factors from the first embodiment will be mainly described and the detailed description of the repeated factors will be omitted.

In the method of manufacturing the display device 3, circuits (for example, a driving circuit and the like) processing various signals related to an organic EL element 115 to be described below and transistors (so-called TFTs and the like) are first formed on a first substrate 101 (see FIG. 9A). In FIG. 9A, wiring layers 104 formed in an insulation film 105 are illustrated simulatively to express the circuits and the transistors in a way similar to FIG. 3A. The circuits and the transistors may be formed as in the first embodiment.

Subsequently, the wiring layer 107 is formed by forming a conductive material as a film and patterning the conductive material in a predetermined shape (see FIG. 9B: the patterning is not illustrated in FIG. 9B). In the wiring layer 107, first electrodes 107a, driving wirings for driving the organic EL elements 115, lead-out wirings for transmitting predetermined signals related to the organic EL elements 115 to the signal electrode 129a to be described below, and the like are formed. Note that although not illustrated in detail, a step of providing a contact hole in the insulation film 105 is performed before the wiring layer 107 is formed. Because of the contact hole, the first electrode 107a, the driving wiring, the lead-out wiring, and the like formed in the wiring layer 107 are electrically connected to corresponding wirings of the wiring layer 104 of a lower layer. The contact hole is similar to the contact hole connecting the wiring layer 107 to the wiring layer 104 of the lower layer in the first embodiment.

Subsequently, an insulation film 105c is formed as a film by forming an insulation material (see FIG. 9C). The insulation film 105c is formed of the same material as the above-described insulation film in accordance with the same method. Note that in the description of the subsequent manufacturing method, in order to avoid complex description, both the insulation film 105 and the insulation film 105c are referred to as the insulation film 105 in a case in which it is not particularly necessary to distinguish the insulation film 105 and the insulation film 105a from each other. In addition, to correspond to this, only reference numeral "105" generally denoting the insulation films is affixed to the insulation film 105 and the insulation film 105c in the subsequent FIGS. 9D to 9L.

Subsequently, the organic layer 111 is formed by forming an opening at a position corresponding to a portion immediately above the first electrode 107a of the insulation film 105 and subsequently forming an organic material as a film (see FIG. 9D). Although not illustrated in detail, at this time, the organic layer 111 is appropriately patterned to correspond to each pixel.

Subsequently, the wiring layer 113 is formed by forming a conductive material as a film and appropriately patterning the conductive material. Further, the protective film 117 is formed to cover the second electrode 113 (see FIG. 9E). The wiring layer 113 corresponds to the second electrode 113 that functions as a cathode in the organic EL element 115. In the opening of the insulation film 105, the organic EL element 115 is formed by stacking the first electrode 107a, the organic layer 111, and the second electrode 113 in this order. The insulation film 105 on the first electrode 107a functions as a pixel definition film that is provided between the pixels and demarcates an area of the pixel.

Subsequently, the CF layer 119 is formed on the protective film 117 (see FIG. 9F). In this way, the display device 3 is also an OCCF type of display device as in the display device 1.

Subsequently, the second substrate 103 is bonded to the first substrate 101 via the bonding material resin material 127 (see FIG. 9G). Here, since the display device 3 is also a top surface light-emitting type of display device as in the display device 1, a material with high transmittance through which light from the organic EL element 115 suitably passes is used for the bonding material resin material 127 and the second substrate 103.

Subsequently, a region corresponding to a scribe line or an outer circumference of the chip on the rear surface of the first substrate 101 (that is, a region between the mutually adjacent display devices 3) is etched by dry etching (see FIG. 9H). In the dry etching, as illustrated in FIG. 9H, in the etching region, the rear surface of the first substrate 101 is etched so that the rear surface of the first substrate has a tapered shape in which the thickness of the first substrate 101 is gradually thinned toward the outer circumference of the chip. At this time, the etching is performed until the first substrate 101 is all removed and the insulation film 105 is exposed in the region corresponding to the scribe line or the outer circumference of the chip.

Note that a specific method of the dry etching is not limited. Any method may be applied as long as the foregoing processing of the first substrate 101 is possible. For example, RIE, DRIE, ICP-DIE, or the like can be used as the dry etching.

In the following description, a region with a tapered shape obtained by the etching on the rear surface of the first substrate 101 is referred to as a tapered region and the other region is a flat region.

Subsequently, an insulation film 105d is formed as a film by forming an insulation material on the flat region and the tapered region (see FIG. 9I). The insulation film 105d is formed of the same material as the above-described insulation film in accordance with the same method. Note that in the description of the subsequent method of manufacturing the display device 1, in order to avoid complex description, the insulation film 105, the insulation film 105c, and the insulation film 105d are referred to as the insulation film 105 in a case in which it is not particularly necessary to distinguish them from each other. In addition, to correspond to this, only reference numeral "105" generally denoting the insulation films is affixed to the insulation film 105, the insulation film 105c, and the insulation film 105d a in the subsequent FIGS. 9J to 9L.

Subsequently, the insulation film 105 of a region corresponding to the outer circumference of the chip (that is, a region which is between the mutually adjacent chips and in which there is no first substrate 101) is etched by dry etching until the rear surface of the wiring layer 107 is exposed (see FIG. 9J). A specific method of the drying etching is not limited. For example, any of various known methods such as the above-described RIE may be applied.

Subsequently, a wiring layer 129 is formed in the tapered region by forming a conductive material as a film on the flat region and the tapered region and subsequently removing the conductive material in the flat region (see FIG. 9K). Although not illustrated in detail, at this time, the wiring layer 129 is appropriately patterned in the tapered region. In the wiring layer 129, the signal electrode 129a exchanging various signals between the display device 1 and the outside is formed. The number of signal electrodes 129a necessary to exchange signals with the outside can be formed in accordance with the circuit configuration or the like of the display device 3. Here, in the third embodiment, the signal electrodes 120a are formed on only one pair of sides between two pairs of sides facing each other in the chip of the display device 3 that has a rectangular shape. In the illustrated configuration example, the signal electrodes 129a are configured only on two sides (two sides in the horizontal direction of the sheet surface) orthogonal to the x axis direction.

The wiring layer 129 can be formed of the same material and method as those of the above-described wiring layer 107. Here, since it is necessary to perform patterning on a surface inclined in the horizontal direction (a direction parallel to the x-y plane) in the wiring layer 129 formed in the tapered region, any of various known photolithography technologies and etching technologies corresponding to the inclined surface can be appropriately used. Note that in the following description of the manufacturing method, in order to avoid complex description, the wiring layer 107 and the wiring layer 129 are referred to as the wiring layers 107 in a case in which it is not particularly necessary to distinguish the wiring layer 129 from each other. In addition, to correspond to this, only reference numeral "107" generally denoting the wiring layers is affixed to the wiring layer 107 and the wiring layer 129 even in the following FIG. 9L.

Subsequently, the protective film 117 is formed in the tapered region. The protective film 117 can be formed, for example, by forming a material of a protective film such as SiN in the flat region and the tapered region as a film and subsequently removing the film on the flat region. Further, at this time, the protective film 117 is appropriately patterned so that the signal electrode 129a is exposed in the tapered region. Finally, the segmented display device 3 is fabricated by performing dicing (see FIG. 9L).

FIG. 10 is a diagram illustrating an aspect when a tapered region of the segmented display device 3 illustrated in FIG. 9L is viewed laterally (the x axis direction). As illustrated in FIG. 10, the plurality of signal electrodes 129a are arranged in the tapered region of the display device 3. In the illustrated example, the rectangular signal electrodes 129a are arranged side by side at the same pitch in a direction parallel to the y axis direction. The pitch is, for example, about 200 to 300 μm. However, the third embodiment is not limited to this example. The shape of the signal electrodes 129a, the number of disposed signal electrodes 129a, the positions of the disposed signal electrodes 129a, and the like may be appropriately decided in accordance with a circuit configuration or the like of the display device 3 so that a desired signal can be exchanged with the outside.

The method of manufacturing the display device 3 according to the third embodiment has been described above. By fabricating the display device in accordance with the above-described manufacturing method, the electrode disposition region in which the signal electrode 129a is disposed is provided in a partial region of the side surface of the chip in the display device 3. In this way, by providing the electrode disposition region not on the upper surface of the chip but on the side surface of the chip, it is possible to obtain the advantageous effect of reducing the chip area in the display device 3 as in the display device 1 according to the first embodiment. Accordingly, it is possible to increase the number of chips acquired per wafer, and thus it is possible to realize a reduction in manufacturing cost.

In addition, in the third embodiment, as in the first embodiment, the signal electrodes 129a and an FPC of the display device 3 can also be connected without performing a process of applying heat by providing the electrode disposition region, as described above (the details will be described below when the configuration of the display module is described). Accordingly, since it is not necessary to display the electrode disposition region away from the pixel region in consideration of delivery of heat, it is possible to further reduce the chip area.

(2-3-2. Configuration of Display Module)

Referring to FIG. 11, a configuration of a display module 34 according to the third embodiment will be described. FIG. 11 is a diagram illustrating a schematic configuration of the display module 34 according to the third embodiment.

FIG. 11 is an exploded side view illustrating a display module 34 (the display device 3 is simulatively illustrated as a sectional view similar to FIG. 4L to clarify a positional relation between the signal electrode 129a and a module casing 24). As illustrated in FIG. 11, the display module 34 is configured such that the display device 3 is stored in the module casing 24.

The module casing 24 is configured such that the casing-side signal electrode 213 is provided in a casing body 211. The casing body 211 includes a bottom plate that has a rectangular shape and a side wall extending from four sides of the bottom plate in a direction vertical to the bottom plate. In addition, the casing-side signal electrode 213 is electrically connected to the bottom plate of the module casing 24 and an FPC 205 extending toward the outside is connected to the bottom plate.

As illustrated, the display device 3 is inserted from an upward opening of the casing body 211 in a direction in which the lower surface which is an opposite surface to a display surface of the display device 3 faces the inner surface of the bottom plate of the casing body 211 so that the display device 3 is stored inside the module casing 24. The stored display device 3 is solidified in the module casing 24 by a latch or the like (not illustrated). This fixing means is not particularly limited and any configuration of the latch may be used.

The casing-side signal electrode 213 is provided on an inner surface of the side wall corresponding to the side on which the device-side signal electrode 129a is disposed among the four sides of the chip of the display device 3 in the side wall of the casing body 211 to face the device-side signal electrode 129a. As in the casing-side signal electrode 203 illustrated in FIG. 5 according to the first embodiment, the casing-side signal electrode 213 has a plate spring shape and is configured to be elastically deformable with respect to the side wall of the casing body 211. One end of the FPC 205 extending toward the outside is connected to the bottom plate of the casing body 211. The casing-side signal electrode 213 and the FPC 205 are electrically connected by a wiring (not illustrated) provided on the wall surface of the casing body 211.

A spot in which the casing-side signal electrode 213 on the side wall of the casing body 211 is provided is configured to have a surface substantially parallel to the tapered shape of the electrode disposition region of the display device 3. In addition, the disposition positions and the number of casing-side signal electrodes 213 are adjusted to correspond to the disposition positions and the number of device-side signal electrodes 129a of the display device 3. Accordingly, when the display device 3 is stored in the module casing 24, as described above, the device-side signal electrode 129a and the casing-side signal electrode 213 come into contact with each other so that both the device-side signal electrode 129a and the casing-side signal electrode 213 are electrically connected. Here, in a case in which the display device 3 is stored and fixed to the module casing 24, shapes of the casing-side signal electrode 213 and the side wall of the casing body 211 are appropriately adjusted so that the device-side signal electrodes 129a are pressed on the casing-side signal electrodes 213 with a predetermined pressing force to the degree that at least the casing-side signal electrodes 213 with the plate spring shape can be deformed. Thus, both the device-side signal electrodes 129a and casing-side signal electrodes 213 can be reliably conducted.

The configuration of the display module 34 according to the third embodiment has been described above. As described above, according to the third embodiment, the display module 34 is configured such that the display device 3 is stored in the module casing 24. As in the display module 31 according to the first embodiment, the casing-side signal electrode 213 is provided at the position facing the device-side signal electrode 129a of the display device 3 in the module casing 24. Accordingly, by storing the display device 3 in the module casing 24, it is possible to electrically connect the device-side signal electrode 129a to the casing-side signal electrode 213 by the pressing force when the display device 3 is stored in the module casing 24, and it is possible to extract a signal of the device-side signal electrode 129a to the outside via the FPC 205. In this way, according to the third embodiment, since the signal of the device-side signal electrode 129a can be extracted to the outside without performing a process of applying heat, it is possible to achieve a more reduction in the chip area. Further, since the casing-side signal electrode 213 has the plate spring shape, it is possible to electrically connect the device-side signal electrode 129a to the casing-side signal electrode 213 more reliably. Note that in the third embodiment, as in the first embodiment, the device-side signal electrodes 129a may be disposed on the side surface of the display device 3 or may be disposed at any positions. For example, the device-side signal electrodes 129a may be disposed on only one surface among side surfaces of the display device 3, may be disposed on three surfaces, or may be disposed on all the four surfaces. In addition, the disposition positions of the device-side signal electrodes 129a may be appropriately changed in accordance with the disposition positions of the casing-side signal electrode 213 in the module casing 24.

(2-3-3. Modification Example)

As a modification example of the third embodiment, a modification example in which the shapes of the casing-side signal electrodes 213 of the above-described module casing 24 are different will be described. Note that the display module according to the modification example is similar to the display module 34 according to the above-described third embodiment other than the fact that the shapes of the casing-side signal electrodes 213 are different. Accordingly, in the description of the following modification example, different factors from the display module 34 will be mainly described. The detailed description of the repeated factors will be omitted.

FIG. 12 is a diagram illustrating a schematic configuration of the display module 35 according to a modification example of the third embodiment. FIG. 12 illustrates an exploded side view of the display module 35 (the display device 3 is simulatively illustrated as a sectional view similar to FIG. 4L to clarify a position relation between the signal electrodes 129*a* and the module casings 25). As illustrated in FIG. 12, the display module 35 is configured such that the display device 3 is stored in the module casing 25.

The module casing 25 is configured such that the casing-side signal electrodes 215 are provided in the casing body 211. The configuration of the casing body 211 is similar to the casing body 211 of the display module 34 illustrated in FIG. 11.

In the modification example, the casing-side signal electrodes 215 are configured as electrodes that have a ball shape. When the display device 3 is stored in the module casing 25 as in the above-described display module 34, the device-side signal electrode 129*a* and the casing-side signal electrode 215 with the ball shape come into contact with each other so that both the device-side signal electrode 129*a* and the casing-side signal electrode 215 are electrically connected. Here, in a case in which the display device 3 is stored in the module casing 25, the shapes of the casing-side signal electrode 215 and the side wall of the casing body 211 are appropriately adjusted so that the device-side signal electrode 129*a* is pressed on the casing-side signal electrode 215 with a predetermined pressure. Thus, conduction of both the casing-side signal electrode 215 and the device-side signal electrode 129*a* can be reliably conducted.

In this way, in the display module 35 configured such that the casing-side signal electrode 215 has the ball shape, it is also possible to obtain advantageous effects similar to those of the above-described display module 34, that is, it is possible to connect the device-side signal electrode 129*a* to the FPC 205 without applying heat. Note that the casing-side signal electrode 215 may be provided to be fixed to the inner wall surface of the casing body 211 or may be configured to be elastically movable in a direction vertical to the inner wall surface of the casing body 211. By configuring the casing-side signal electrode 215 to be elastically movable, it is possible to further ensure the electrical connection between both the device-side signal electrode 129*a* and the casing-side signal electrode 215 because of an elastic restoring force of the casing-side signal electrode 215 when the device-side signal electrode 129*a* is pressed on the casing-side signal electrode 215.

FIG. 13 is a diagram illustrating a schematic configuration of the display module 36 according to another modification example of the third embodiment. FIG. 13 illustrates an exploded side view of the display module 36 (the display device 3 is simulatively illustrated as a sectional view similar to FIG. 4L to clarify a position relation between the signal electrodes 129*a* and the module casings 26). As illustrated in FIG. 13, the display module 36 is configured such that the display device 3 is stored in the module casing 26.

The module casing 26 is configured such that the casing-side signal electrodes 217 are provided in the casing body 211. The configuration of the casing body 211 is similar to the casing body 211 of the display module 34 illustrated in FIG. 11.

In the modification example, the casing-side signal electrode 217 is configured as an electrode that has a plate shape. When the display device 3 is stored in the module casing 26 as in the above-described display module 34, the device-side signal electrode 129*a* comes into contact with the casing-side signal electrode 217 that has the plate shape to be electrically connection. Here, in a case in which the display device 3 is stored in the module casing 26, the device-side signal electrode 129*a* is pressed on the casing-side signal electrode 217 with a predetermined pressure, and thus the shapes of the casing-side signal electrode 217 and the side wall of the casing body 211 are appropriately adjusted so that both the device-side signal electrode 129*a* and the casing-side signal electrode 217 can be come into contact with each other in a so-called fastening state. Thus, conduction of both the casing-side signal electrode 217 and the device-side signal electrode 129*a* can be reliably conducted.

In this way, in the display module 36 configured such that the casing-side signal electrode 217 has a plate shape, it is also possible to obtain advantageous effects similar to those of the above-described display module 34, that is, it is possible to connect the device-side signal electrode 129*a* to the FPC 205 without applying heat. In addition, according to the modification example, since the shape of the casing-side signal electrode 217 is simple, the module casing 26 can be fabricated at lower cost. Therefore, it is possible to expect the advantageous effect of further reducing the manufacturing cost.

2-4. Fourth Embodiment

Referring to FIGS. 14A to 14E, a method of manufacturing a display device 4 according to the fourth embodiment will be described and a configuration of the display device 4 will be described. FIGS. 14A to 14E are explanatory diagrams illustrating the method of manufacturing the display device 4 according to the fourth embodiment. FIGS. 14A to 14E schematically illustrate cross sections of the display device 4 on the x-z plane in the order of steps in the method of manufacturing the display device 4 in a way similar to FIGS. 3A to 3J, and illustrate a process flow of the manufacturing method. In FIGS. 14A to 14D, portions corresponding to one display device 4 in a wafer are extracted and illustrated. FIG. 9E illustrates the cross section of one diced and segmented display device 4.

Here, the display device 4 according to the fourth embodiment corresponds to a display device in which the bonding material resin material 127 and the second substrate 103 are not provided in the display device 3 according to the third embodiment. Other factors of the display device 4 are the same as those of the display device 3. Therefore, in the description of the following fourth embodiment, different factors from the third embodiment will be mainly described and the detailed description of the repeated factors will be omitted.

In the method of manufacturing the display device 4, steps until the CF layer 119 described with reference to FIG. 9F is formed are the same as those of the method of manufacturing the display device 3. Accordingly, hereinafter, steps after the CF layer 119 is formed will be described.

Figure 14A:
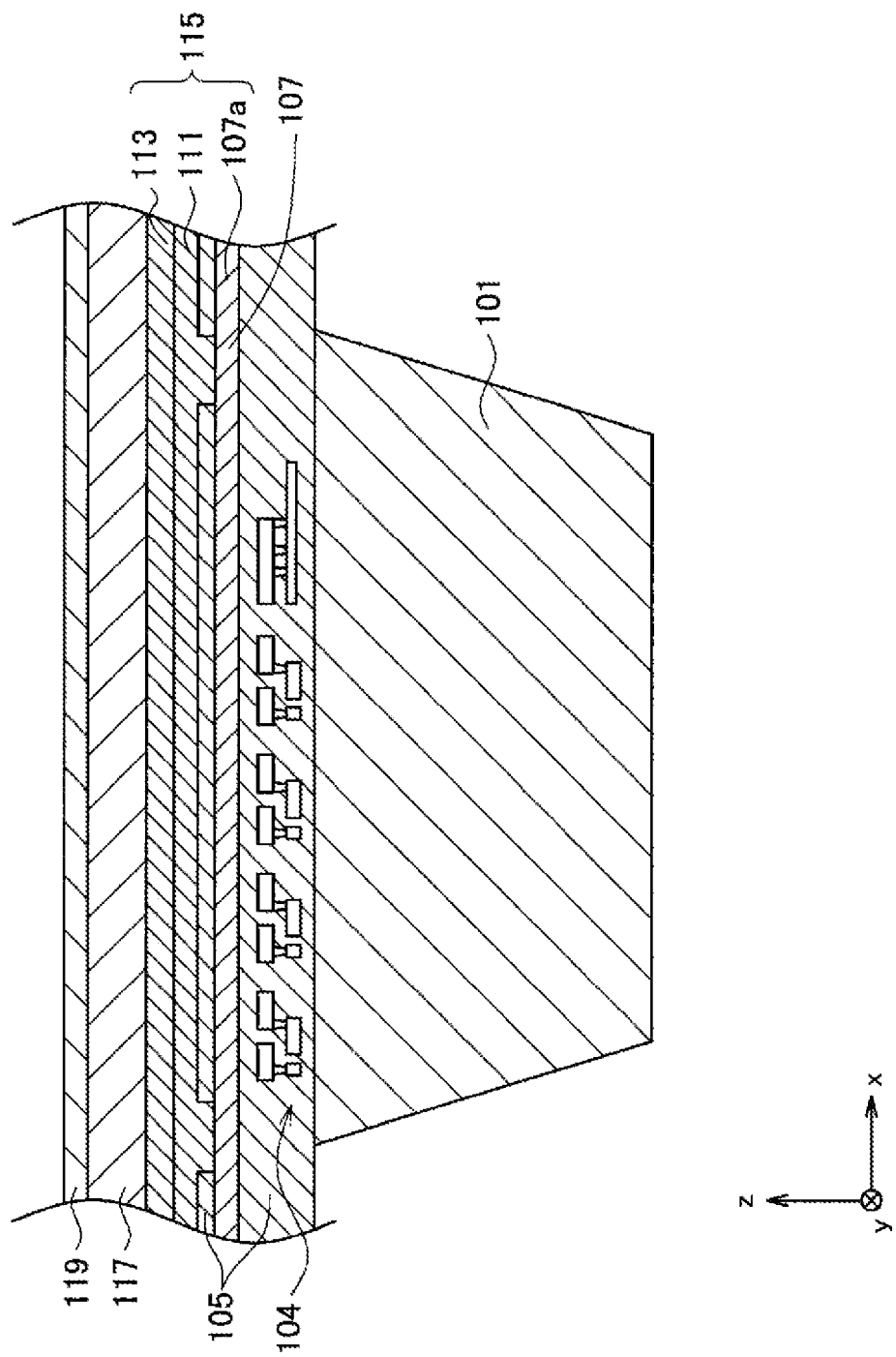
FIG. 14A is an explanatory diagram illustrating a method of manufacturing a display device according to a fourth embodiment.

In the method of manufacturing the display device 4, after the CF layer 119 is formed, a region corresponding to a scribe line or an outer circumference of the chip on the rear surface of the first substrate 101 (that is, a region between the mutually adjacent display devices 4) is etched by dry etching (see FIG. 14A). Through this step, the region corresponding to the scribe line or the outer circumference of the chip on the rear surface of the first substrate 101 is processed in a tapered shape. This step is the same as the step described with reference to FIG. 9H in the method of manufacturing the display device 3. Here, in the etching step, as illustrated, a region in which there is no first substrate 101 is formed between the mutually adjacent chips. In addition, unlike the third embodiment, etching is performed in a state in which the second substrate 103 is not provided. Accordingly, in order to prevent the chips from being separated from each other, the wafer is turned over and etching is performed in a state in which a support substrate is separately provided on the upper surface of the CF layer 119. The support substrate also serves to protect the CF layer 119.

Subsequently, an insulation film 105d is formed as a film by forming an insulation material on the flat region and the tapered region (see FIG. 14B). This step is similar to the step described with reference to FIG. 9I in the method of manufacturing the display device 3. Note that in the description of the subsequent method of manufacturing the display device 1, in order to avoid complex description, the insulation film 105 and the insulation film 105d are referred to as the insulation film 105 in a case in which it is not particularly necessary to distinguish them from each other. In addition, to correspond to this, only reference numeral "105" generally denoting the insulation films is affixed to the insulation film 105 and the insulation film 105d a in the subsequent FIGS. 14C to 14E.

Subsequently, the insulation film 105 of a region corresponding to the outer circumference of the chip (that is, a region which is between the mutually adjacent chips and in which there is no first substrate 101) is etched by dry etching until the front surface of the wiring layer 107 is exposed (see FIG. 14C). This step is similar to the step described with reference to FIG. 9J in the method of manufacturing the display device 3.

Figure 14D:
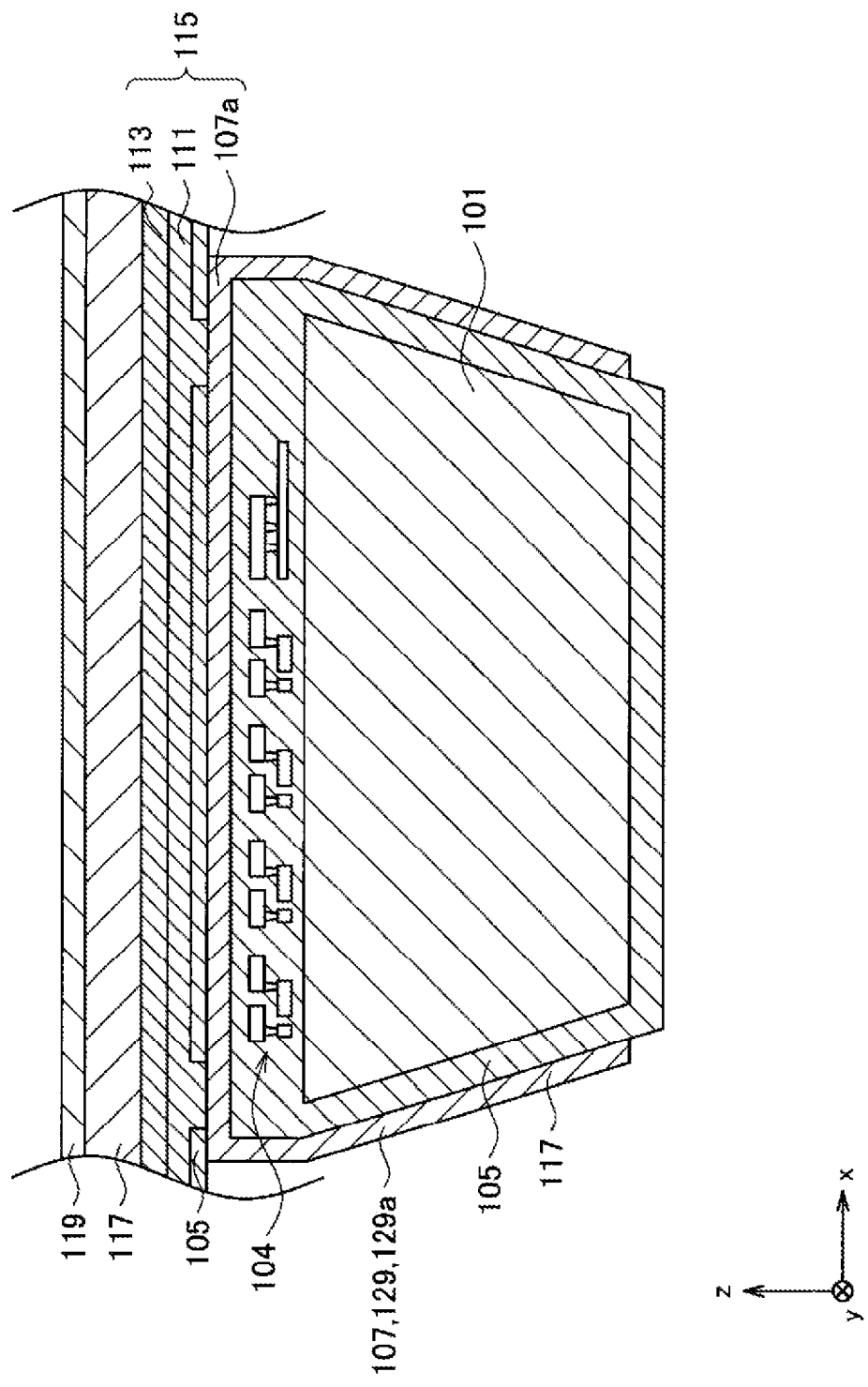
FIG. 14D is an explanatory diagram illustrating a method of manufacturing a display device according to a fourth embodiment.

Subsequently, the wiring layer 129 is formed in the tapered region by forming a conductive material as a film on the flat region and the tapered region and subsequently removing the conductive material in the flat region (see FIG. 14D). Although not illustrated in detail, at this time, the wiring layer 129 is appropriately patterned in the tapered region. In the wiring layer 129, the signal electrode 129a exchanging various signals between the display device 1 and the outside is formed. This step is similar to the step described with reference to FIG. 9K in the method of manufacturing the display device 3.

Subsequently, the protective film 117 is formed in the tapered region. At this time, the protective film 117 is patterned in the tapered region so that the signal electrode 129a is exposed. Finally, the segmented display device 4 is fabricated by performing dicing (see FIG. 14E). This step is similar to the step described with reference to FIG. 9L in the method of manufacturing the display device 3.

Figure 14E:
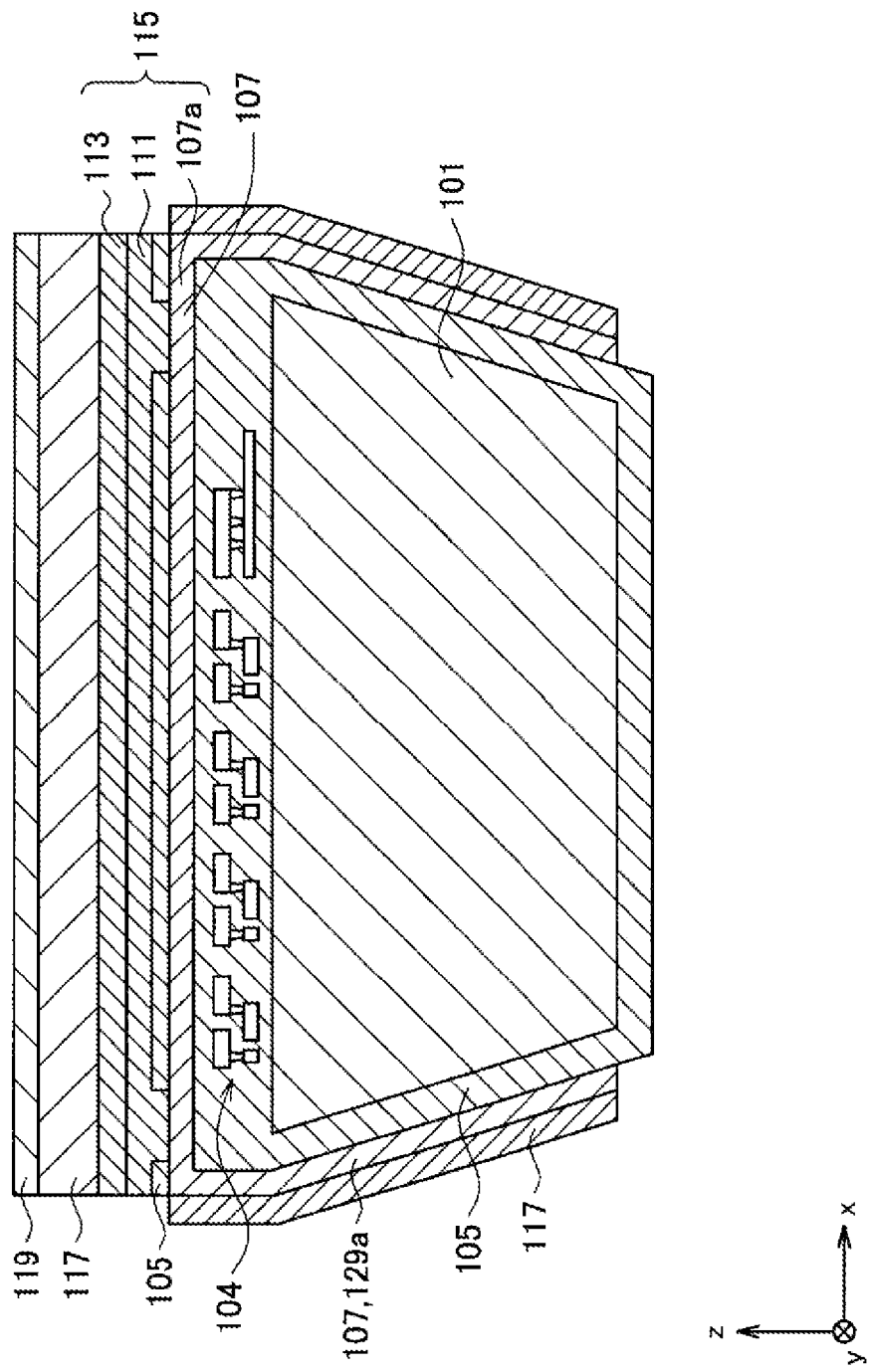
FIG. 14E is an explanatory diagram illustrating a method of manufacturing a display device according to a fourth embodiment.
Figure 15:
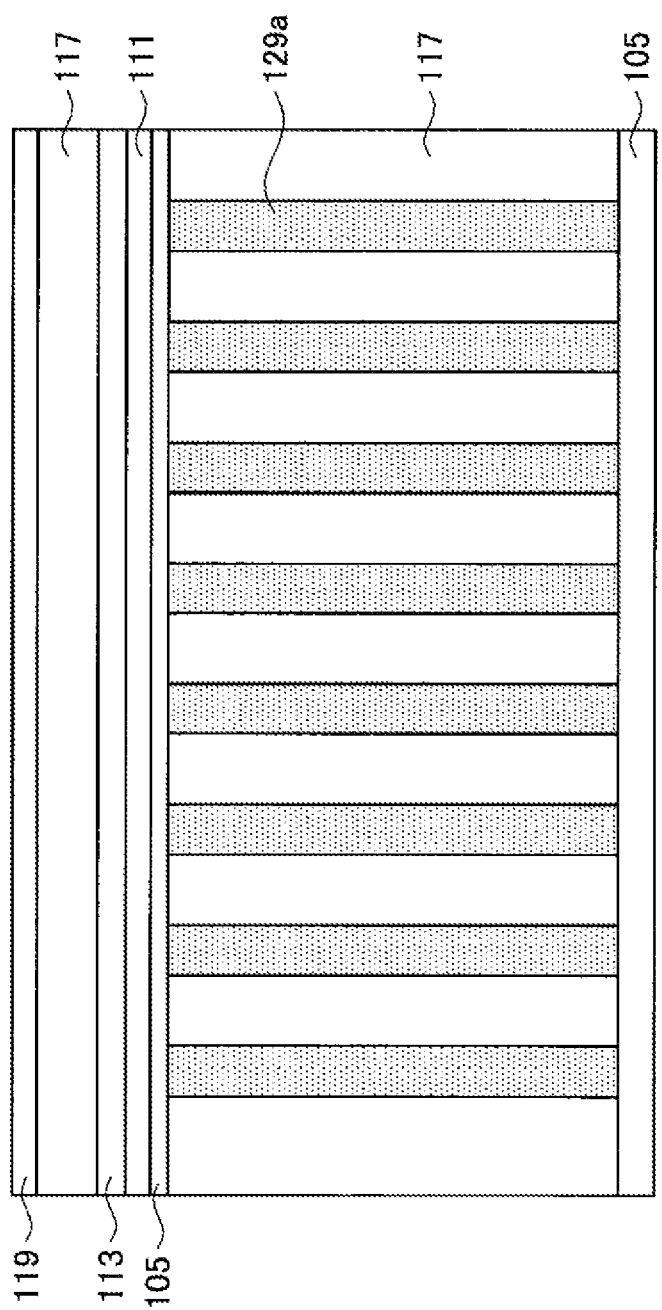
FIG. 15 is a diagram illustrating an aspect when a tapered region of the segmented display device illustrated in FIG. 14E is viewed laterally (the x axis direction).

FIG. 15 is a diagram illustrating an aspect when a tapered region of the segmented display device 4 illustrated in FIG. 14E is viewed laterally (the x axis direction). As illustrated in FIG. 15, the plurality of signal electrodes 129a are arranged in the tapered region of the display device 4. The configuration of the signal electrodes 129a is similar to the signal electrode 129a of the display device 3 illustrated in FIG. 10.

The configuration of the display device 4 according to the fourth embodiment will be described above. In the display device 4 that has the above-described configuration, it is also possible to obtain the same advantageous effect as that of the third embodiment, that is, the advantageous effect of reducing the chip area.

Note that in the display device 4, as in the display device 3, the display module can be configured by storing the display device 4 in the module casing 24, 25, or 26. Since the configuration of the display module is the same as the display module 34, 35, or 36 according to the third embodiment except that the configuration of the display device 4 is different, the repeated description will be omitted. In the display module according to the fourth embodiment, it is also possible to obtain an advantageous effect similar to that of the display modules 34, 35, and 36 according to the third embodiment, that is, the advantageous effect that the display device 2 can be connected to the FPC 205 without applying heat.

3. Fifth to Eleventh Embodiments

Fifth to eleventh embodiments of the present disclosure will be described. In the fifth to eleventh embodiments, a reduction in a chip area is achieved by forming I/O units with different configurations from the above-described first to fourth embodiments.

Here, configurations of display devices according to the fifth to eleventh embodiments are substantially similar configurations of the display devices according to the first to fourth embodiments except that configurations of signal electrodes are different. Accordingly, in the description of the following fifth to eleventh embodiments, different factors from the first to fourth embodiments will be mainly described and the detailed description of the repeated factors will be omitted. Note that, as described above, since the other configurations of the signal electrodes are substantially similar, only a configuration near the outer circumference of a chip in which the signal electrodes are provided is extracted and illustrated in each drawing (sectional view) illustrating the configurations of the display devices according to the fifth to eleventh embodiments to be described below. In addition, in each drawing (sectional view) illustrating the configurations of the display devices according to the fifth to eleventh embodiments to be described below, the wiring layer 104 in which the circuits, the transistors, and the like formed on the first substrate 101 are indicated is not illustrated.

3-1. Fifth Embodiment

Referring to FIGS. 16A to 16F, a method of manufacturing a display device 5 according to the fifth embodiment will be described and a configuration of the display device 5 will be described. FIGS. 16A to 16F are explanatory diagrams illustrating the method of manufacturing the display device 5 according to the fifth embodiment. FIGS. 16A to 16F schematically illustrate cross sections on the x-z plane near the outer circumference of the display device 5 in the order of steps in the method of manufacturing the display device 5 and illustrate a process flow of the manufacturing method. Note that FIGS. 16A to 16F illustrate a region corresponding to the outer circumference of one display device 5 simulatively in a chip state. In practice, the steps illustrated in FIGS. 16A to 16F are performed in the wafer state. Therefore, chips of the other display devices 5 can be near the outer circumference.

In the method of manufacturing the display device 5, steps until the protective film 117 is formed are substantially similar to the steps until the protective film 117 described with reference to FIGS. 9A to 9E is formed in the method of manufacturing the display device 3 according to the above-described third embodiment. Accordingly, hereinafter, processes after the protective film 117 is formed will be described.

Figure 16A:
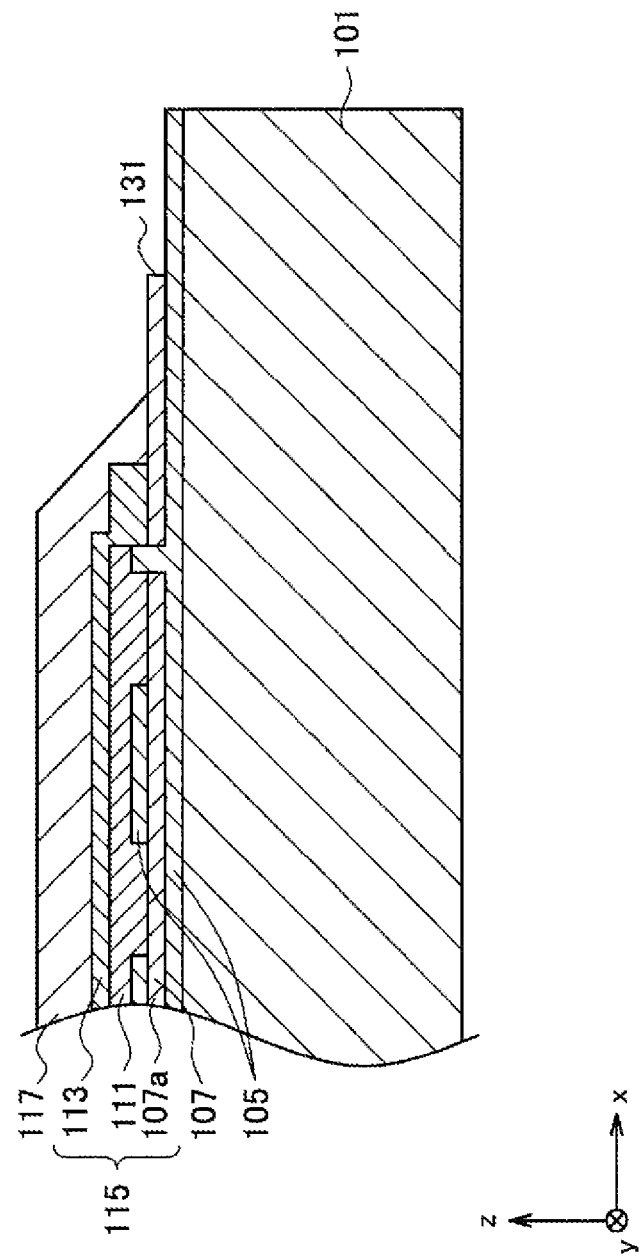
FIG. 16A is an explanatory diagram illustrating a method of manufacturing a display device according to a fifth embodiment.
Figure 16C:
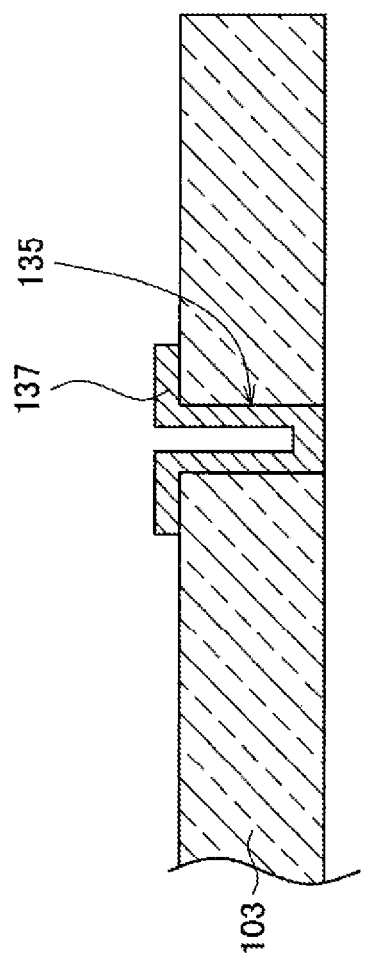
FIG. 16C is an explanatory diagram illustrating a method of manufacturing a display device according to a fifth embodiment.

FIG. 16A illustrates a sectional view of the display device 5 in a state in which the steps until the protective film 117 is formed end. Here, in the display device 5, as in the foregoing display device 3 or the like, the first electrodes 107a functioning as an anode, an extraction wiring for transmitting a predetermined signal related to the organic EL element 115 to the signal electrode 137 to be described below, and the like are formed in the wiring layer 107. At this time, in the display device 5, an extraction electrode 131 exchanging a predetermined signal related to a pixel with the outside is formed in the wiring layer 107. Then, the protective film 117 is formed so that the extraction electrode 131 is exposed. As illustrated, the extraction electrode 131 can be provided at a position corresponding to an end of the protective film 117, that is, near the outer circumference of the chip.

The extraction electrode 131 is electrically connected to a wiring for the predetermined signal related to the pixel. In the illustrated example, the extraction electrode 131 is electrically connected to the second electrode 113 that functions as a cathode. That is, the extraction electrode 131 is an electrode that extracts a cathode potential to the outside. FIG. 14A illustrates only one extraction electrode 131. However, in practice, the plurality of extraction electrodes 131 delivering other signals related to the pixels are provided. The number of extraction electrodes 131 is appropriately decided in accordance with the circuit configuration or the like of the display device 5 so that the display device 5 can be appropriately driven.

When the protective film 117 is formed so that the extraction electrode 131 is exposed, an extraction wiring 133 of which one end is electrically connected to the extraction electrode 131 and the other end extends on the protective film 117 is formed with respect to each extraction electrode 131 (see FIG. 16B). The extraction wiring 133 is formed, for example, by forming a conductive material such as Al or Cu as a film using a metal mask by a sputtering method or the like. The material and the forming method for the extraction wiring 133 are not limited to this example, but any of various known materials and methods used for general semiconductor processes may be applied.

On the other hand, the following process is performed on the second substrate 103 concurrently with the foregoing process on the first substrate 101. First, a through-hole is formed in the second substrate 103 and a conductive material is formed as a film on the inner wall of the through-hole to extend between the upper surface and the lower surface of the second substrate 103 (see FIG. 16C). That is, a via-hole 135 is formed in the second substrate 103. In addition, at this time, simultaneously, the signal electrode 137 electrically connected to the via-hole 135 is formed on the upper surface of the second substrate 103 by appropriately patterning the conductive material formed as the film on the second substrate 103. The via-hole 135 and the signal electrode 137 can be formed, for example, by forming a conductive material as a film in accordance with any of various methods such as a sputtering method and subsequently patterning the conductive material using a known photolithography technology and etching technology. Note that in the illustrated example, in the via-hole 135, the conductive material is formed as a film on only the inner wall of the through-hole, but a conductive material is embedded in the through-hole.

Note that in the present disclosure, in embodiments to be described below, a via-hole is also provided in a member on the first substrate 101 in some cases. Accordingly, in the present specification, a via-hole (for example, the above-described via-hole 135 or the like) provided in the second substrate 103 is referred to as a first via-hole in some cases. In addition, a via-hole provided in the member on the first substrate 101 is referred to as a second via-hole in some cases.

When the second substrate 103 is bonded to the first substrate 101, a position at which the via-hole 135 is formed is adjusted so that the extraction wiring 133 on the protective film 117 is located immediately below the via-hole 135. That is, the plurality of via-holes 135 are formed in the second substrate 103 with regard to the plurality of extraction electrodes 131 and the extraction wirings 133.

Subsequently, the CF layer 119, the sealing material 121, and a connection electrode 139 are formed on the lower surface of the second substrate 103 (see FIG. 16D). The CF layer 119 is similar to the CF layer 119 of the display devices 1 to 4 according to the first to fourth embodiments and is formed immediately above the pixel region so that a CF of each color (R, G, and B) with a predetermined area is formed in each organic EL element 115 provided in each pixel when the second substrate 103 is bonded to the first substrate 101. In this way, the display device 5 is a counter CF type of display device in which the CF layer 119 is formed on the second substrate 103 facing the first substrate 101 in which the organic EL element 115 is formed. However, the fifth embodiment is not limited to this example and the display device 5 may be an OCCF type of display device.

The sealing material 121 has a function of an adhesive bonding the first substrate 101 to the second substrate 103. The sealing material 121 is provided at a position at which the sealing material 121 surrounds the pixel region when the second substrate 103 is bonded to the first substrate 101. In this way, the sealing material 121 also has a function of sealing the pixel region. As illustrated, the sealing material 121 is provided on the inner side of the via-hole 135 in a region corresponding to the chip surface of the second substrate 103. As the sealing member 121, any of various known materials used as sealing materials in general organic EL displays can be applied. Note that the sealing material 121 corresponds to the sealing material 421 described with reference to FIGS. 1 and 2.

The connection electrode 139 is provided immediately below the via-hole 135 to extend in the z axis direction. The length of the connection electrode 139 in the z axis direction is adjusted so that a lower end of the connection electrode 139 comes into contact with the extraction wiring 133 on the protective film 117 when the second substrate 103 is bonded to the first substrate 101, and the via-hole 135 and the extraction wiring 133 are conducted. For example, the connection electrode 139 is formed by a technology such as a gold stud bump.

Figure 16E:
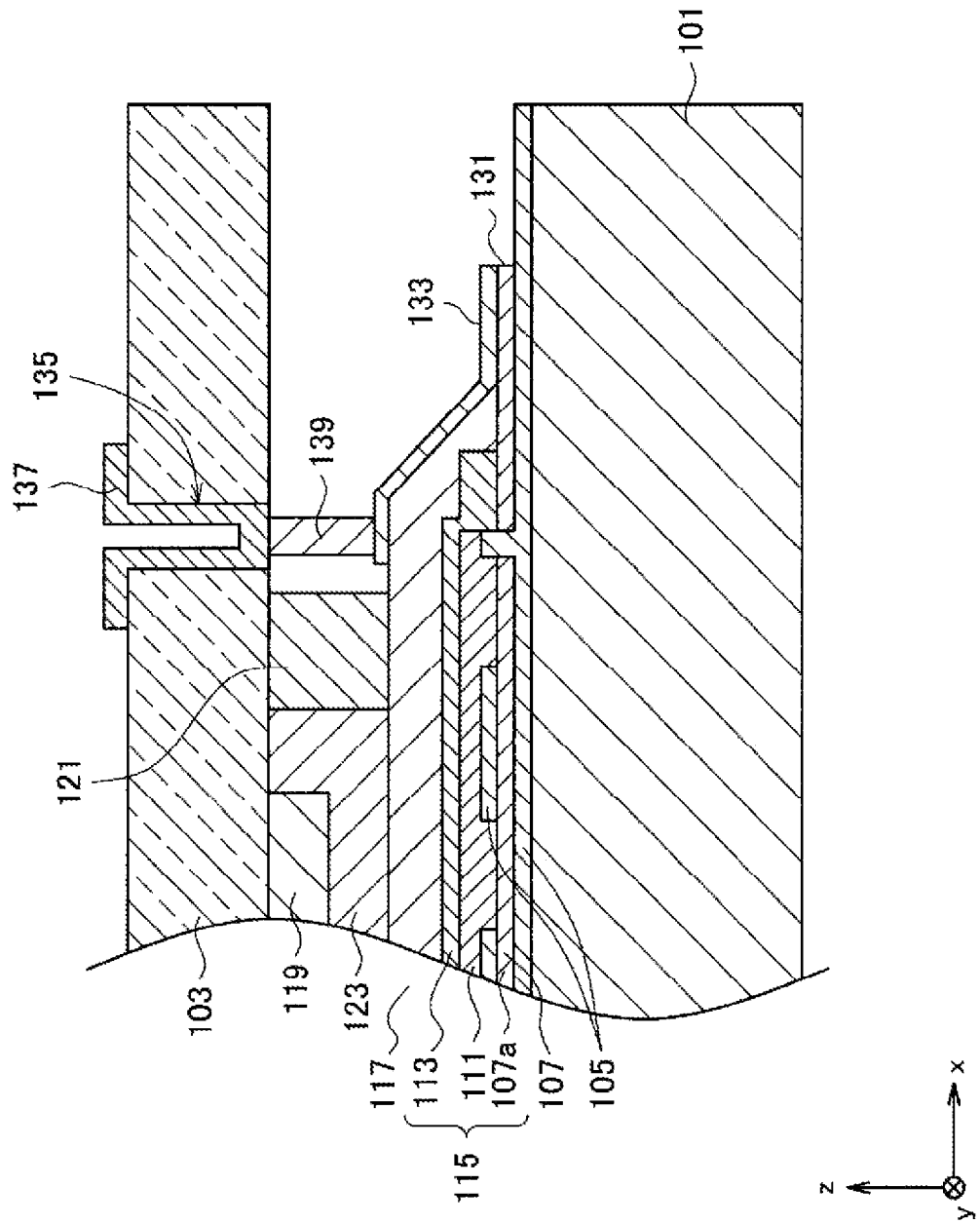
FIG. 16E is an explanatory diagram illustrating a method of manufacturing a display device according to a fifth embodiment.

When the foregoing processes on the first substrate 101 and the second substrate 103 end, the second substrate 103 is bonded to the first substrate 101 (see FIG. 16E). The first substrate 101 and the second substrate 103 are adhered by the sealing material 121. At this time, after positioning is performed in the in-plane direction so that the extraction wiring 133 on the protective film 117 is located immediately below the via-hole 135 and both the extraction wiring 133 and the via-hole 135 are connected by the connection electrode 139, both the extraction wiring 133 and the via-hole 135 are bonded.

Subsequently, a space sealed with the sealing material 121 and located immediately above the pixel region is filled with a sealing resin 123. The sealing resin 123 protects the organic EL element 115 against from water or the like. As the sealing resin 123, any of various known materials used as sealing resins in general organic EL displays can be applied. Then, the display device 5 is completed by performing dicing with a chip size and forming a signal output wiring 141 of which one end is electrically connected to the signal electrode 137 and the other end extends outwards (see FIG. 16F). The signal output wiring 141 may be formed, for example, in accordance with any of various known methods such as ACF. The display device 5 and an external circuit or the like are electrically connected via the signal output wiring 141.

The method of manufacturing the display device 5 according to the fifth embodiment has been described above. As described above, the signal electrode 137 is formed on the second substrate 103 in the display device 5. Then, as a connection structure in which the signal electrode 137 is electrically connected to the first substrate 101, the extraction electrode 131 electrically connected to a wiring for a predetermined signal related to a pixel, the via-hole 135 provided to penetrate through the second substrate 103 in a thickness direction, the extraction wiring 133 electrically connected to the extraction electrode 131 and extending immediately below the via-hole 135, and the connection electrode 139 electrically connecting the via-hole 135 to the extraction wiring 133 are provided. The signal electrode 137 is electrically connected to a wiring for a predetermined signal related to the organic EL element 115 on the first substrate 101 via the via-hole 135, the extraction wiring 133, and the connection electrode 139.

Here, as described with reference to FIGS. 1 and 2, in the general display device 50 of the related art, the signal electrode 527 is provided in a region in which the second substrate 503 is not immediately above and on the outside of the sealing material 521 in the chip surface in consideration of connection with the FPC 529. Accordingly, a chip area has increased in order to ensure the region (that is, the I/O unit 525) in which the signal electrode 527 is provided, on the first substrate 101.

According to the fifth embodiment, however, as described above, since the signal electrode 137 is formed on the second substrate 103, it is not necessary to ensure a region (that is, an I/O unit) in which the signal electrode 137 is provided, on the first substrate 101. Accordingly, for example, in a case in which the display device 5 is fabricated with the same chip area as a display device of the related art such as the display device 50, it is possible to ensure the broader pixel region. Alternatively, for example, in a case in which the display device 5 is fabricated to have the pixel region with the same area as a display device of the related art such as the display device 50, it is possible to reduce the chip area. In this case, it is possible to increase the number of chips acquired per wafer, and thus it is possible to realize a reduction in manufacturing cost.

Note that as a specific process in which each process of the method of manufacturing the display device 5 described with reference to FIGS. 16A to 16F is performed, a process which can be performed at a relatively low temperature so that characteristics of the organic EL element 115 can be maintained can be suitably selected. For example, each process after at least the organic layer 111 is formed is preferably performed so that the temperature of the wafer is kept at 100° C. or less.

3-2. Sixth Embodiment

Figure 17:
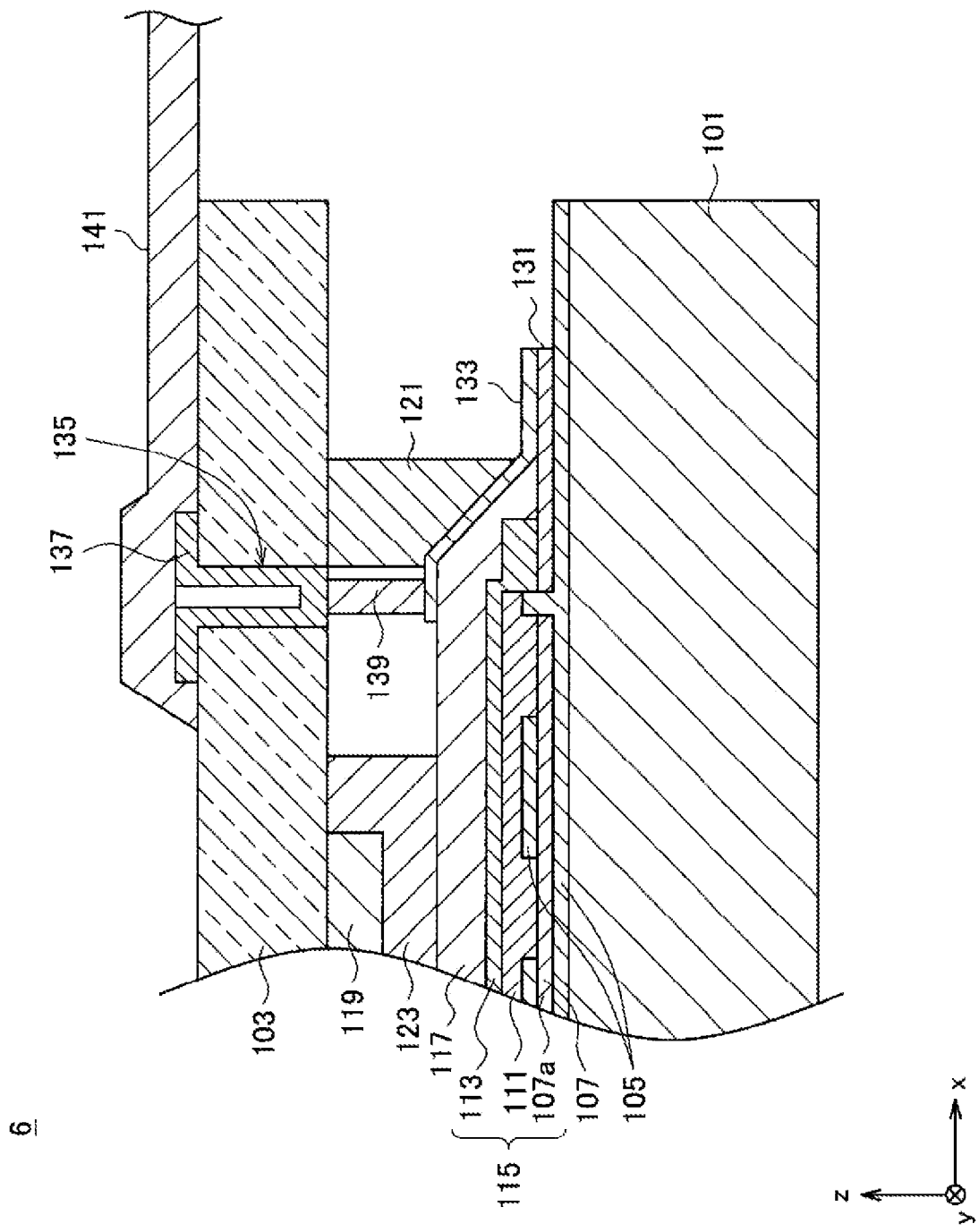
FIG. 17 is a diagram illustrating a schematic configuration of a display device according to a sixth embodiment.

Referring to FIG. 17, a configuration of a display device 6 according to the sixth embodiment will be described. FIG. 17 is a diagram illustrating a schematic configuration of the display device 6 according to the sixth embodiment. FIG. 17 illustrates a sectional view on the x-z plane near the outer circumference of the display device 6 as in FIGS. 16A to 16F.

Referring to FIG. 17, the display device 6 corresponds to a display device in which positions at which the via-hole 135, the signal electrode 137, the connection electrode 139, and the sealing material 121 in the in-plane direction are provided in the display device 5 illustrated in FIG. 16F according to the fifth embodiment are changed. Specifically, as illustrated, in the display device 6, the via-hole 135, the signal electrode 137, and the connection electrode 139 are provided on the inner side of the sealing material 121 in the chip surface. This configuration can be realized by adjusting such a positional relation so that the sealing material 121 is provided on the outside of the via-hole 135 in a region corresponding to the chip surface of the second substrate 103 when the via-hole 135, the signal electrode 137, the connection electrode 139, and the sealing material 121 are formed in the second substrate 103 before bonding.

Note that the other factors of the display device 6 are the same as those of the display device 5 except that the via-hole 135, the signal electrode 137, the connection electrode 139, and the sealing material 121 are disposed. Therefore, the detailed description of the configuration of the display device 6 and the method of manufacturing the display device 6 will be omitted herein.

3-3. Seventh Embodiment

Figure 18:
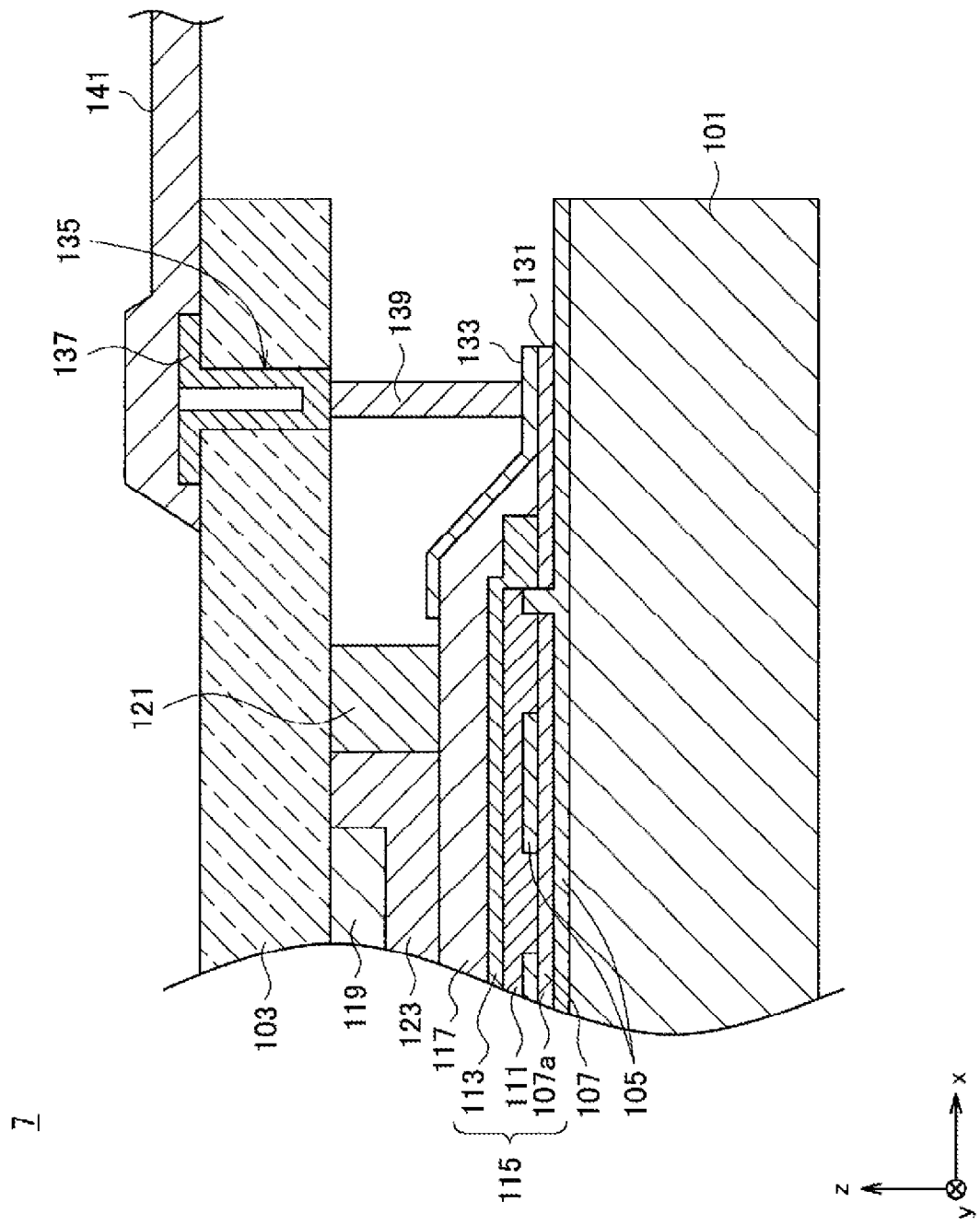
FIG. 18 is a diagram illustrating a schematic configuration of a display device according to a seventh embodiment.

Referring to FIG. 18, a configuration of a display device 7 according to the seventh embodiment will be described. FIG. 18 is a diagram illustrating a schematic configuration of the display device 7 according to the seventh embodiment. FIG. 18 illustrates a sectional view on the x-z plane near the outer circumference of the display device 7 as in FIGS. 16A to 16F.

Referring to FIG. 18, the display device 7 according to the third embodiment corresponds to a display device in which the extraction wiring 133 is not provided in the display device 5 illustrated in FIG. 16F according to the fifth embodiment. Specifically, in the display device 7, the extraction electrode 131 and the signal electrode 137 are electrically connected to each other by forming the connection electrode 139 between the lower surface of the via-hole 135 and the upper surface of the extraction electrode 131 without providing the extraction wiring 133. This configuration can be realized by adjusting the positions at which the via-hole 135, the signal electrode 137, and the connection electrode 139 are formed so that the positions are located immediately above the extraction electrode 131 at the time of bonding the second substrate 103 to the first substrate 101 and by adjusting the length of the connection electrode 139 in the z axis direction so that the lower end of the connection electrode 139 comes into contact with the upper surface of the extraction electrode 131 at the time of bonding the second substrate 103 to the first substrate 101 when the via-hole 135, the signal electrode 137, the connection electrode 139, and the sealing material 121 are formed in the second substrate 103 before the bonding.

Note that other factors of the display device 7 are the same as those of the display device 5 except that the extraction wiring 133 is not provided and the configuration of the via-hole 135, the signal electrode 137, and the connection electrode 139 is accordingly changed. Therefore, the detailed description of the configuration of the display device 7 and the method of manufacturing the display device 7 will be omitted herein.

3-4. Eighth Embodiment

Figure 19:
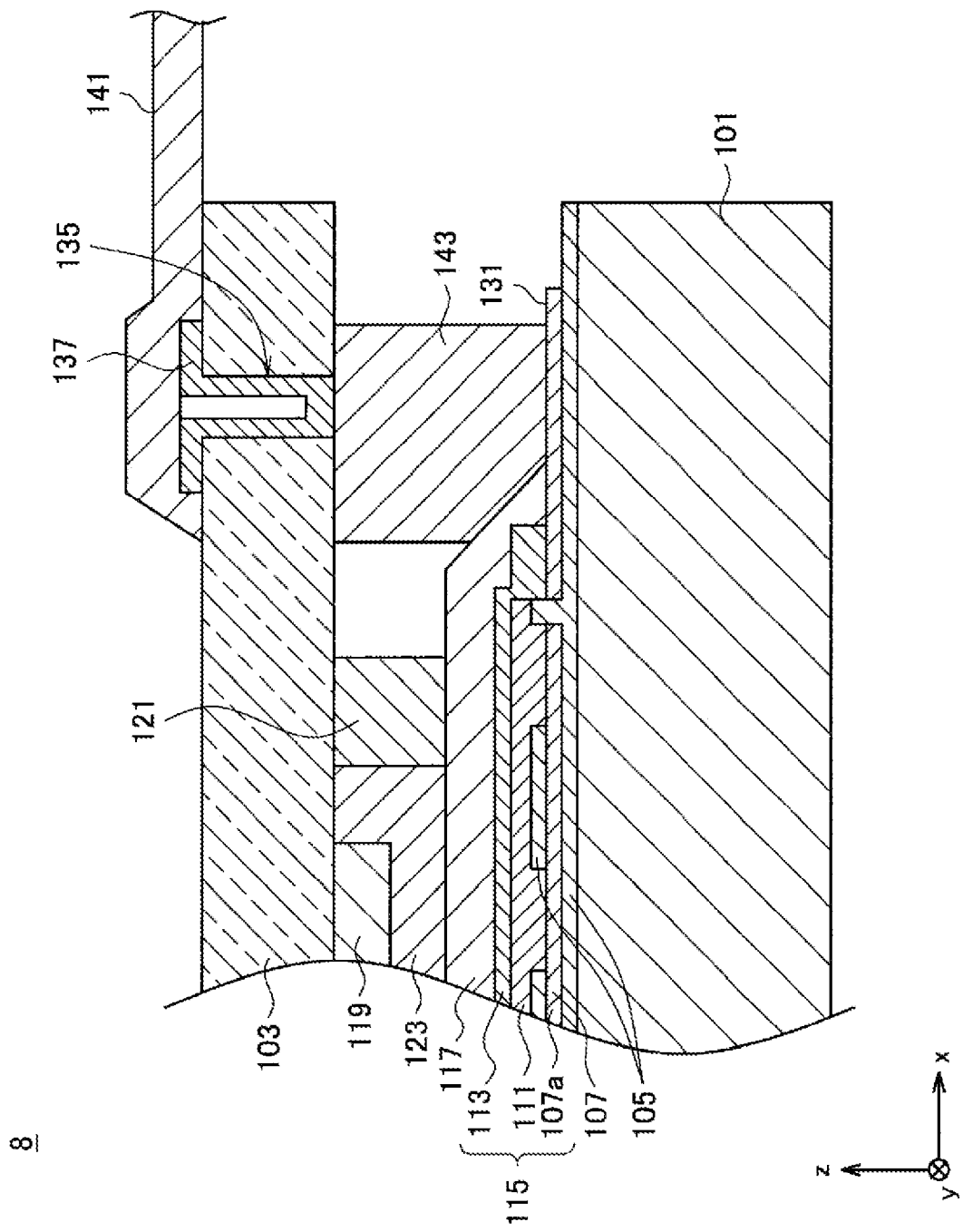
FIG. 19 is a diagram illustrating a schematic configuration of a display device according to an eighth embodiment.

Referring to FIG. 19, a configuration of a display device 8 according to the eighth embodiment will be described. FIG. 19 is a diagram illustrating a schematic configuration of the display device 8 according to the eighth embodiment. FIG. 19 illustrates a sectional view on the x-z plane near the outer circumference of the display device 8 as in FIGS. 16A to 16F.

Referring to FIG. 19, the display device 8 corresponds to a display device in which the sealing material 121, the extraction wiring 133, and the connection electrode 139 are not provided in the display device 5 illustrated in FIG. 16F according to the fifth embodiment. Specifically, in the display device 8, the extraction electrode 131 and the signal electrode 137 are electrically connected to each other by forming a sealing material 143 with conductivity (the conductive sealing material 143) between the lower surface of the via-hole 135 and the upper surface of the extraction electrode 131 without forming the extraction wiring 133 and bonding the first substrate 101 to the second substrate 103. That is, the conductive sealing material 143 also serves as the sealing material 121, the extraction wiring 133, and the connection electrode 139 in the display device 5.

This configuration can be realized by forming the conductive sealing member 143 to come into contact with the lower surface of the via-hole 135 instead of forming the connection electrode 139 and the sealing material 121 in the display device 5 when the via-hole 135 and the signal electrode 137 are formed in the second substrate 103 before the bonding. At this time, the conductive sealing material 143 is adjusted so that the lower end of the conductive sealing material 143 comes into contact with the upper surface of the protective film 117 and the upper surface of the extraction electrode 131 when the second substrate 103 is bonded to the first substrate 101.

Note that other factors of the display device 8 are the same as those of the display device 5 except that the conductive sealing material 143 is provided instead of the sealing material 121, the extraction wiring 133, and the connection electrode 139. Therefore, the detailed description of the configuration of the display device 8 and the method of manufacturing the display device 8 will be omitted herein.

3-5. Ninth Embodiment (3-5-1. Configuration of Display Device)

Referring to FIGS. 20A to 20M, a method of manufacturing a display device 9 according to the ninth embodiment will be described and a configuration of the display device 9 will be described. FIGS. 20A to 20M are explanatory diagrams illustrating the method of manufacturing the display device 9 according to the ninth embodiment. FIGS. 20A to 20M schematically illustrate cross sections on the x-z plane near the outer circumference of the display device 9 in the order of steps in the method of manufacturing the display device 9 and illustrate a process flow of the manufacturing method as in FIGS. 16A to 16F.

In the method of manufacturing the display device 9, steps until the protective film 117 is formed are substantially similar to the steps until the protective film 117 described with reference to FIGS. 9A to 9E is formed in the method of manufacturing the display device 3 according to the above-described third embodiment. Accordingly, hereinafter, processes after the protective film 117 is formed will be described.

When the process of forming the protective film 117 in the first substrate 101 ends, the first substrate 101 is bonded to the second substrate 103 in which the CF layer 119 and the sealing material 121 are formed on the lower surface by the sealing material 121. Further, a space sealed with the sealing material 121 and located immediately above the pixel region is filled with the sealing resin 123 (see FIG. 20A).

The CF layer 119 is similar to the CF layer 119 of the display device 5 according to the fifth embodiment and is formed so that a CF of colors (R, G, and B) with a predetermined area is provided immediately above the pixel region in each organic EL element 115 provided in each pixel when the second substrate 103 is bonded to the first substrate 101. In this way, the display device 9 is a counter CF type of display device as in the display device 5. However, the ninth embodiment is not limited to this example and the display device 9 may be an OCCF type of display device.

In addition, the sealing material 121 is similar to the sealing material 121 of the display device 5 according to the fifth embodiment and is provided to surround the pixel region when the second substrate 103 is bonded to the first substrate 101. The sealing material 121 functions as an adhesive that bonds the first substrate 101 to the second substrate 103 and also has a function of sealing the pixel region.

In addition, the sealing resin 123 is similar to the sealing resin 123 of the display device 5 according to the fifth embodiment and has a function of protecting the organic EL element 115 against water or the like.

Here, in the display device 9, as in the foregoing display device 5 or the like, the first electrode 107a functioning as an anode, an extraction wiring for transmitting a predetermined signal related to the organic EL element 115 to the signal electrode 157 to be described below, and the like are formed in the wiring layer 107. At this time, in the display device 9, the extraction electrode 145 exchanging a predetermined signal related to a pixel with the outside is formed in the wiring layer 107. In the present specification, the extraction electrode 131 in the foregoing fifth to eighth embodiments is referred to as a first extraction electrode 131 and the extraction electrode 145 is referred to as a second extraction electrode 145 in some cases to distinguish these electrodes from each other. As illustrated, the extraction electrode 145 is provided to be located immediately below the sealing material 121 when the second substrate 103 is bonded to the first substrate 101. That is, as illustrated in FIG. 20A, the protective film 117, the sealing material 121, and the second substrate 103 are stacked immediately above the extraction electrode 145 in a state in which the first substrate 101 is bonded to the second substrate 103.

In a way similar to the extraction electrode 131 in the above-described display device 5, the extraction electrode 145 is electrically connected to a wiring for the predetermined signal related to the pixel. In the illustrated example, the extraction electrode 145 is electrically connected to the second electrode 113 that functions as a cathode. That is, the extraction electrode 145 is an electrode that extracts a cathode potential to the outside. FIG. 20A illustrates only one extraction electrode 145. However, in practice, the plurality of extraction electrodes 145 delivering other signals related to the pixels are provided. The number of extraction electrodes 145 is appropriately decided in accordance with the circuit configuration or the like of the display device 9 so that the display device 9 can be appropriately driven.

When the first substrate 101 is bonded to the second substrate 103, a through-hole 147 penetrating the protective film 117, the sealing material 121, and the second substrate 103 in the z axis direction and reaching the front surface of the extraction electrode 145 is subsequently formed immediately above the extraction electrode 145 (see FIG. 20B). The process of forming the through-hole 147 is performed by, for example, a laser. Note that, for example, a diameter of the through-hole 147 is about 100 to 150 µm and a depth of the through-hole 147 (that is, a sum of thicknesses of the protective film 117, the sealing material 121, and the second substrate 103) is about 300 to 700 µm. Specifically, a thickness of each of the protective film 117 and the sealing material 121 is about 3 to 5 µm and a thickness of the second substrate 103 is about 300 to 700 µm.

Subsequently, a conductive material is formed as a film on the inner wall of the through-hole 147 to extend between the upper surface of the second substrate 103 and the extraction electrode 145. That is, a via-hole 155 reaching from the upper surface of the second substrate 103 to the lower surface of the extraction electrode 145 is formed on the protective film 117, the sealing material 121, and the second substrate 103. In addition, at this time, simultaneously, the signal electrode 157 electrically connected to the via-hole 155 is formed by appropriately patterning the conductive material formed as the film on the second substrate 103. Hereinafter, the details of a process of forming the via-hole 155 and the signal electrode 157 will be described with reference to FIGS. 20C to 20G.

In the process of forming the via-hole 155 and the signal electrode 157, a barrier metal and a Cu seed layer (hereinafter collectively referred to as a barrier metal/seed layer 149) are first formed on the upper surface of the second substrate 103 and the inner wall of the through-hole 147 as a film using a known film forming technology (see FIG. 20C). As the barrier metal, for example, Ti or the like is generally used and applied for a barrier metal at the time of a Cu wiring.

Subsequently, a resist mask 151 is formed in a region other than a region (a region in which the via-hole 155 and the signal electrode 157 are formed later) with a predetermined area in the through-hole 147 and the circumference of the through-hole 147 on the second substrate 103 using a known photolithography technology (see FIG. 20D).

Subsequently, Cu is formed as a film by a plating technology (see FIG. 20E). At this time, a Cu film 153 is formed on the barrier metal/seed layer 149 only in a spot in which the resist mask 151 is not provided. That is, the Cu film 153 is formed on the inner wall of the through-hole 147 and in the region with the predetermined area around the through-hole 147 on the second substrate 103.

Subsequently, the resist mask 151 is removed by ashing (see FIG. 20F).

Subsequently, the barrier metal/seed layer 149 which is under the resist mask 151 and is exposed on the second substrate 103 is removed by dry etching (see FIG. 20G). Through the foregoing process, the Cu film 153 is formed on the inner wall of the through-hole 147 and the via-hole 155 is formed. In addition, simultaneously, a signal electrode 157 formed from the Cu film 153 electrically connected to the via-hole 155 is formed on the upper surface of the second substrate 103.

Note that the process of forming the via-hole 155 and the signal electrode 157, for example, in the case in which Cu is used as the conductive material has been described herein, but the ninth embodiment is not limited to this example. As the conductive material of the via-hole 155 and the signal electrode 157 and the method of forming the via-hole 155 and the signal electrode 157, any of various known materials and methods may be used.

When the via-hole 155 and the signal electrode 157 are formed, a bump 165 is subsequently formed on the signal electrode 157. As will be described below, when the display device 9 is modularized to fabricate the display module 37, the signal electrode 157 and a signal electrode 221 provided in the module casing 27 are electrically connected via the bump 165. Hereinafter, the details of a process of forming the bump 165 will be described with reference to FIGS. 20H to 20M.

Figure 20H:
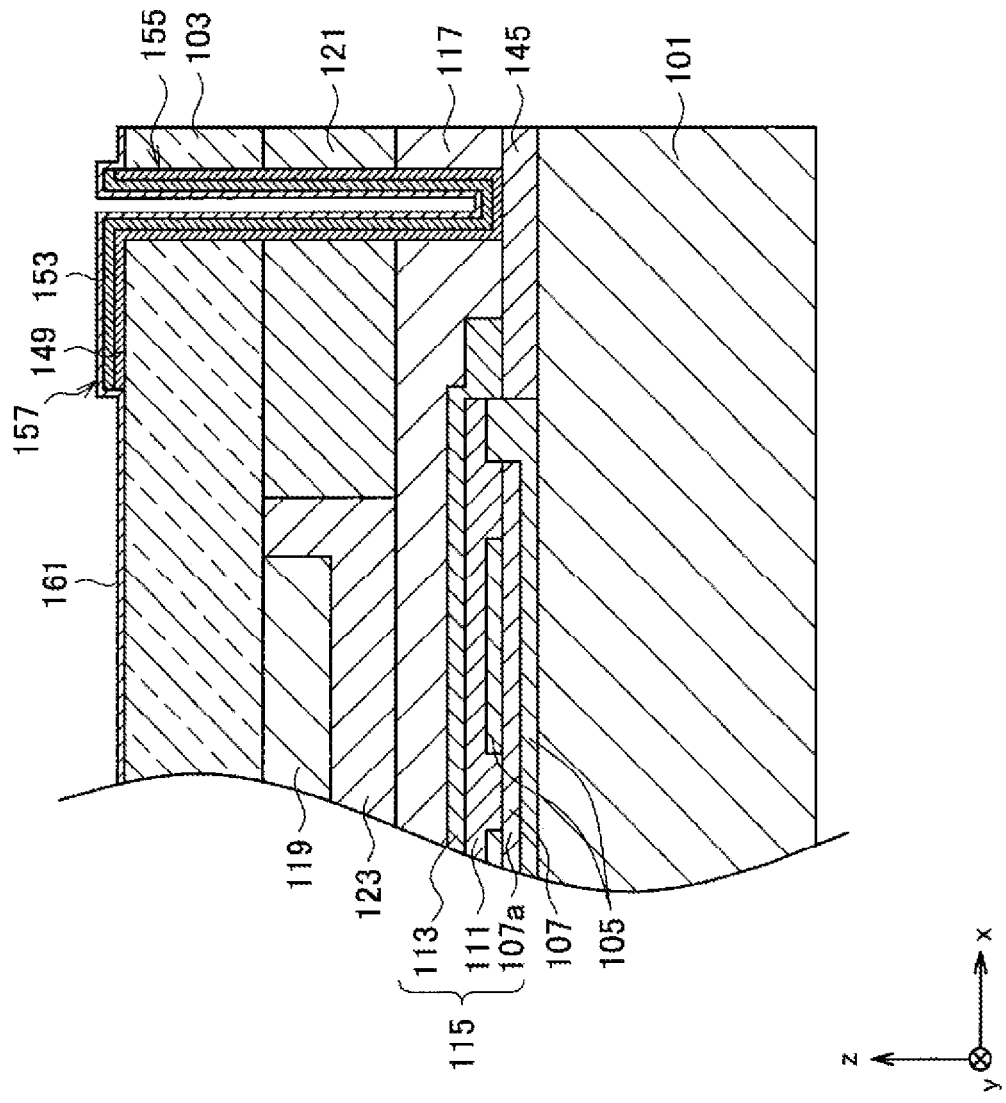
FIG. 20H is an explanatory diagram illustrating a method of manufacturing a display device according to a ninth embodiment.

In the process of forming the bump 165, an under-barrier metal layer 161 is first formed on the upper surface of the second substrate 103, the upper surface of the signal electrode 157, and the inner wall of the via-hole 155 using a known film forming technology (see FIG. 20H). As the under-barrier metal, any of various known materials generally used at the time of forming a bump can be applied.

Figure 20I:
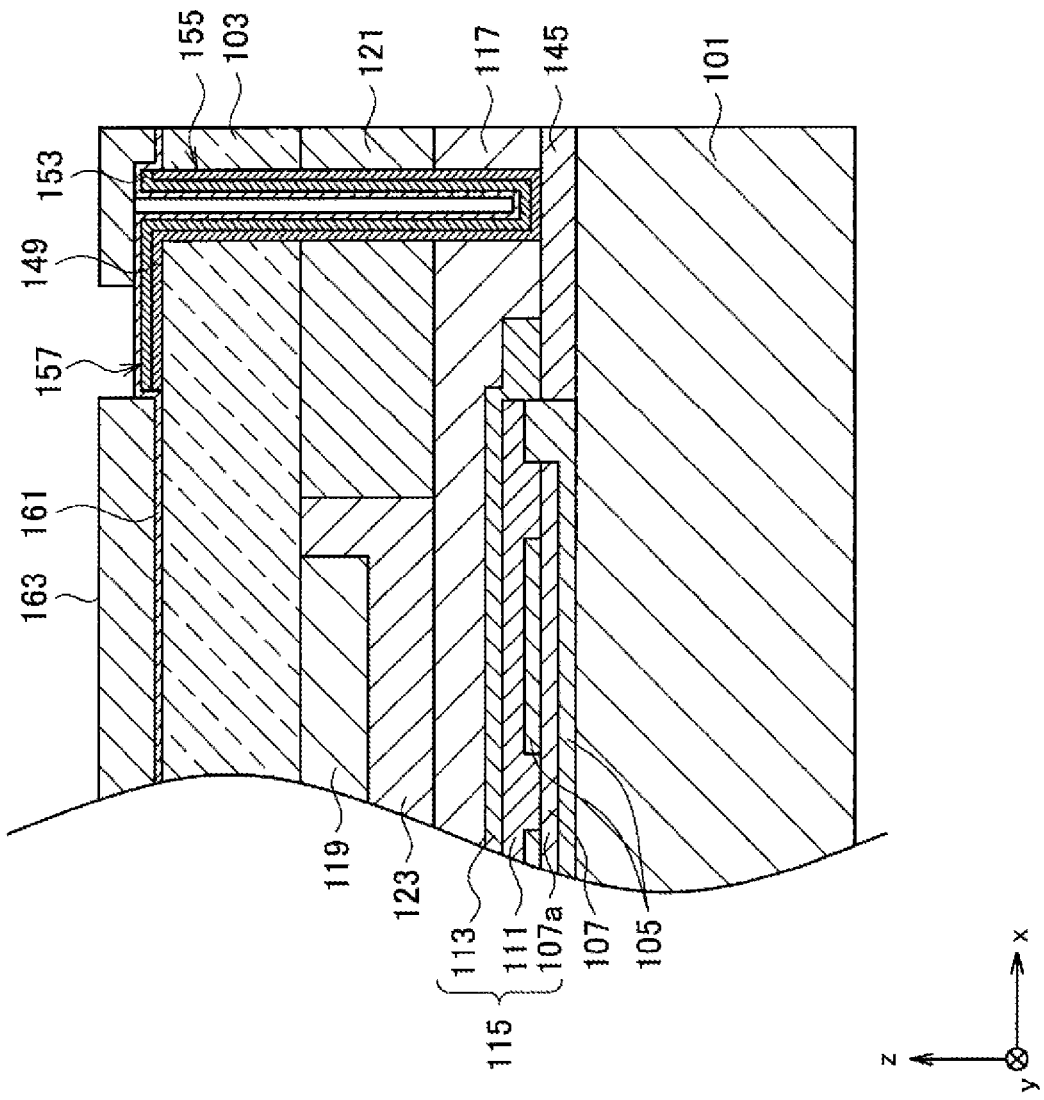
FIG. 20I is an explanatory diagram illustrating a method of manufacturing a display device according to a ninth embodiment.

Subsequently, a resist mask 163 is formed in a region other than a region (a region in which the bump 165 is formed later) with a predetermined area of the upper surface of the signal electrode 157 using a known photolithography technology (see FIG. 20I).

Figure 20J:
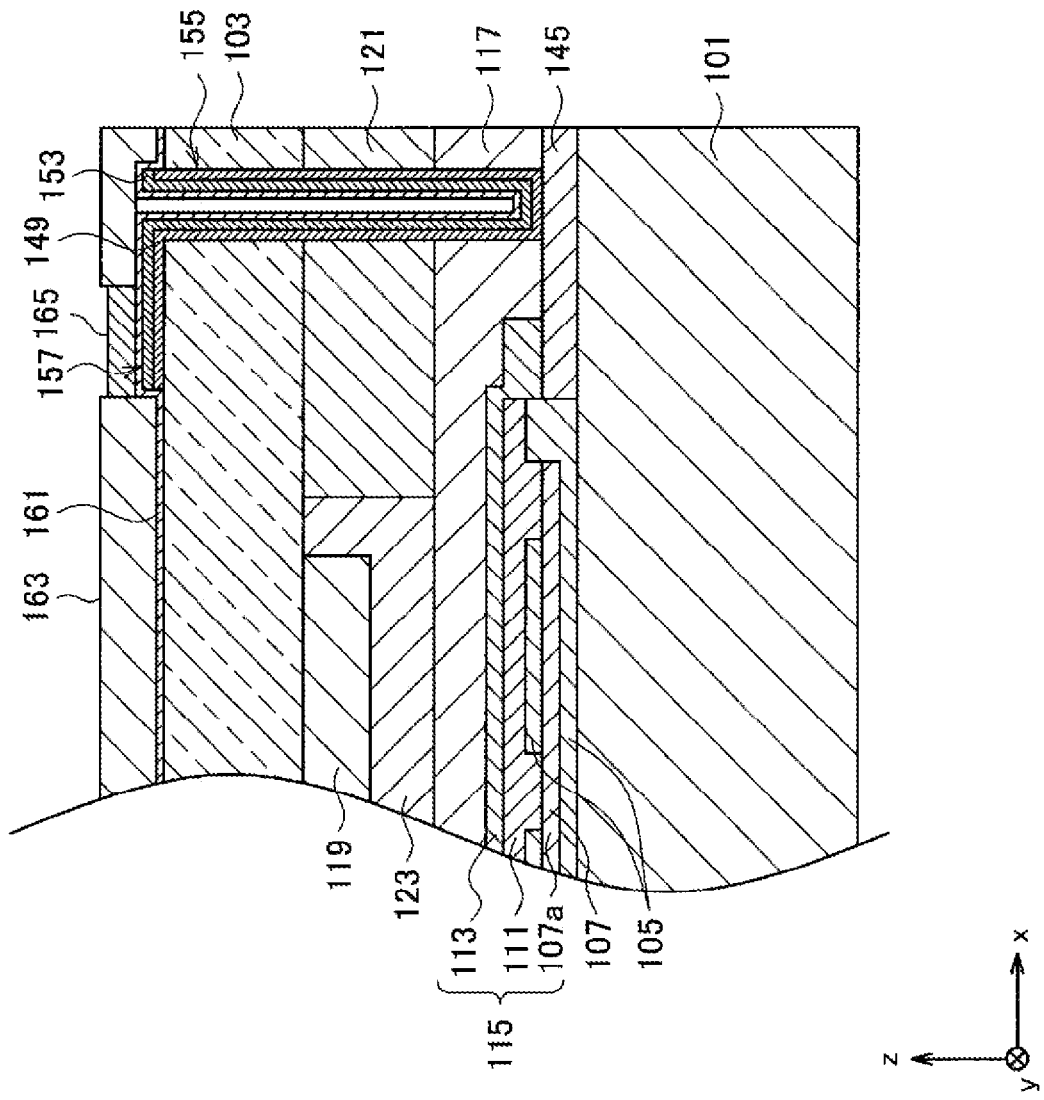
FIG. 20J is an explanatory diagram illustrating a method of manufacturing a display device according to a ninth embodiment.

Subsequently, the bump 165 is formed by a plating method (see FIG. 20J). As a material of the bump 165, for example, any of various known materials used as a general bump material such as an alloy of Sn, Ag, and Cu may be used. At this time, the bump 165 is formed only in a spot in which the resist mask 151 is not provided. That is, the bump 165 is formed in a region with a predetermined area on the upper surface of the signal electrode 157.

Figure 20K:
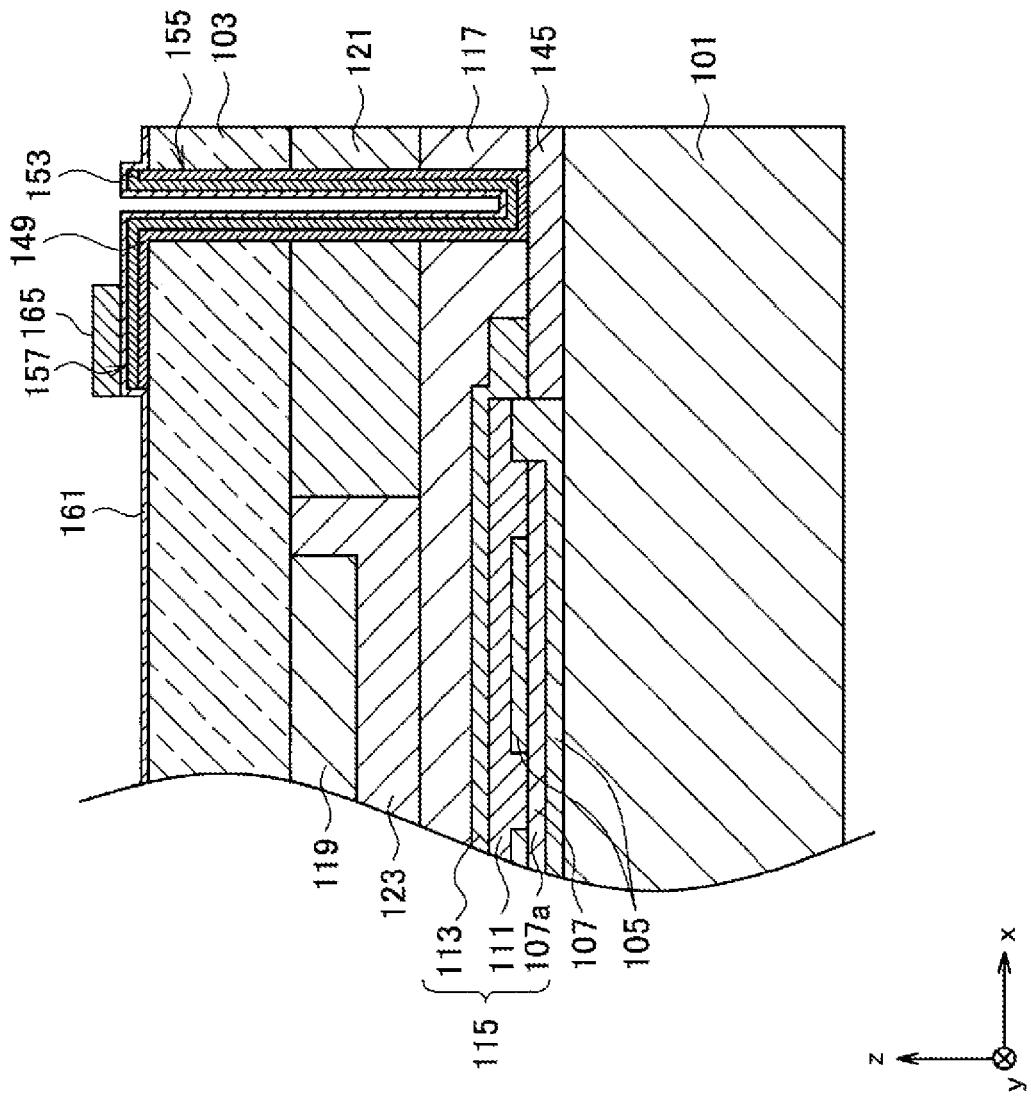
FIG. 20K is an explanatory diagram illustrating a method of manufacturing a display device according to a ninth embodiment.
Figure 20M:
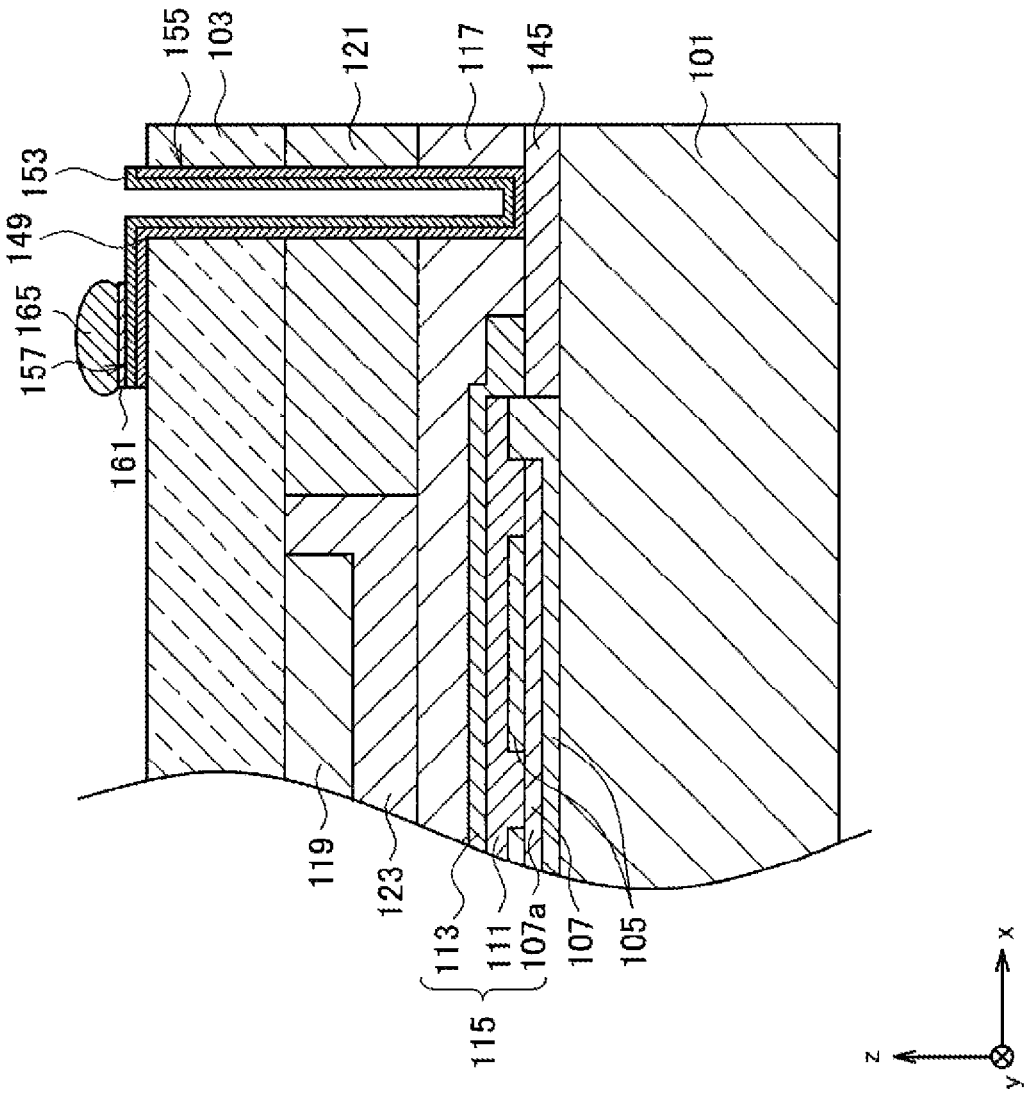
FIG. 20M is an explanatory diagram illustrating a method of manufacturing a display device according to a ninth embodiment.

Subsequently, the resist mask 163 is removed by ashing (see FIG. 20K).

Subsequently, the under-barrier metal layer 161 which is under the resist mask 163 and is exposed on the second substrate 103 and the inner wall of the via-hole 155 is removed by dry etching (see FIG. 20L).

Subsequently, a reflow is performed, and gas bleeding in the bump 165 is performed and the bump 165 is temporarily melted to form a spherical shape. Through the foregoing process, the bump 165 is formed on the signal electrode 157. Then, the display device 9 is completed by performing dicing with a chip size.

Note that the process of forming the bump 165 is not limited to the above-described method and the bump 165 may be formed in accordance with any of various known methods. For example, the bump 165 may be formed by a gold stud bump technology. In a case in which the gold stud bump technology is used, the bump can be formed on the signal electrode 157 by a bonder.

The method of manufacturing the display device 9 according to the ninth embodiment has been described above. As described above, in the display device 9, the signal electrode 157 is formed on the second substrate 103. Then, as a connection structure in which the signal electrode 157 is electrically connected to the first substrate 101, the extraction electrode 145 located immediately below the sealing material 121 and extracting a signal related to the organic EL element 115 on the first substrate 101 and the via-hole 155 provided to penetrate the second substrate 103, the sealing material 121, and the protective film 117 and reach the extraction electrode 145 are provided. The extraction electrode 145 is electrically connected to the signal electrode 157 via the via-hole 155.

In this way, in the display device 9, the signal electrode 157 is provided at a position corresponding to a portion immediately above the sealing material 121 in the chip surface. Accordingly, as in the display device 5 according to the above-described fifth embodiment, it is not necessary to ensure a region (that is, the I/O unit) in which the signal electrode 157 is provided on the first substrate 101. Accordingly, for example, in a case in which the display device 9 is fabricated with the same chip area as a display device of the related art such as the display device 50, it is possible to ensure the broader pixel region. Alternatively, for example, in a case in which the display device 9 is fabricated to have the pixel region with the same area as a display device of the related art such as the display device 50, it is possible to reduce the chip area. In this case, it is possible to increase the number of chips acquired per wafer, and thus it is possible to realize a reduction in manufacturing cost.

Note that as a specific process in which each process of the method of manufacturing the display device 9 described with reference to FIGS. 20A to 20M is performed, a process which can be performed at a relatively low temperature so that characteristics of the organic EL element 115 can be maintained can be suitably selected. For example, each process after at least the organic layer 111 is formed is preferably performed so that the temperature of the wafer is kept at 100° C. or less. For example, by forming the bump 165 by gold stud bump technology, as described above, it is possible to respond to a request for low temperature of the process.

(3-5-2. Configuration of Display Module)

Figure 21:
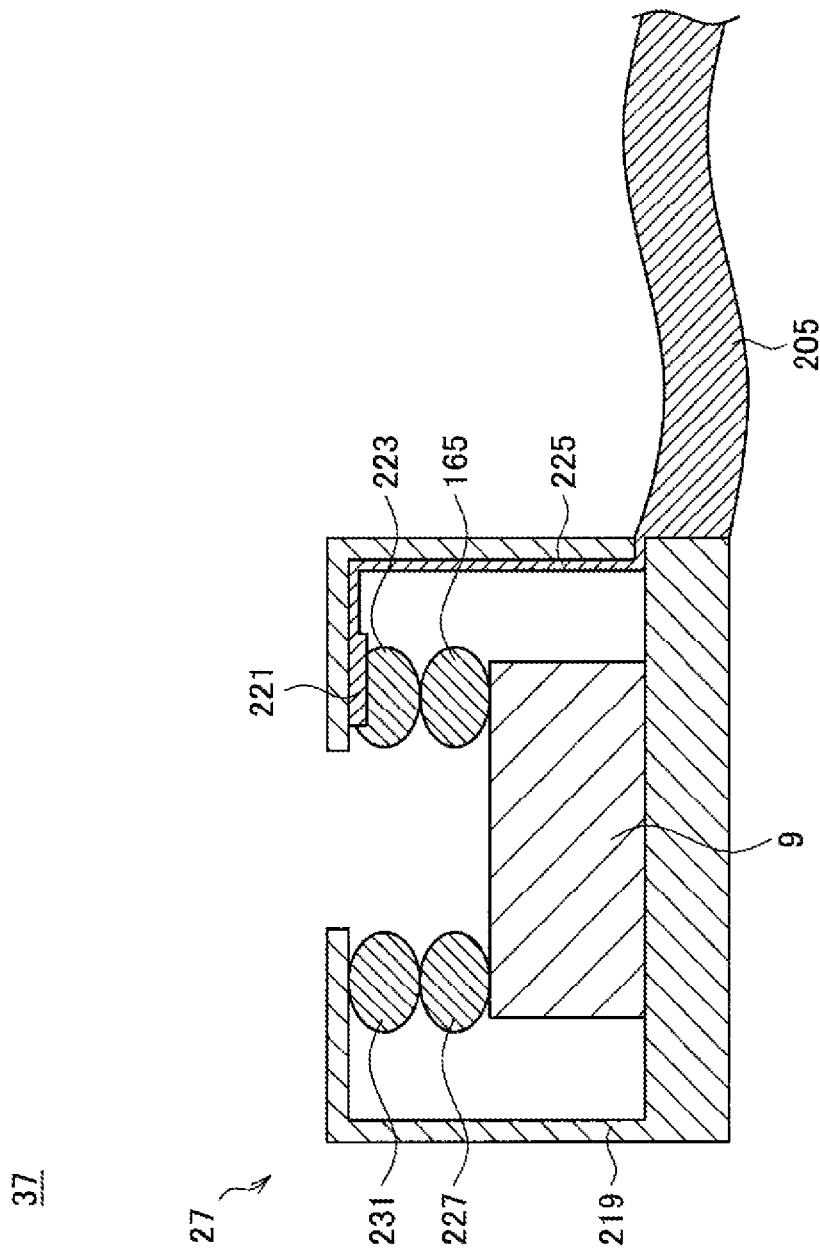
FIG. 21 is a diagram illustrating a schematic configuration of a display module according to a ninth embodiment.

Referring to FIG. 21, a configuration of a display module 37 according to the third embodiment will be described. FIG. 21 is a diagram illustrating a schematic configuration of the display module 37 according to the ninth embodiment.

FIG. 21 illustrates a sectional view of the display module 37. As illustrated in FIG. 21, the display module 37 is configured such that the display device 9 is stored in the module casing 27.

The module case 27 is configured such that the signal electrode 221 electrically connected to the signal electrode 157 of the display device 9 is provided in a casing body 219. The casing body 219 has a substantially rectangular shape. In addition, the FPC 205 electrically connected to the signal electrode 221 and extending outwards is connected to the bottom plate of the module casing 27.

As illustrated, the display device 9 is stored inside the module casing 27 in a direction in which the upper surface which is a display surface of the display device 9 faces the inner surface of the top plate of the casing body 219. Specifically, for example, the casing body 219 is configured such that the bottom plate, and the side wall and the top plate can be separated, and the display device 9 is placed on the bottom plate to be fixed. Thereafter, by mounting the side wall and the top plate on the bottom plate, the display device 9 is stored inside module casing 27. A method of fixing the display device 9 to the bottom plate is not limited and any of various known methods may be adopted. As illustrated in FIG. 21, an opening corresponding to the pixel region of the display device 9 is provided in the middle of the top plate of the casing body 219. When the display device 9 is stored in the module casing 27, the pixel region of the display device 9 is exposed from the opening.

In addition, in a region in the opening is not provided on the inner surface of the top plate of the casing body 219, the signal electrode 221 is disposed at a position facing the bump 165 of the display device 9. Hereinafter, the signal electrode 157 of the display device 9 is also referred to as a device-side signal electrode 157 and the signal electrode 221 provided in the module casing 27 is also referred to as a casing-side signal electrode 221 to distinguish these electrodes from each other. The bump 223 is provided on the casing-side signal electrode 221. Thus, when the display device 9 is stored in the module casing 27, the bumps 165 and 223 are subjected to flip chip bonding to electrically connect the device-side signal electrode 157 to the casing-side signal electrode 221. A wiring 225 electrically connecting the casing-side signal electrode 221 to the FPC 205 is formed on the wall surface of the casing body 219. Thus, the device-side signal electrode 157 and the FPC 205 are electrically connected by the flip chip bonding of the bumps 165 and 223 and the wiring 225.

Here, the device-side signal electrodes 157 are not necessarily equally dispersed and arranged in the chip surface of the display device 9. Accordingly, as described above, when the bumps 165 and 223 are subjected to flip chip bonding, connection spots of the bumps 165 and 223 are concentrated on a partial region in a horizontal surface in the display module 37 in some cases. In this way, when the connection spots of the bumps 165 and 223 in the horizontal surface have a biased distribution, it is difficult to maintain parallelism of the display device 9 with respect to the module casing 27 and there is concern of reliability of the display module 37 deteriorating. Accordingly, in order to maintain the parallelism of the display device 9 with respect to the module casing 27, as necessary, in the display module 37, a dummy bump 227 may be formed in the display device 9 and a dummy bump 231 may be formed in the module casing 27. The dummy bumps 227 and 231 can be appropriately provided so that a distribution of the bumps 165, 223, 227, and 231 including the actually conducted bumps 165 and 223 is substantially uniform in the horizontal surface. When the display device 9 is stored in the module casing 27, an inclination of the display device 9 with respect to the module casing 27 can be suppressed by performing flip chip bonding on the dummy bumps 227 and 231, and thus the display module 37 with high reliability can be realized.

(3-5-3. Modification Examples)

In the above-described manufacturing method, the through-hole 147 is collectively formed by a laser when the through-hole 147 is formed in the second substrate 103, the sealing material 121, and the protective film 117 (that is, when the extraction electrode 145 is opened) in the process of forming the via-hole 155 connecting the signal electrode 157 to the extraction electrode 145. However, the ninth embodiment is not limited to this example. Here, according to a modification example of the ninth embodiment, a case in which the opening of the extraction electrode 145 is opened in accordance with another method will be described.

(3-5-3-1. Use of Laser Processing and Dry Etching in Combination)

In general, in a case in which a through-hole formed of another material is collectively processed by a laser, it is necessary to control a condition of the laser precisely. Therefore, it is difficult to control the condition. From this viewpoint, as a processing technology, dry etching can be said to be excellent in controllability. On the other hand, since a processing speed in the dry etching depends on an etching rate, acceleration is difficult. That is, the laser processing can be said to be excellent from the viewpoint of the processing speed.

In this way, the laser processing and the dry etching have an advantage and a disadvantage in processing accuracy and a processing speed. Accordingly, according to a modification example of the ninth embodiment, the through-hole 147 is formed by using the laser processing and the dry etching in combination. Specifically, according to the modification example, the second substrate 103 which is a relatively thick processing target is processed by the laser processing of which a processing speed is fast. On the other hand, in order to suppress damage on the front surface of the extraction electrode 145 as much as possible, processing is performed on the protective film 117 coming into contact with the extraction electrode 145 by dry etching with high controllability.

Hereinafter, a method of opening the extraction electrode 145 using the laser processing and the dry etching performed in combination will be described in more detail with reference to FIGS. 22A to 22D. FIGS. 22A to 22D are explanatory diagrams illustrating a method of opening an extraction electrode 145 using the laser processing and the dry etching in combination. FIGS. 22A to 22D schematically illustrate cross sections on the x-z plane near the outer circumference of a display device according to the modification example in the order of steps in a processing method for the opening of the extraction electrode 145 and illustrate a process flow in the processing method as in FIGS. 20A to 20M.

In the processing method for the opening of the extraction electrode 145 according to the modification example, in a state illustrated in FIG. 20A described above (that is, a state in which the first substrate 101 is bonded to the second substrate 103), a through-hole is first formed in the second substrate 103 by the laser processing (see FIG. 22A). For example, as described above, while the thickness of the second substrate 103 is about 300 to 700 μm, as described above, the thicknesses of the sealing material 121 and the protective film 117 are both about 3 to 5 μm. Accordingly, by processing the through-hole in the second substrate 103 with the relatively large thickness by the laser processing, it is possible to form the through-hole in a shorter processing time.

Subsequently, a through-hole is formed in the sealing material 121 by the laser processing (see FIG. 22B). Note that in the illustrated example, the through-holes are processed in the second substrate 103 and the sealing material 121 step by step, but this processing may be collectively performed. Alternatively, the processing of the sealing material 121 may be performed by the dry etching.

Figure 22C:
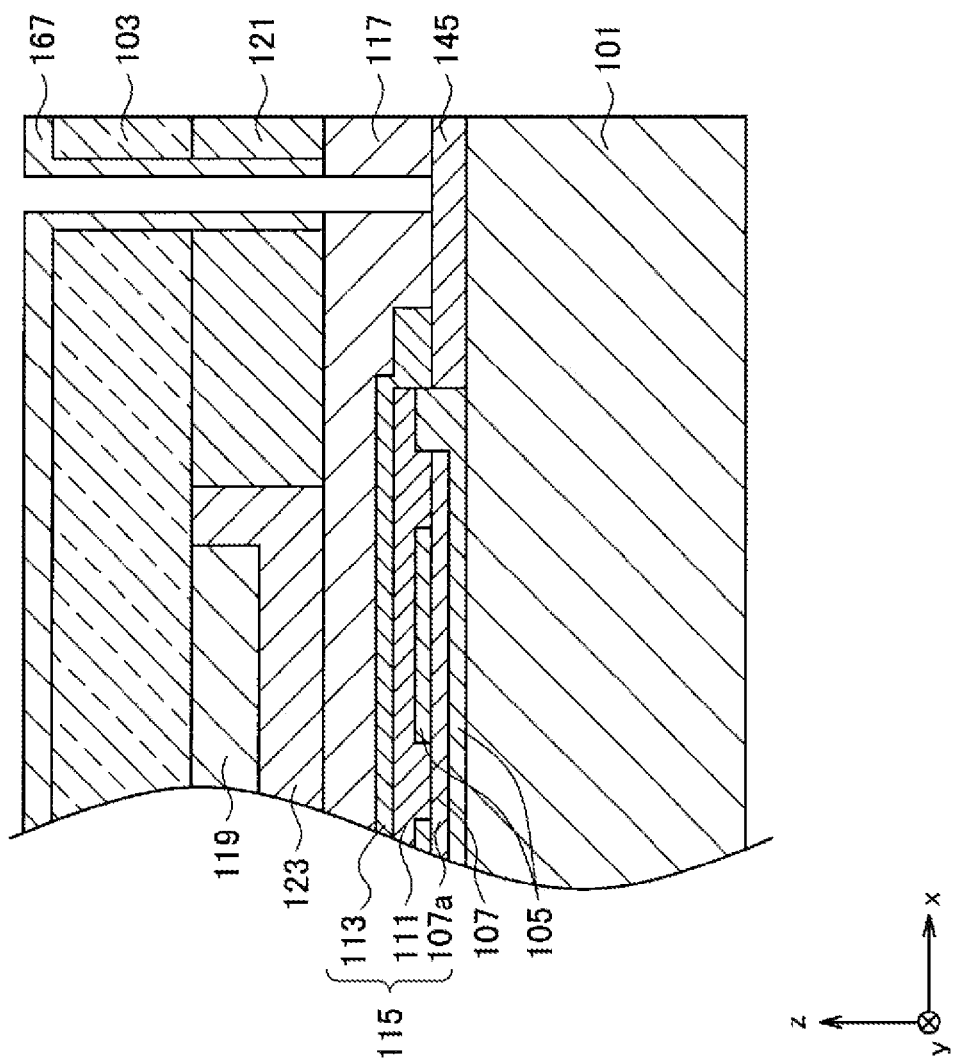
FIG. 22C is an explanatory diagram illustrating a method of opening an extraction electrode using laser processing and dry etching in combination.

Subsequently, a resist mask 167 is provided so that only the bottom portions of the through-holes provided in the second substrate 103 and the sealing material 121 are processed, and then a through-hole reaching the extraction electrode 145 is formed in the protective film 117 by dry etching (see FIG. 22C). Then, by removing the resist mask 167 by ashing, the through-hole 147 is formed, that is, the extraction electrode 145 is opened (see FIG. 22D).

Here, for example, the protective film 117 and the extraction electrode 145 can be respectively formed of a material such as SiN and Al widely used in semiconductor processes. For materials widely used in such semiconductor processes, adjustment of an etching rate or the like at the time of the dry etching can be controlled with high accuracy on the basis of past much knowledge. In addition, in a case in which SiN and AL are respectively used as the materials of the protective film 117 and the extraction electrode 145, selectivity can be sufficiently ensured. Accordingly, by processing the through-hole in the protective film 117 by the dry etching, it is possible to form the through-hole while further suppressing damage on the front surface of the extraction electrode 145.

(3-5-3-2. Modification Example in which Second Substrate with Small Diameter is Used)

As described above, in the display device 9 according to the ninth embodiment, the thickness of the second substrate 103 is considerably greater than the thicknesses of the sealing material 121 and the protective film 117. Accordingly, with regard to TAT of the process of forming the through-hole 147, a processing time on the second substrate 103 is rate-limited. Accordingly, according to another modification example of the ninth embodiment, a second substrate with a smaller diameter than the above-described display device 9 is used. Specifically, in the modification example, the second substrate with a small diameter to the degree that the second substrate is not immediately above at least a partial region of the extraction electrode 145 is used. Thus, when the extraction electrode 145 is opened, it is not necessary to process the second substrate and only the sealing material 121 and the protective film 117 may be processed. Accordingly, it is possible to shorten a processing time of the process of opening the extraction electrode 145.

Figure 23A:
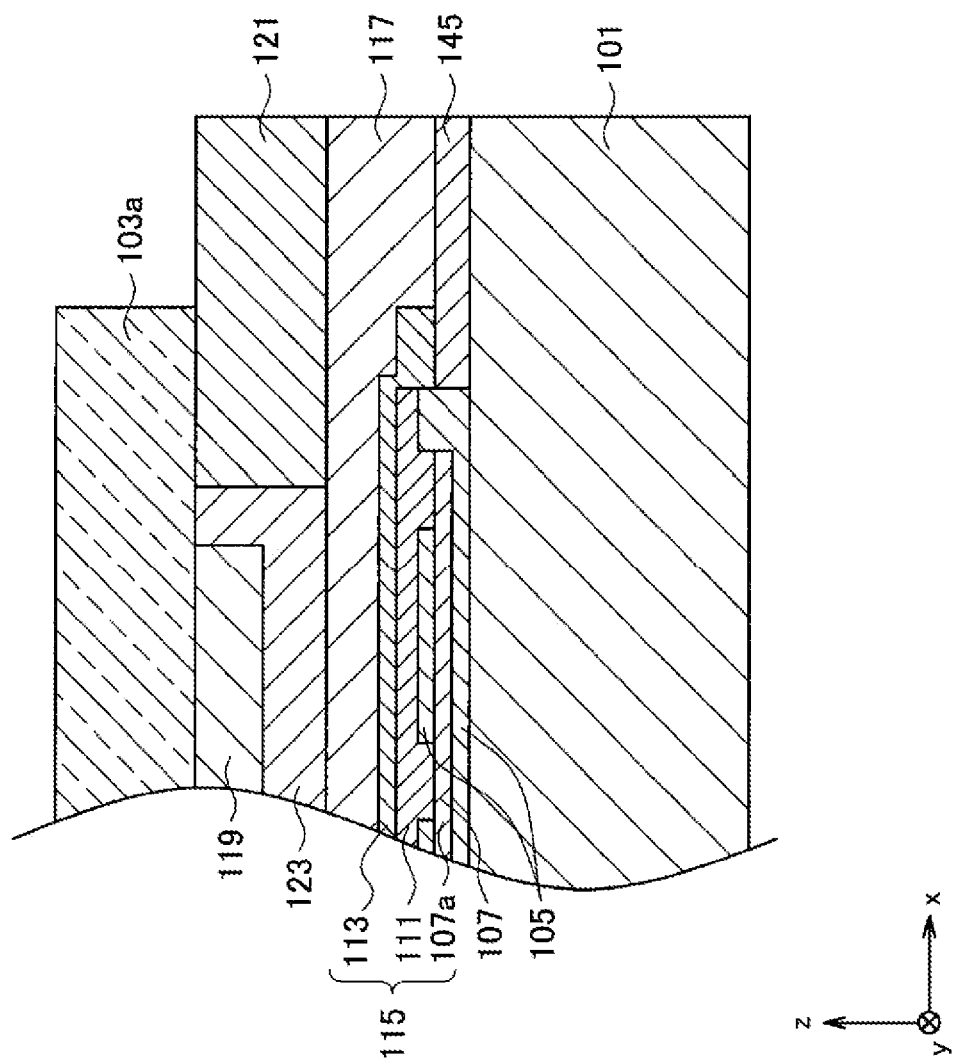
FIG. 23A is an explanatory diagram illustrating a processing method for an opening of an extraction electrode in a case in which a second substrate with a small diameter is used.

Hereinafter, a processing method for an opening of the extraction electrode 145 in a case in which the second substrate with the small diameter is used will be described in more detail with reference to FIGS. 23A to 23C. FIGS. 23A to 23C are explanatory diagrams illustrating the processing method for the opening of the extraction electrode 145 in a case in which a second substrate with a small diameter is used. FIGS. 23A to 23C schematically illustrate cross sections on the x-z plane near the outer circumference of a display device according to the modification example in the order of steps in the processing method for the opening of the extraction electrode 145 and illustrate a process flow in the processing method as in FIGS. 20A to 20M.

FIG. 23A illustrates a state in which the first substrate 101 is bonded to a second substrate 103a before the extraction electrode 145 is opened. The second substrate 103a is a substrate with a smaller diameter than the second substrate 103 of the above-described display device 9, and the outer circumference of the diameter is adjusted to be located immediately above the extraction electrode 145. That is, the second substrate 103a is not immediately above at least the partial region of the extraction electrode 145.

In the processing method for the opening of the extraction electrode 145 according to the modification example, in the state illustrated in FIG. 23A, a resist mask 169 is provided using a known photolithography technology so that only a partial region (a region in which a through-hole 147a is desired to be provided) on the sealing material 121 is first processed (see FIG. 23B).

Then, the sealing material 121 and the protective film 117 are etched by dry etching to expose the front surface of the extraction electrode 145 (see FIG. 23C). Thus, the extraction electrode 145 is opened. By performing a process or the like of forming, for example, the Cu layer described with reference to FIGS. 20C to 20G on the opened extraction electrode 145, a film (that is, a wiring) formed of a conductive material extending from the upper surface of the second substrate 103 to the extraction electrode 145 is formed along edges of the second substrate 103, the sealing material 121, and the protective film 117 is formed. The signal electrode 137 provided on the upper surface of the second substrate 103 is electrically connected to the extraction electrode 145 by the wiring.

In accordance with the above-described processing method, since it is not necessary to process the second substrate 103a, it is possible to open the extraction electrode 145 in a shorter processing time. Note that the sealing material 121 and the protective film 117 are both processed by the dry etching in the above-described processing method. However, for example, the sealing material 121 may be processed by laser processing or the protective film 117 may be processed by dry etching.

3-6. Tenth Embodiment

Referring to FIGS. 24A to 24H, a method of manufacturing a display device 10 according to the tenth embodiment will be described and a configuration of the display device 10 will be described. FIGS. 24A to 24H are explanatory diagrams illustrating the method of manufacturing the display device 10 according to the tenth embodiment. FIGS. 24A to 24H schematically illustrate cross sections on the x-z plane near the outer circumference of the display device 10 in the order of steps in the method of manufacturing the display device 10 and illustrate a process flow of the manufacturing method as in FIGS. 20A to 20M.

Here, the display device 10 according to the tenth embodiment is also the same as the display device 9 according to the above-described ninth embodiment in that the extraction electrode 145 is provided immediately below the sealing material 121, the signal electrode 157 is provided on the upper surface of the second substrate 103, and the display device 10 has a connection structure in which the extraction electrode 145 and the signal electrode 157 are electrically connected by a via-hole penetrating the second substrate 103, the sealing material 121, and the protective film 117. The display device 10 is different from the display device 9 in a method of forming the connection structure.

Figure 24A:
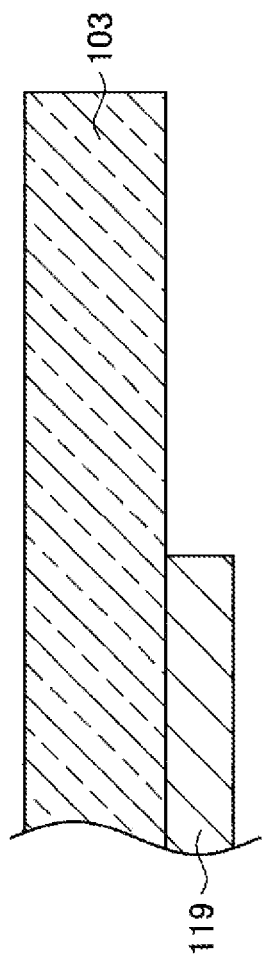
FIG. 24A is an explanatory diagram illustrating a method of manufacturing a display device according to a tenth embodiment.

Specifically, in a method of manufacturing the display device 10, the CF layer 119 is first formed on the lower surface of the second substrate 103 before the second substrate 103 is bonded to the first substrate 101 (see FIG. 24A).

Subsequently, a through-hole is provided in the second substrate 103 (see FIG. 24B). The through-hole is formed in accordance, for example, with any of various known methods such as laser processing or drill processing.

Figure 24C:
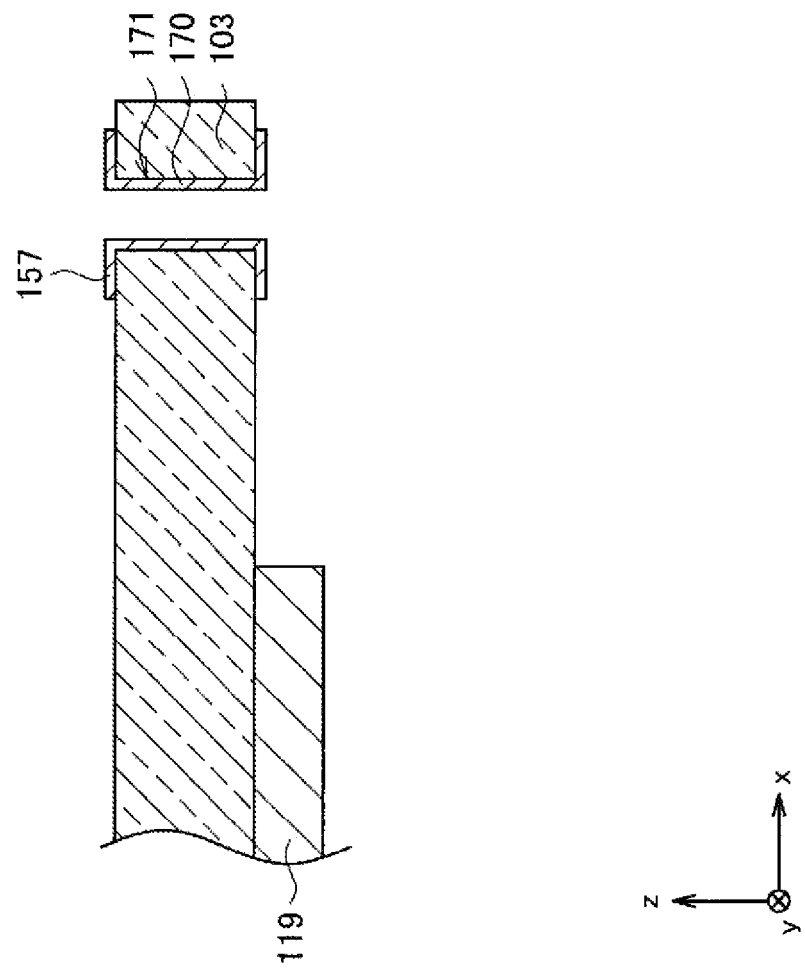
FIG. 24C is an explanatory diagram illustrating a method of manufacturing a display device according to a tenth embodiment.
Figure 24D:
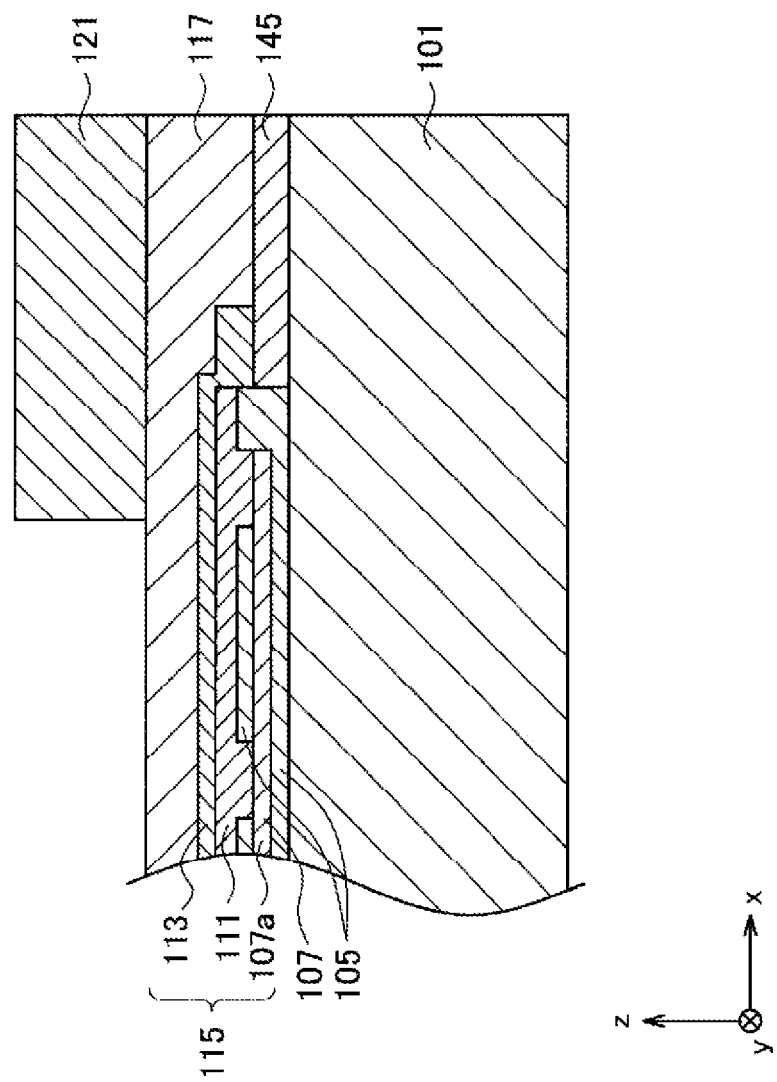
FIG. 24D is an explanatory diagram illustrating a method of manufacturing a display device according to a tenth embodiment.

Subsequently, a conductive film 170 formed of a conductive material is formed on the inner wall of the through-hole to extend between the upper surface and the lower surface of the second substrate 103 (see FIG. 24C). That is, a via-hole 171 is formed in the second substrate 103. The conductive material may be formed as a film in accordance with, for example, any of various known methods such as a semiadditive method. In addition, the via-hole 171 is formed so that the via-hole 171 is located immediately above the extraction electrode 145 (more precisely, immediately above the via-hole 173 provided in the first substrate 101 to be described below) when the second substrate 103 is bonded to the first substrate 101. Further, at this time, the signal electrode 157 electrically connected to the via-hole 171 is formed on the upper surface of the second substrate 103.

On the other hand, the following process is performed on the first substrate 101 concurrently with the foregoing process on the second substrate 103. The sealing material 121 is first formed on the first substrate 101 in which the process of forming the protective film 117 is formed (see FIG. 24D).

The sealing material 121 is provided at a position at which the sealing material 121 surrounds the pixel region when the second substrate 103 is bonded to the first substrate 101. Note that steps until the protective film 117 is formed in the first substrate 101 are substantially similar to the steps until the protective film 117 described with reference to FIGS. 9A to 9E is formed in the method of manufacturing the display device 3 according to the above-described third embodiment.

Figure 24E:
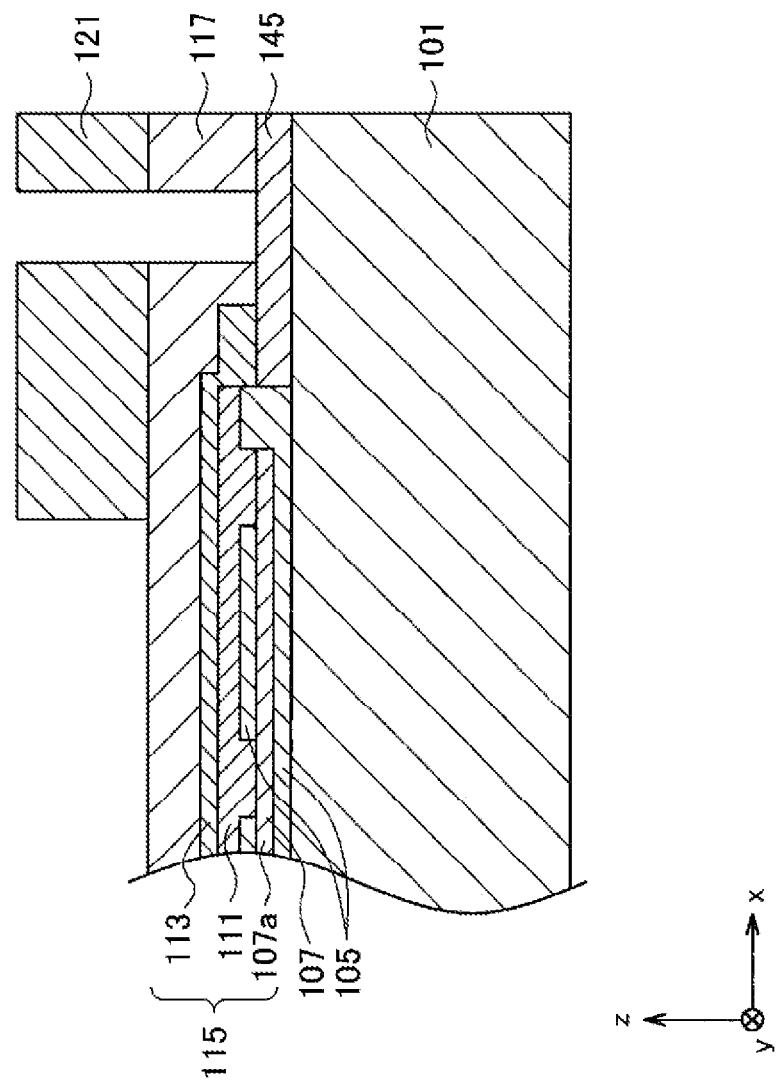
FIG. 24E is an explanatory diagram illustrating a method of manufacturing a display device according to a tenth embodiment.

Subsequently, a through hole reaching the extraction electrode 145 is provided in the sealing material 121 and the protective film 117 (see FIG. 24E). The through hole is formed, for example, in accordance with any of various known methods such as laser processing or dry etching.

Figure 24F:
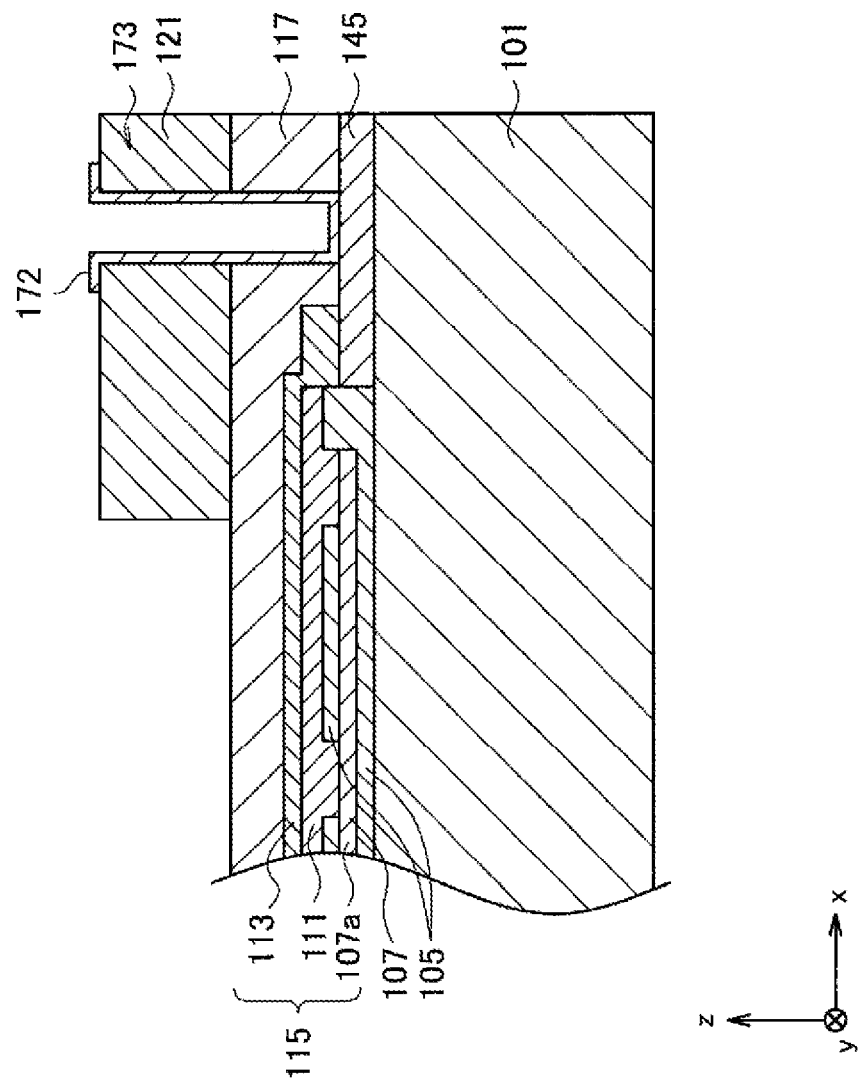
FIG. 24F is an explanatory diagram illustrating a method of manufacturing a display device according to a tenth embodiment.

Subsequently, a conductive film 172 formed of a conductive material is formed on the inner wall of the through-hole to extend between the upper surface of the sealing material 121 and the extraction electrode 145 (see FIG. 24F). That is, a via-hole 173 reaching the extraction electrode 145 is formed in the sealing material 121 and the protective film 117. The conductive material may be formed as a film, for example, in accordance with any of various known methods such as a sputtering method or a process of forming a copper wiring described with reference to FIGS. 20C to 20G.

Figure 24G:
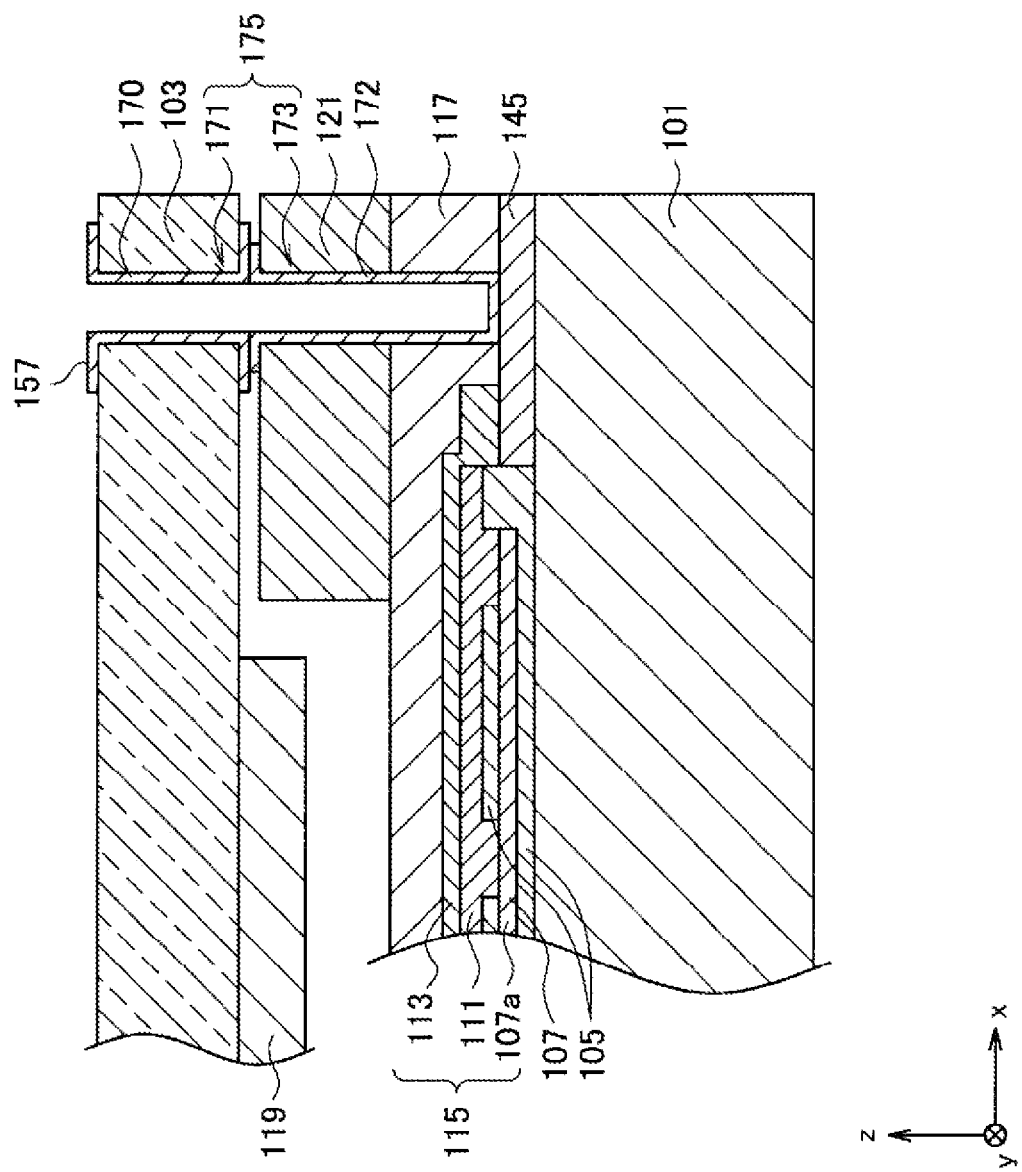
FIG. 24G is an explanatory diagram illustrating a method of manufacturing a display device according to a tenth embodiment.

When the foregoing processes end on the first substrate 101 and the second substrate 103, the second substrate 103 is bonded to the first substrate 101 (see FIG. 24G). The first substrate 101 and the second substrate 103 are adhered by the sealing material 121. At this time, after positioning is performed in the in-plane direction so that the lower surface of the via-hole 171 provided in the second substrate 103 is electrically connected to the upper surface of the via-hole 173 provided in the first substrate 101, both the substrates are bonded. Thus, a via-hole 175 electrically connecting the signal electrode 157 on the upper surface of the second substrate 103 to the extraction electrode 145 of the first substrate 101 is formed.

Then, after an inner space of the sealing material 121 is filled with the sealing resin 123, a bump 165 is formed on the upper surface of the signal electrode 157 in accordance with a method similar to the method described with reference to FIGS. 20H to 20M. Then, the display device 10 is completed by performing dicing with a chip size (see FIG. 24H). Note that the space may not be filled with the sealing resin 123 after the first substrate 101 is bonded to the second substrate 103. For example, both the first substrate 101 and the second substrate 103 may be bonded after the sealing resin 123 is formed at a position corresponding to a portion on the first substrate 101.

The method of manufacturing the display device 10 according to the tenth embodiment has been described above. As described above, in the tenth embodiment, the display device 10 is fabricated by bonding both the first substrate 101 and the second substrate 103 after the via-holes 173 and 171 are respectively formed in the first substrate 101 and the second substrate 103. In accordance with the method, the via-holes 173 and 171 are respectively formed in the first substrate 101 and the second substrate 103. Therefore, the via-holes 173 and 171 can be respectively formed in accordance with methods appropriate for processed materials in consideration of materials or the like of the processed materials in the first substrate 101 and the second substrate 103. Accordingly, the via-holes 175 can be formed more efficiently than in a case in which the via-holes 155 are collectively formed after both the first substrate 101 and the second substrate 103 are bonded as in the ninth embodiment.

Note that, in the display device 10, a display module can be configured by storing the display device 10 in the module casing 27 as in the display device 9. Since the configuration of the display module is also the same as the display module 37 according to the ninth embodiment except that the configuration of the display device 10 is different, the repeated description will be omitted.

Figure 26:
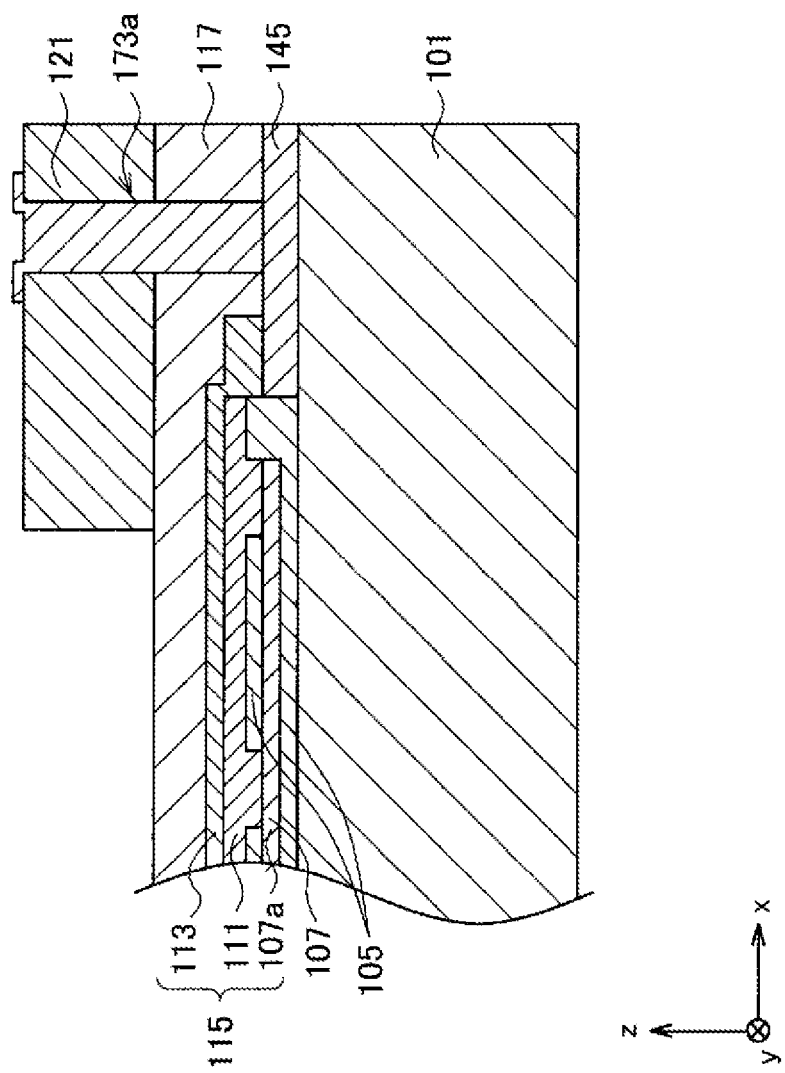
FIG. 26 is a diagram illustrating a schematic configuration of a via-hole provided in the second substrate and configured such that a conductive material is embedded in a through-hole.

Note that in the illustrated manufacturing method, the via-holes 173 and 171 are formed by forming the conductive material as a film on the inner wall of the through-hole, but the tenth embodiment is not limited to this example. The via-holes 173 and 171 may be formed by embedding a conductive material in the through hole. FIG. 25 is a diagram illustrating a schematic configuration of the via-hole 173a provided in the second substrate 103 and configured such that a conductive material is embedded in the through-hole. In addition, FIG. 26 is a diagram illustrating a schematic configuration of the via-hole 171a provided in the first substrate 101 and configured such that a conductive material is embedded in the through-hole.

3-7. 11th Embodiment

Figure 27B:
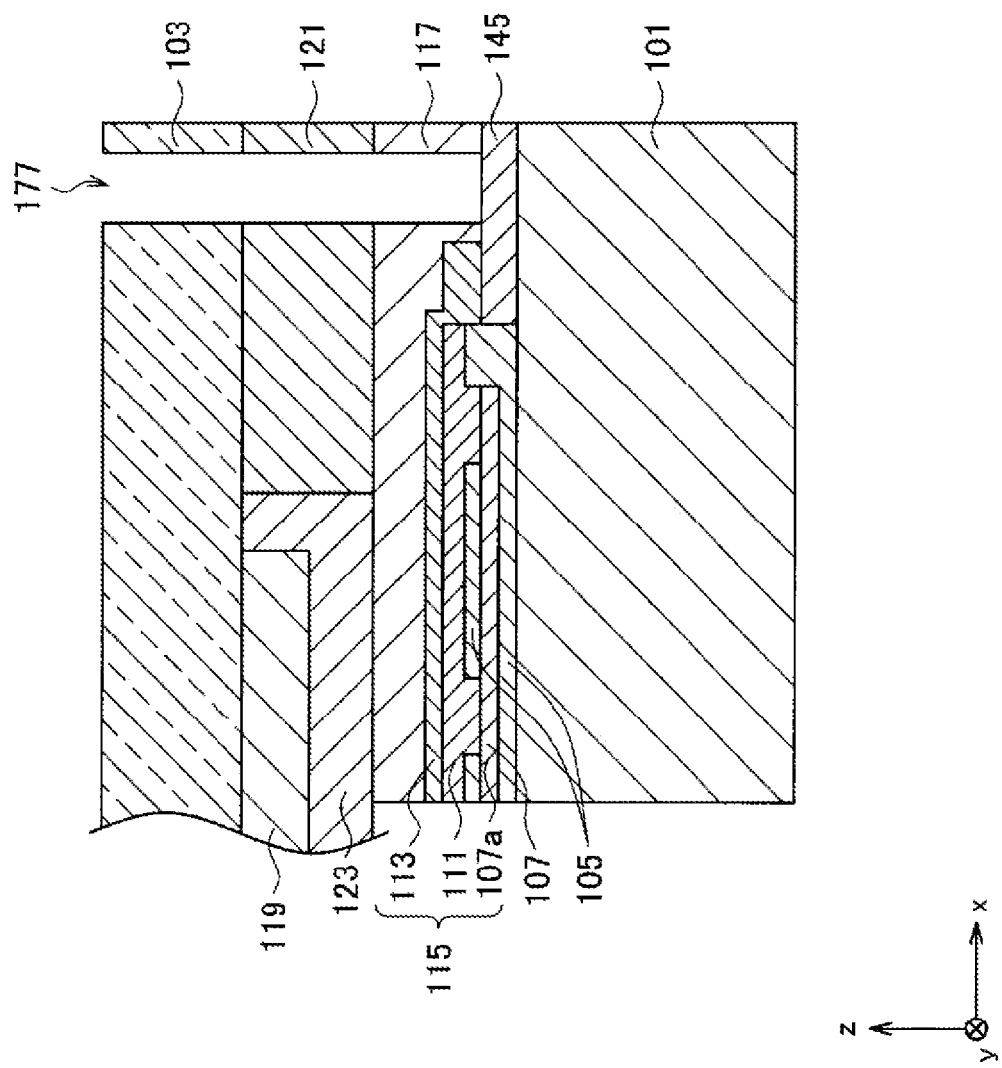
FIG. 27B is an explanatory diagram illustrating a method of manufacturing a display device according to an eleventh embodiment.

Referring to FIGS. 27A to 27C, a method of manufacturing a display device 11 according to the 11th embodiment will be described and a configuration of the display device 11 will be described. FIGS. 27A to 27C are explanatory diagrams illustrating the method of manufacturing the display device 11 according to the 11th embodiment. FIGS. 27A to 27C schematically illustrate cross sections on the x-z plane near the outer circumference of the display device 11 in the order of steps in the method of manufacturing the display device 11 and illustrate a process flow of the manufacturing method as in FIGS. 20A to 20M.

Here, the display device 11 according to the 11th embodiment is also the same as the display device 9 according to the above-described ninth embodiment in that the extraction electrode 145 is provided immediately below the sealing material 121, the signal electrode 157 is provided on the upper surface of the second substrate 103, and the display device 10 has a connection structure in which the extraction electrode 145 and the signal electrode 157 are electrically connected by a via-hole penetrating the second substrate 103, the sealing material 121, and the protective film 117. The display device 11 is different from the display device 9 in a method of forming the connection structure.

Specifically, in the method of manufacturing the display device 11, the CF layer 119 is first formed on the lower surface of the second substrate 103 before the second substrate 103 is bonded to the first substrate 101 and a through-hole is provided. Since this process is similar to the process described with reference to FIGS. 24A and 24B in the foregoing tenth embodiment, the detailed description thereof will be omitted. Note that the through-hole is formed to be located immediately above the extraction electrode 145 when the second substrate 103 is bonded to the first substrate 101. In addition, the sealing material 121 is formed on the first substrate 101 in which the protective film 117 is formed, concurrently with the foregoing process on the second substrate 103. Since this process is also similar to the process described with reference to FIG. 24D in the foregoing tenth embodiment, the detailed description thereof will be omitted.

When the foregoing processes on the first substrate 101 and the second substrate 103 end, the second substrate 103 is bonded to the first substrate 101. The first substrate 101 and the second substrate 103 are adhered by the sealing material 121. Further, an inner space of the sealing material 121 is filled with the sealing resin 123 (see FIG. 27A).

Subsequently, in a bottom portion of the through-hole provided in the second substrate 103, a through-hole reaching the extraction electrode 145 is formed in the sealing material 121 and the protective film 117 (see FIG. 27B). This process is performed, for example, in accordance with any of various known methods such as laser processing or dry etching. Through this process, the through hole 177 reaching the extraction electrode 145 from the upper surface of the second substrate 103 is formed, as illustrated.

The subsequent processes are similar to those of the method of manufacturing the display device 9 according to the ninth embodiment. That is, in accordance with a method similar to the method described with reference to FIGS. 20C to 20G, metal films are formed as films on the upper surface of the second substrate 103 and the inner wall of the through-hole 177 to form the signal electrode 157 and the via-hole 155. Further, the bump 165 is formed on the upper surface of the signal electrode 157 in accordance with a method similar to the method described with reference to FIGS. 20H to 20M. Then, the display device 11 is completed by performing dicing with a chip size (see FIG. 27C).

The method of manufacturing the display device 11 according to the eleventh embodiment has been described above. As described above, in the eleventh embodiment, the first substrate 101 is bonded to the second substrate 103 after the through-hole is formed in the second substrate 103. Thereafter, the via-hole 155 is formed by forming the through-hole in the sealing material 121 and the protective film 117 of the first substrate 101 and collectively forming conductive materials as a film in the through-hole provided in the second substrate 103 and the through-hole provided in the sealing material 121 and the protective film 117. As described above, with regard to TAT of the process of forming the opening to form the via-hole 155, a processing time on the second substrate 103 is rate-limited. On the other hand, according to the eleventh embodiment, the process of forming the through-hole in the second substrate 103 is performed before the first substrate 101 is bonded to the second substrate 103. Accordingly, since the process of forming a through-hole in the second substrate 103 is performed as an independent process, the through-hole can be formed in accordance with a most appropriate method in consideration of a material or the like of the second substrate 103. That is, since the process of forming the through-hole in the second substrate 103 in which a processing time is the longest can be performed more efficiently, the via-hole 155 can be formed more efficiently than in a case in which the via-holes 155 are collectively formed after both the substrates are bonded as in the ninth embodiment.

Note that, in the display device 11, a display module can be configured by storing the display device 11 in the module casing 27 as in the display device 9. Since the configuration of the display module is also the same as the display module 37 according to the ninth embodiment except that the configuration of the display device 11 is different, the repeated description will be omitted.

4. Supplement

The preferred embodiment(s) of the present disclosure has/have been described above with reference to the accompanying drawings, whilst the present disclosure is not limited to the above examples. A person skilled in the art may find various alterations and modifications within the scope of the appended claims, and it should be understood that they will naturally come under the technical scope of the present disclosure.

For example, each configuration of the display device according to each embodiment and each configuration of the display device according to each modification example, as described above, can be mutually combined and applied within a possible range.

In addition, for example, the embodiments in which the display device is an organic EL display has been described as examples of the present disclosure, but the present disclosure is not limited to the examples. Any of various display devices may be used as long as a display device which is a target of the technology of the present disclosure is a display device configured by bonding two substrates. Even in the other display devices, by forming the I/O unit as in each embodiment and each modification example described above, it is possible to obtain an advantageous effect (that is, the advantageous effect of further reducing the chip area) similar to that of each embodiment and each modification example described above.

Further, the effects described in this specification are merely illustrative or exemplified effects, and are not limitative. That is, with or in the place of the above effects, the technology according to the present disclosure may achieve other effects that are clear to those skilled in the art from the description of this specification.

Additionally, the present technology may also be configured as below.

(1)

A display module including:

a display device configured such that a pixel region in which a plurality of pixels for displaying an image are arranged is formed on an upper surface of a substrate, and a device-side signal electrode for exchanging a signal related to the pixels with an outside is disposed on a side surface of the substrate; and a module casing configured to store the display device and have a casing-side signal electrode electrically connected to the device-side signal electrode in a spot facing the device-side signal electrode.

(2)

The display module according to (1), in which an electrode disposition region in which the device-side signal electrode is disposed in a side surface of the substrate has a tapered shape in which an area of a cross section parallel to an in-plane direction of the substrate is gradually changed from the upper surface to a lower surface.

(3)

The display module according to (2), in which the electrode disposition region of the substrate has a forward tapered shape in which the area of the cross section parallel to the in-plane direction of the substrate gradually increases from the upper surface to the lower surface.

(4)

The display module according to (2), in which the electrode disposition region of the substrate has a reverse tapered shape in which the area of the cross section parallel to the in-plane direction of the substrate gradually decreases from the upper surface to the lower surface.

(5)

The display module according to any one of (1) to (4), in which a spot in which the casing-side signal electrode is disposed in the module casing has a surface substantially parallel to the electrode disposition region in which the device-side signal electrode is disposed in the side surface of the substrate.

(6)

The display module according to (5), in which the casing-side signal electrode has a plate spring shape.

(7)

The display module according to (5), in which the casing-side signal electrode has a ball shape.

(8)

The display module according to (7), in which the casing-side signal electrode that has the ball shape is elastically movable in a direction vertical to an inner wall surface of the module casing.

(9)

The display module according to (5) in which the casing-side signal electrode has a planar shape. (10)

A method of manufacturing a display module, the method including:

a step of fabricating a display device configured such that a pixel region in which a plurality of pixels for displaying an image are arranged is formed on an upper surface of a substrate, and a device-side signal electrode for exchanging a signal related to the pixels with an outside is disposed on a side surface of the substrate; and a step of storing the display device in a module casing that has a casing-side signal electrode electrically connected to the device-side signal electrode.

(11)

The method of manufacturing the display module according to (10), in which, in the step of fabricating the display device, a step of fabricating the device-side signal electrode includes:

a step of processing a region into a tapered shape, the region corresponding to an outer circumference of a region corresponding to the one display device in the substrate in a wafer state; and a step of forming a wiring pattern corresponding to the device-side signal electrode in the region that has the tapered shape in the substrate.

(12)

The method of manufacturing the display module according to (11), in which the tapered shape formed on the substrate is a forward tapered shape in which an area of a cross section parallel to an in-plane direction of the substrate gradually increases from the upper surface to a lower surface.

(13)

The method of manufacturing the display module according to (11), in which the tapered shape formed on the substrate is a reverse tapered shape in which an area of a cross section parallel to an in-plane direction of the substrate gradually decreases from the upper surface to a lower surface.

(14)

The method of manufacturing the display module according to any one of (10) to (13), in which, in the step of storing the display device in the module casing, the display device is stored in the module casing such that the device-side signal electrode is pressed to the casing-side signal electrode.

Additionally, the present technology may also be configured as below.

(1)

A display device including:

a first substrate configured such that a pixel region in which a plurality of pixels for displaying an image are arranged is formed on an upper surface;

a second substrate provided in an upper layer of the first substrate via a bonding material for bonding the first substrate and configured to be transparent to light exiting from the pixels; and a signal electrode located on an upper surface of the second substrate and configured to exchange a signal related to the pixels with an outside.

(2)

The display device according to (1), in which a connection structure for electrically connecting the signal electrode and the first substrate includes a first via-hole provided to penetrate the second substrate in a thickness direction.

(3)

The display device according to (2), in which the connection structure includes an extraction wiring that is electrically connected to a wiring for a predetermined signal related to the pixels and extends to a portion immediately below the first via-hole above the first substrate, and a connection electrode that electrically connects a lower surface of the first via-hole to the extraction wiring.

(4)

The display device according to (3), in which the bonding material is a sealing material that is located to surround the pixel region in an in-plane direction and seals the pixel region, and the connection electrode is located outside the sealing material in the in-plane direction.

(5)

The display device according to (3), in which the bonding material is a sealing material that is located to surround the pixel region in an in-plane direction and seals the pixel region, and the connection electrode is located inside the sealing material in the in-plane direction.

(6)

The display device according to (2), in which each of the pixels includes a light-emitting element configured such that a first electrode, a light-emitting layer, and a second electrode are stacked in this order, and in which the connection structure includes a first extraction electrode provided in a state in which a front surface is exposed at a position corresponding to a portion immediately below the first via-hole in the same layer as the first electrode and electrically connected to a wiring for a predetermined signal related to the pixel, and a connection electrode electrically connecting a lower surface of the first via-hole to the first extraction electrode.

(7)

The display device according to (2), in which the bonding material is a sealing member that has conductivity and is located to surround the pixel region in an in-plane direction and seals the pixel region, and in which the connection structure is configured such that a lower surface of the first via-hole and the first substrate are electrically connected by the conductive sealing material.

(8)

The display device according to (2), in which the bonding material is a sealing material that is located to surround the pixel region in an in-plane direction and seals the pixel region, and the connection structure includes a second extraction electrode that is located immediately below the sealing member above the first substrate and is electrically connected to a wiring for a predetermined signal related to the pixels, and a second via-hole that is provided to penetrate at least the sealing member in a thickness direction and to reach the second extraction electrode, and is located immediately below the first via-hole.

(9)

The display device according to (1), in which the bonding material is a sealing member that is located to surround the pixel region in an in-plane direction and seals the pixel region, and in which a connection structure in which the signal electrode is electrically connected to the first substrate has a second extraction electrode of which a partial region is located immediately below the sealing material and another region is exposed from the sealing material above the first substrate and which is electrically connected to a wiring for a predetermined signal related to the pixel, and a wiring that extends between the upper surface of the second substrate and the second extraction electrode along at least an edge of the second substrate and an edge of the sealing material.

(10)

The display device according to any one of (1) to (19), in which the bonding material is a sealing material that is located to surround the pixel region in an in-plane direction and seals the pixel region, and a space located above the pixel region and corresponding to an inside of the sealing material is filled with a sealing resin.

(11)

A display module including:

a display device including a first substrate configured such that a pixel region in which a plurality of pixels for displaying an image are arranged is formed on an upper surface, a second substrate provided in an upper layer of the first substrate via a bonding material for bonding the first substrate and configured to be transparent to light exiting from the pixels, and a device-side signal electrode located on an upper surface of the second substrate and configured to exchange a signal related to the pixels with an outside; and a module casing configured to store the display device, in which a casing-side signal electrode electrically connected to the device-side signal electrode via a bump is in a spot corresponding to the device-side signal electrode of the module casing.

(12)

A method of manufacturing a display device, the method including:

a step of forming a pixel region in which a plurality of pixels for displaying an image are arranged on an upper surface of a first substrate; and a step of bonding a second substrate transparent to light exiting from the pixels, to the upper surface of the first substrate via a bonding material, in which a signal electrode for exchanging a signal related to the pixels with an outside is formed on an upper surface of the second substrate.

(13)
The method of manufacturing the display device according to (12),
in which a connection structure for electrically connecting the signal electrode and the first substrate includes a first via-hole provided to penetrate the second substrate in a thickness direction,
a step of forming the first via-hole and the signal electrode is performed before the second substrate is bonded to the first substrate, and
the step of forming the first via-hole and the signal electrode includes
a step of forming a through-hole in the second substrate,
a step of forming a conductive material as a film on at least a side wall in the through-hole provided in the second substrate such that the conductive material extends between the upper surface and a lower surface of the second substrate, and
a step of forming the signal electrode electrically connected to the conductive material formed as the film in the through-hole by patterning the film formed of the conductive material into a predetermined shape.

(14)
The method of manufacturing the display device according to (12),
in which the bonding material is a sealing material that is located to surround the pixel region in an in-plane direction and seals the pixel region, and
a connection structure for electrically connecting the signal electrode and the first substrate includes
a first via-hole provided to penetrate the second substrate in a thickness direction,
a second extraction electrode that is located immediately below the sealing member above the first substrate and is electrically connected to a wiring for a predetermined signal related to the pixels, and
a second via-hole that is provided to penetrate at least the sealing material immediately below the first via-hole in a thickness direction and to reach the second extraction electrode.

(15)
The method of manufacturing the display device according to (14),
in which a step of forming the first via-hole and the second via-hole is performed after the second substrate is bonded to the first substrate, and
the step of forming the first via-hole and the second via-hole includes
a step of forming a through-hole reaching the second extraction electrode in a stacked structure including the second substrate and the sealing material above the first substrate, and
a step of forming a conductive material as a film on at least a side wall in the through-hole provided in the stacked structure including the second substrate and the sealing material above the first substrate such that the conductive material extends between the upper surface of the second substrate and the second extraction electrode.

(16)
The method of manufacturing the display device according to (15), in which in the step of forming the through-hole in the stacked structure including the second substrate and the sealing material above the first substrate, the through-holes are collectively formed by a laser.

(17)
The method of manufacturing the display device according to (15), in which in the step of forming the through-hole in the stacked structure including the second substrate and the sealing material above the first substrate, the through-hole in the second substrate is formed by a laser and the through hole in the stacked structure including the sealing material is formed by dry etching.

(18)
The method of manufacturing the display device according to (14),
in which the step of forming the first via-hole and the second via-hole is performed before the second substrate is bonded to the first substrate, and
in which the step of forming the first via-hole and the second via-hole includes:
a step of forming a through-hole in the second substrate;
a step of forming a conductive material as a film to extend on at least a side wall in the through-hole of the second substrate from the upper surface to a lower surface of the second substrate;
a step of forming a through-hole to reach the second extraction electrode in the stacked structure including the sealing material above the first substrate; and
a step of forming a conductive material as a film to extend from an upper surface of the sealing material to the second extraction electrode on at least a side wall in the through hole of the stacked structure including the sealing material, and
in which the connection structure is formed by bonding the second substrate in which the first via-hole is formed to the first substrate in which the second via-hole is formed so that a lower surface of the first via-hole comes into contact with an upper surface of the second via-hole.

(19)
The method of manufacturing the display device according to (18), in which the through-hole in the second substrate is formed by a laser or a drill, and the through-hole in the stacked structure including the sealing material above the first substrate is formed by a laser or dry etching.

(20)
The method of manufacturing the display device according to (14),
in which the step of forming the first via-hole and the second via-hole includes
a step of forming a through-hole in the second substrate before the second substrate is bonded to the first substrate,
a step of bonding the first substrate to the second substrate,
a step of forming a through-hole to reach the second extraction electrode in a spot corresponding to a bottom portion of the through-hole of the second substrate in a stacked structure including the sealing material above the first substrate, and
a step of forming a metal material as a film on at least a side wall in the through-hole of a stacked structure including the second substrate and the sealing material above the first substrate to extend from the upper surface of the second substrate to the second extraction electrode.

REFERENCE SIGNS LIST 1, 2, 3, 4, 5, 6, 7, 8, 9, 10, 11 display device
21, 22, 23, 24, 25, 26, 27 module casing
31, 32, 33, 34, 35, 36, 37 display module
101 first substrate
103 second substrate 104 wiring layer
105 insulation film
107 wiring layer
107a first electrode
107b, 129a, 137 signal electrode (device-side signal electrode)
111 organic layer
113 second electrode (wiring layer)
115 organic EL element
117 protective film
119 CF layer
121 sealing material
123 sealing resin
127 bonding resin material
129 wiring layer
131, 145 extraction electrode
133 extraction wiring
135 via-hole
139 connection electrode
141 signal output wiring
143 conductive sealing material
147 through-hole
155 via-hole
165, 223, 227, 231 bump
175 via-hole
201, 211, 219 casing body
203, 207, 209, 213, 215, 217, 221 signal electrode (casing-side signal electrode)
205 FPC

The invention claimed is:

1. A display module comprising:
a display device configured such that a pixel region in which a plurality of pixels for displaying an image are arranged is formed on an upper surface of a substrate, and a device-side signal electrode for exchanging a signal related to the pixels with an outside is disposed on a side surface of the substrate; and
a module casing configured to store the display device and have a casing-side signal electrode electrically connected to the device-side signal electrode in a spot facing the device-side signal electrode.

2. The display module according to claim 1, wherein an electrode disposition region in which the device-side signal electrode is disposed in a side surface of the substrate has a tapered shape in which an area of a cross section parallel to an in-plane direction of the substrate is gradually changed from the upper surface to a lower surface.

3. The display module according to claim 2, wherein the electrode disposition region of the substrate has a forward tapered shape in which the area of the cross section parallel to the in-plane direction of the substrate gradually increases from the upper surface to the lower surface.

4. The display module according to claim 2, wherein the electrode disposition region of the substrate has a reverse tapered shape in which the area of the cross section parallel to the in-plane direction of the substrate gradually decreases from the upper surface to the lower surface.

5. The display module according to claim 2, wherein a spot in which the casing-side signal electrode is disposed in the module casing has a surface substantially parallel to the electrode disposition region in which the device-side signal electrode is disposed in the side surface of the substrate.

6. The display module according to claim 5, wherein the casing-side signal electrode has a plate spring shape.

7. A method of manufacturing a display module, the method comprising:
fabricating a display device configured such that a pixel region in which a plurality of pixels for displaying an image are arranged is formed on an upper surface of a substrate, and a device-side signal electrode for exchanging a signal related to the pixels with an outside is disposed on a side surface of the substrate; and
storing the display device in a module casing that has a casing-side signal electrode electrically connected to the device-side signal electrode.

8. The method of manufacturing the display module according to claim 7, wherein fabricating the device-side signal electrode includes:
processing a region into a tapered shape, the region corresponding to an outer circumference of a region corresponding to the one display device in the substrate in a wafer state; and
forming a wiring pattern corresponding to the device-side signal electrode in the region that has the tapered shape in the substrate.

9. The method of manufacturing the display module according to claim 7, wherein the display device is stored in the module casing such that the device-side signal electrode is pressed to the casing-side signal electrode.

10. A display device comprising:
a first substrate configured such that a pixel region in which a plurality of pixels for displaying an image are arranged is formed on an upper surface;
a second substrate provided in an upper layer of the first substrate via a bonding material for bonding the first substrate and configured to be transparent to light exiting from the pixels;
a signal electrode located on an upper surface of the second substrate and configured to exchange a signal related to the pixels with an outside; and
a connection structure for electrically connecting the signal electrode and the first substrate includes a first via-hole provided to penetrate the second substrate in a thickness direction, the connection structure including an extraction wiring that is electrically connected to a wiring for a predetermined signal related to the pixels and extends to a portion immediately below the first via-hole above the first substrate, and a connection electrode that electrically connects a lower surface of the first via-hole to the extraction wiring;
wherein the bonding material is a sealing material that is located to surround the pixel region in an in-plane direction and seals the pixel region, and
the connection electrode is located outside the sealing material in the in-plane direction.

11. The display device according to claim 10,
wherein the connection structure includes
a second extraction electrode that is located immediately below the sealing material above the first substrate and is electrically connected to the wiring for the predetermined signal related to the pixels, and
a second via-hole that is provided to penetrate at least the sealing material in a thickness direction and to reach the second extraction electrode, and is located immediately below the first via-hole.

12. The display device according to claim 10,
wherein a space located above the pixel region and corresponding to an inside of the sealing material is filled with a sealing resin.

13. A display module comprising:
a display device including
- a first substrate configured such that a pixel region in which a plurality of pixels for displaying an image are arranged is formed on an upper surface,
- a second substrate provided in an upper layer of the first substrate via a bonding material for bonding the first substrate and configured to be transparent to light exiting from the pixels, and
- a device-side signal electrode located on an upper surface of the second substrate and configured to exchange a signal related to the pixels with an outside; and a module casing configured to store the display device,
wherein a casing-side signal electrode electrically connected to the device-side signal electrode via a bump is in a spot corresponding to the device-side signal electrode of the module casing.

14. A method of manufacturing a display device, the method comprising:
- forming a pixel region in which a plurality of pixels for displaying an image are arranged on an upper surface of a first substrate; and
- bonding a second substrate transparent to light exiting from the pixels, to the upper surface of the first substrate via a bonding material, wherein a signal electrode for exchanging a signal related to the pixels with an outside is formed on an upper surface of the second substrate, wherein a connection structure for electrically connecting the signal electrode and the first substrate includes a first via-hole provided to penetrate the second substrate in a thickness direction, forming the first via-hole and the signal electrode is performed before the second substrate is bonded to the first substrate, and forming the first via-hole and the signal electrode includes
- forming a through-hole in the second substrate,
- forming a conductive material as a film on at least a side wall in the through-hole provided in the second substrate such that the conductive material extends between the upper surface and a lower surface of the second substrate, and
- forming the signal electrode electrically connected to the conductive material formed as the film in the through-hole by patterning the film formed of the conductive material into a predetermined shape.

15. The method of manufacturing the display device according to claim 14,
wherein the bonding material is a sealing material that is located to surround the pixel region in an in-plane direction and seals the pixel region, and
the connection structure includes
- a second extraction electrode that is located immediately below the sealing material above the first substrate and is electrically connected to a wiring for a predetermined signal related to the pixels, and
- a second via-hole that is provided to penetrate at least the sealing material immediately below the first via-hole in a thickness direction and to reach the second extraction electrode.

16. The method of manufacturing the display device according to claim 15,
wherein forming the first via-hole and the second via-hole is performed after the second substrate is bonded to the first substrate, and
forming the first via-hole and the second via-hole includes
- forming a through-hole reaching the second extraction electrode in a stacked structure including the second substrate and the sealing material above the first substrate, and
- forming a conductive material as a film on at least a side wall in the through-hole provided in the stacked structure including the second substrate and the sealing material above the first substrate such that the conductive material extends between the upper surface of the second substrate and the second extraction electrode.

\* \* \* \* \*